(12) United States Patent
Shibata et al.

(10) Patent No.: US 9,190,590 B2
(45) Date of Patent: Nov. 17, 2015

(54) LIGHT EMITTING ELEMENT AND PRODUCTION METHOD FOR SAME, PRODUCTION METHOD FOR LIGHT-EMITTING DEVICE, ILLUMINATION DEVICE, BACKLIGHT, DISPLAY DEVICE, AND DIODE

(75) Inventors: Akihide Shibata, Osaka (JP); Tetsu Negishi, Osaka (JP); Kenji Komiya, Osaka (JP); Yoshifumi Yaoi, Osaka (JP); Takeshi Shiomi, Osaka (JP); Hiroshi Iwata, Osaka (JP); Akira Takahashi, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 89 days.

(21) Appl. No.: 13/820,081

(22) PCT Filed: Jun. 22, 2011

(86) PCT No.: PCT/JP2011/064231
§ 371 (c)(1),
(2), (4) Date: May 14, 2013

(87) PCT Pub. No.: WO2012/029381
PCT Pub. Date: Mar. 8, 2012

(65) Prior Publication Data
US 2013/0221385 A1 Aug. 29, 2013

(30) Foreign Application Priority Data

Sep. 1, 2010 (JP) .................................. 2010-195788
Sep. 16, 2010 (JP) .................................. 2010-208023
May 31, 2011 (JP) .................................. 2011-122176

(51) Int. Cl.
*H01L 33/20* (2010.01)
*H01L 33/64* (2010.01)
(Continued)

(52) U.S. Cl.
CPC ............ *H01L 33/64* (2013.01); *H01L 25/0753* (2013.01); *H01L 31/03529* (2013.01);
(Continued)

(58) Field of Classification Search
CPC ..... H01L 33/08; H01L 31/0522; H01L 33/14; H01L 33/24; H01L 33/26; H01L 31/03529; H01L 33/42; H01L 33/20
See application file for complete search history.

(56) References Cited

U.S. PATENT DOCUMENTS 5,869,848 A * 2/1999 Nobori et al. ................... 257/95
7,588,955 B2 9/2009 Huang et al.
(Continued)

FOREIGN PATENT DOCUMENTS

JP 62-162383 7/1987
JP 63-119282 5/1988
(Continued)

OTHER PUBLICATIONS

Sze, Physics of Semiconductor Devices, second edition, USA: John Wiley & Son, Inc., 1981.*
(Continued)

*Primary Examiner* — Fei Fei Yeung Lopez
(74) *Attorney, Agent, or Firm* — Morrison & Foerster LLP

(57) ABSTRACT

A light-emitting element includes a first conductivity type semiconductor base, a plurality of first conductivity type protrusion-shaped semiconductors formed on the semiconductor base, and a second conductivity type semiconductor layer that covers the protrusion-shaped semiconductors.

14 Claims, 33 Drawing Sheets

(51) Int. Cl.
  *H01L 33/58* (2010.01)
  *H01L 33/08* (2010.01)
  *H01L 31/052* (2014.01)
  *H01L 33/14* (2010.01)
  *H01L 33/26* (2010.01)
  *H01L 25/075* (2006.01)
  *H01L 33/18* (2010.01)
  *H01L 33/24* (2010.01)
  *H01L 31/0352* (2006.01)
  *H01L 31/054* (2014.01)
  *H01L 33/42* (2010.01)
  *G02F 1/1335* (2006.01)
  *H01L 33/00* (2010.01)
  *H01L 33/32* (2010.01)

(52) U.S. Cl.
  CPC .... *H01L31/035227* (2013.01); *H01L 31/0522* (2013.01); *H01L 31/0547* (2014.12); *H01L 33/08* (2013.01); *H01L 33/14* (2013.01); *H01L 33/18* (2013.01); *H01L 33/24* (2013.01); *H01L 33/26* (2013.01); *H01L 33/58* (2013.01); *G02F 1/133603* (2013.01); *H01L 33/0079* (2013.01); *H01L 33/20* (2013.01); *H01L 33/32* (2013.01); *H01L 33/42* (2013.01); *H01L 2924/0002* (2013.01); *Y02E 10/52* (2013.01)

(56) References Cited

U.S. PATENT DOCUMENTS

| | | | |
|---|---|---|---|
| 2002/0008921 A1* | 1/2002 | Ebizuka et al. | 359/837 |
| 2003/0180977 A1* | 9/2003 | Suzuki et al. | 438/22 |
| 2004/0048409 A1* | 3/2004 | Biwa et al. | 438/46 |
| 2005/0211997 A1* | 9/2005 | Suehiro et al. | 257/88 |
| 2005/0236357 A1 | 10/2005 | Bakkers et al. | |
| 2006/0273328 A1 | 12/2006 | Niu et al. | |
| 2007/0012933 A1 | 1/2007 | Lee et al. | |
| 2007/0041214 A1* | 2/2007 | Ha et al. | 362/612 |
| 2007/0057248 A1* | 3/2007 | Yao et al. | 257/13 |
| 2007/0085093 A1* | 4/2007 | Ohmae et al. | 257/89 |
| 2008/0110486 A1 | 5/2008 | Tsakalakos et al. | |
| 2008/0305568 A1 | 12/2008 | Huang et al. | |
| 2010/0155767 A1* | 6/2010 | Lee et al. | 257/99 |
| 2011/0012167 A1* | 1/2011 | Shimamura et al. | 257/103 |
| 2011/0089850 A1 | 4/2011 | Shibata et al. | |
| 2011/0254043 A1 | 10/2011 | Negishi et al. | |
| 2012/0235117 A1 | 9/2012 | Fukui et al. | |
| 2012/0326181 A1 | 12/2012 | Shibata et al. | |
| 2013/0027623 A1 | 1/2013 | Negishi et al. | |

FOREIGN PATENT DOCUMENTS

| | | |
|---|---|---|
| JP | 2-84785 | 3/1990 |
| JP | 2000-294821 | 10/2000 |
| JP | 2003-101069 | 4/2003 |
| JP | 2005-522030 | 7/2005 |
| JP | 2005-228936 | 8/2005 |
| JP | 2006-303508 | 11/2006 |
| JP | 2006-332650 | 12/2006 |
| JP | 2007-027724 | 2/2007 |
| JP | 2008-135740 | 6/2008 |
| JP | 2008-235443 | 10/2008 |
| JP | 2008-235444 | 10/2008 |
| JP | 2008-306156 | 12/2008 |
| JP | 2009-507398 | 2/2009 |
| JP | 2009-147140 | 7/2009 |
| JP | 2009-542560 | 12/2009 |
| JP | 2010-506744 | 3/2010 |
| JP | 2010-514207 | 4/2010 |
| JP | 3159198 | 5/2010 |
| JP | 2011-86758 | 4/2011 |
| JP | 2011-86865 | 4/2011 |
| JP | 2011-91201 | 5/2011 |
| JP | 2011-103435 | 5/2011 |
| JP | 2011-108933 | 6/2011 |
| JP | 2011-109050 | 6/2011 |
| JP | 2011-109063 | 6/2011 |
| JP | 2011-119449 | 6/2011 |
| JP | 2011-119586 | 6/2011 |
| JP | 2011-119612 | 6/2011 |
| JP | 2011-119617 | 6/2011 |
| JP | 2011-119618 | 6/2011 |
| JP | 2011-121154 | 6/2011 |
| JP | 2011-192722 | 9/2011 |
| JP | 2011-197347 | 10/2011 |
| JP | 2011-198697 | 10/2011 |
| JP | 2011-205060 | 10/2011 |
| JP | 2011-211047 | 10/2011 |
| JP | 2012-4535 | 1/2012 |
| KR | 10-0746784 | 7/2007 |
| KR | 10-2010-0082215 | 7/2010 |
| WO | WO-03/083919 | 10/2003 |
| WO | WO-2008/048232 | 4/2008 |
| WO | WO-2008/048704 | 4/2008 |
| WO | WO-2008/060455 | 5/2008 |
| WO | WO-2008/079079 | 7/2008 |
| WO | WO-2008/140611 | 11/2008 |
| WO | PCT/JP2009/000785 * | 9/2009 |
| WO | WO-2010/014032 | 2/2010 |
| WO | WO-2011/067872 | 6/2011 |

OTHER PUBLICATIONS

International Search Report mailed Sep. 27, 2011, directed to International Application No. PCT/JP2011/064231; 8 pages.

Tomioka, K. et al. (2010). "GaAs/AlGaAs Core Multishell Nanowire-Based Light-Emitting Diodes on Si," *NanoLetters* 10:1639-1644.

Qian, F. et al. (2005). "Core/Multishell Nanowire Heterostructures as Multicolor, High-Efficiency Light-Emitting Diodes," *NanoLetters* 5(11):2287-2291.

* cited by examiner

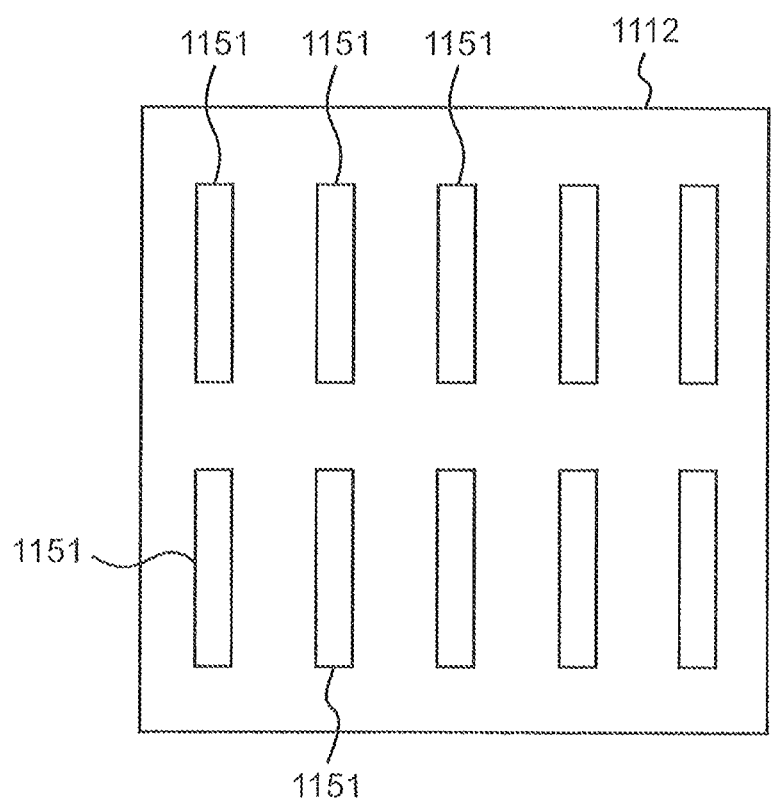

LIGHT EMITTING ELEMENT AND PRODUCTION METHOD FOR SAME, PRODUCTION METHOD FOR LIGHT-EMITTING DEVICE, ILLUMINATION DEVICE, BACKLIGHT, DISPLAY DEVICE, AND DIODE

REFERENCE TO RELATED APPLICATIONS

This application is a national stage application under 35 USC 371 of International Application No. PCT/JP2011/064231, filed Jun. 22, 2011, which claims the priority of Japanese Patent Application Nos. 2010-195788, filed Sep. 1, 2010, 2010-208023, filed Sep. 16, 2010, and 2011-122176, filed May 31, 2011, the entire contents of which are incorporated herein by reference.

FIELD OF THE INVENTION

The present invention relates to light-emitting elements having protrusion-shaped semiconductors shaped like rods, plates or the like and a production method for the same, a production method for a light-emitting device having such light-emitting elements, an illumination device, a backlight and a display device each of which has such a light-emitting device, and to a diode constituting a light-emitting diode, a photoelectric conversion element or the like.

BACKGROUND OF THE INVENTION

A conventional rod-type light-emitting element having a light-emitting area increased as compared with light-emitting areas of planar light-emitting elements is disclosed in Patent Literature 1 (JP 2006-332650 A).

In the rod-type light-emitting element, as shown in FIG. 38, a first polarity layer 910 is formed on a substrate 900, and a plurality of rods 920 composed of an active layer that emits light are formed on the first polarity layer 910. The rods 920 are wrapped in a second polarity layer 930. The plurality of rods 920, consisting of the active layer, and the second polarity layer 930 constitute the rod-type light-emitting element.

According to this prior art, the rods 920 each emit light to entire surfaces and therefore attain increase in the light-emitting areas and increase in amount of light emitted from the light-emitting element.

In the prior art, however, the rods 920 are composed of the active layer, and the active layer exclusively serves to increase light emission efficiency by confinement of carriers therein and commonly has high resistance. In the prior art, it is necessary to increase length of the rods in order to increase the light-emitting areas. Thus there has been a problem in that the increase in the length of the rods involves increase in length of the highly resistant active layer, causes decrease in brightness of extremity parts thereof because of failure to pass a sufficient current to the extremity parts, and hinders obtainment of a sufficient emission intensity.

A conventional light-emitting diode of which a section is shown in FIG. 39 has been proposed (see Non-Patent Literature 1). In the light-emitting diode, a core 3001 made of n-type GaN, an InGaN layer 3002, an i-GaN layer 3003, a p-AlGaN layer 3004, and a p-GaN layer 3005 are sequentially formed into shape of a shell so that the latter four cover periphery of the core 3001. The InGaN layer 3002 and the i-GaN layer 3003 constitute an active layer.

In the conventional light-emitting diode, incidentally, selection of material for the core 3001 is restricted because the n-type core 3001 is used as an n-type electrode and because the material is selected with priority given to possession of a function as the n-type electrode. Therefore, it is difficult to freely select the material of the core 3001 and to make the core have desired properties. Thus making the core have the desired properties will increase the manufacturing cost and decrease the production yield.

PATENT LITERATURE

PTL1: JP 2006-332650 A

Non-Patent Literature

Non-Patent Literature 1: Fang Qian, Silvija Gradecak, Yat Li, Cheng-Yen Wen and Charles M. Lieber, Core/Multishell Nanowire Heterostructures as Multicolor, High-Efficiency Light-emitting Diodes Nano letters 2005 Vol. 5, No. 11, 2287-2291

SUMMARY OF THE INVENTION

An object of the invention is to provide a light-emitting element that provides a sufficient emission intensity while having a low resistance. Another object of the invention is to provide a production method for such a light-emitting element, a production method for a light-emitting device using such light-emitting elements, and an illumination device, a backlight, and a display device that include such a light-emitting device.

Still another object of the invention is to provide a diode of which a core can be provided with desired properties without increase in manufacturing costs or decrease in production yield.

A light-emitting element according to an aspect of the present invention includes:

a first conductivity type semiconductor base;

a plurality of first conductivity type protrusion-shaped semiconductors formed on the first conductivity type semiconductor base; and a second conductivity type semiconductor layer that covers the protrusion-shaped semiconductors.

According to the light-emitting element of this invention, since the second conductivity type semiconductor layer is formed so as to cover the first conductivity type protrusion-shaped semiconductors, generally entire side surfaces of the protrusion-shaped semiconductors can be utilized to exert light emission. Therefore, according to the light-emitting element of this invention, the light-emission quantity per unit area of the first conductivity type semiconductor base can be increased, as compared with light-emitting diode chips having a planar light-emitting layer.

Also according to this invention, since the protrusion-shaped semiconductors are made from the first conductivity type semiconductor, increasing the quantity of impurities for imparting the first conductivity type to the protrusion-shaped semiconductors makes it easily achievable to lower the resistance. Therefore, even if the protrusion-shaped semiconductors are elongated in length, increases in resistance of the protrusion-shaped semiconductors can be suppressed, so that uniform light emission over a range from the root to front end portions of the protrusion-shaped semiconductors can be exerted. Thus, the light-emission quantity per unit area of the first conductivity type semiconductor base can be further increased.

In one embodiment, the first conductivity type protrusion-shaped semiconductors are first conductivity type rod-shaped semiconductors.

According to this embodiment, uniform light emission over the range from the root to front end portions of the rod-shaped semiconductors can be exerted, so that generally entire side surfaces of the rod-shaped semiconductors can be utilized to exert light emission. Thus, the light-emission quantity per unit area of the first conductivity type semiconductor base can be increased, as compared with light-emitting diode chips having a planar light-emitting layer.

In one embodiment, the first conductivity type rod-shaped semiconductors have a length ten times larger than a thickness thereof.

In this embodiment, the light-emission quantity per unit area of the semiconductor base can be increased remarkably. In contrast to this, with the rod-shaped semiconductors formed of an active layer as in the prior art, increasing the length of the rod-shaped semiconductors ten times or more longer than their thickness makes it difficult to exert light emission from their front end portions. Therefore, advantages of the invention that are low resistance and high emission intensity with the length of the rod-shaped semiconductors ten times or more larger than their thickness become particularly remarkable.

In one embodiment, the first conductivity type protrusion-shaped semiconductors are first conductivity type plate-shaped semiconductors.

According to this embodiment, the protrusion-shaped semiconductor is given by a plate-shaped semiconductor, and setting the broadest surface of the plate-shaped semiconductor as a nonpolar plane makes it possible to enhance the light emission efficiency as a whole.

In one embodiment, an active layer is formed between each of the first conductivity type protrusion-shaped semiconductors and the second conductivity type semiconductor layer.

In this embodiment, the light emission efficiency can be enhanced. Also, the active layer is formed relatively thin between the first conductivity type protrusion-shaped semiconductors and the second conductivity type semiconductor layer, thus being good at light emission efficiency. The reason of this is that the active layer is intended to confine carriers of both polarities (holes and electrons) into a narrow region to increase the probability of recombinations. In contrast to this, in cases where all parts of the light-emitting element including even the first conductivity type rod-shaped semiconductors are formed from the active layer as in the prior art, the confinement of the carriers becomes insufficient, so that the light emission efficiency is not high.

In one embodiment, a transparent electrode layer is formed on the second conductivity type semiconductor layer.

In this embodiment, the transparent electrode layer can prevent occurrence of voltage drop in the second conductivity type semiconductor layer while allowing penetration of light radiated from the rod-shaped semiconductor through the transparent electrode layer. Thus, the rod-shaped semiconductor can be made to emit light uniformly from all parts thereof.

In one embodiment, a facing gap between first conductivity type protrusion-shaped semiconductors, across which parts of the transparent electrode layer face each other, is filled with a transparent member made from a material higher in transparency than the transparent electrode layer.

In this embodiment, a gap between first conductivity type protrusion-shaped semiconductors is not filled with the transparent electrode layer, which generally has a relatively low transparency, but is filled with a transparent member having higher transparency than the transparent electrode layer. Therefore, the light emission efficiency of the light-emitting element can be improved.

A light-emitting element production method according to an aspect of the present invention includes:

a step of patterning a mask layer on a surface of a first conductivity type semiconductor layer forming part or entirety of a first substrate;

a semiconductor core formation step of forming a plurality of first conductivity type protrusion-shaped semiconductors by anisotropically etching the semiconductor layer with the mask layer used as a mask; and a semiconductor shell formation step of forming a second conductivity type semiconductor layer so that surfaces of the first conductivity type protrusion-shaped semiconductors are covered therewith.

According to the production method of this invention, the thus produced light-emitting element has the second conductivity type semiconductor layer covering the first conductivity type protrusion-shaped semiconductors, and thus almost entire side surfaces of the protrusion-shaped semiconductors can be made to emit light. Therefore, the thus produced light-emitting element has a light-emission quantity per unit area of the first substrate that is increased as compared with light-emitting diode chips having planar light-emitting layers. Also, according to this production method, since the protrusion-shaped semiconductors are made from the first conductivity type semiconductors, resistance of the protrusion-shaped semiconductors can easily be decreased by increasing an amount of impurity that imparts property of the first conductivity type to the protrusion-shaped semiconductors. Therefore, even if the length of the protrusion-shaped semiconductors is increased, increases in the resistance of the protrusion-shaped semiconductors can be suppressed and the protrusion-shaped semiconductors can be made to uniformly emit light over the range from their root to front end portions. Thus the light-emission quantity per unit area of the first substrate can be further increased. Furthermore, according to the production method, in which the protrusion-shaped semiconductors can be formed by the photolithography process and the anisotropic etching, protrusion-shaped semiconductors having a satisfactory shape as planned and designed can be obtained and yield can be improved accordingly.

In one embodiment, the light-emitting element production method further includes a crystal defect removal step, to be performed after the semiconductor core formation step and before the shell formation step, of etching part of the first conductivity type protrusion-shaped semiconductors by wet etching, and a crystal defect recovery step, to be performed after the semiconductor core formation step and before the semiconductor shell formation step, of annealing the first conductivity type protrusion-shaped semiconductors, wherein the crystal defect removal step and the crystal defect recovery step are performed in this order.

According to this embodiment, reduction in the density of crystal defects in the protrusion-shaped semiconductors and improvement in crystallinity thereof can be attained by the crystal defect recovery step with use of annealing. Therefore, the light emission efficiency of the light-emitting element can be improved because crystallinity of the second conductivity type semiconductor layer is also improved in the semiconductor shell formation step that is subsequently performed.

In one embodiment, the light-emitting element production method further includes a crystal defect removal step, to be performed after the semiconductor core formation step and before the shell formation step, of etching part of the first conductivity type protrusion-shaped semiconductors by wet etching.

According to this embodiment, reduction in the density of crystal defects in the protrusion-shaped semiconductors and improvement in crystallinity thereof can be attained by the crystal defect removal step with use of etching. Therefore, the light emission efficiency of the light-emitting element can be improved because crystallinity of the second conductivity type semiconductor layer is also improved in the semiconductor shell formation step that is subsequently performed.

In one embodiment, the light-emitting element production method further includes a crystal defect removal step, to be performed after the semiconductor core formation step and before the shell formation step, of etching part of the first conductivity type protrusion-shaped semiconductors by wet etching, and a crystal defect recovery step, to be performed after the semiconductor core formation step and before the semiconductor shell formation step, of annealing the first conductivity type protrusion-shaped semiconductors, wherein the crystal defect removal step and the crystal defect recovery step are performed in this order.

According to this embodiment, both the crystal defect removal step by wet etching and the crystal defect recovery step by annealing are performed in this order, so that crystallinity of the protrusion-shaped semiconductors can be improved effectively.

There is also provided, according to the present invention, a light-emitting element production method including:

a step of patterning a mask layer on a surface of a first conductivity type semiconductor layer forming part or entirety of a first substrate;

a semiconductor core formation step of forming a plurality of first conductivity type protrusion-shaped semiconductors by anisotropically etching the semiconductor layer with the mask layer used as a mask;

a semiconductor shell formation step of forming a second conductivity type semiconductor layer so that surfaces of the first conductivity type protrusion-shaped semiconductors are covered therewith; and a light-emitting element cut-off step of cutting off the first conductivity type protrusion-shaped semiconductors, which are covered with the second conductivity type semiconductor layer, from the first substrate.

According to this production method, in the light-emitting element cut-off step each of the protrusion-shaped semiconductors formed by processing the first conductivity type semiconductor layer eventually forms an independent light-emitting element. Therefore, diversification of usage of the light-emitting elements and improvement in utility value thereof can be attained in that each light-emitting element can separately and freely be used. For instance, a desired number of cut-off light-emitting elements can be arranged with a desired density. In this process, a surface emitting device can be configured by rearrangement of a large number of minute light-emitting elements on a large-area substrate as an example. Besides, high reliability and long life can be attained by reduction in heat density. Also, according to the production method, the second conductivity type semiconductor layer is formed so as to cover the first conductivity type protrusion-shaped semiconductors, and thus almost entire side surfaces of the protrusion-shaped semiconductors emit light. Thus a large number of light-emitting elements with a large total amount of emitted light can be obtained from the substrate (first substrate). Also, according to this production method, since the protrusion-shaped semiconductors are made from the first conductivity type semiconductors, resistance of the protrusion-shaped semiconductors can easily be decreased by increasing an amount of impurity that imparts property of the first conductivity type to the protrusion-shaped semiconductors. Therefore, even if the length of the protrusion-shaped semiconductors is increased, increases in the resistance of the protrusion-shaped semiconductors can be suppressed and the protrusion-shaped semiconductors can be made to uniformly emit light over the range from their root to front end portions. Thus the light-emission quantity per unit area of the first substrate can be further increased. Furthermore, according to the production method, in which the protrusion-shaped semiconductors can be formed by the photolithography process and the anisotropic etching, protrusion-shaped semiconductors having a satisfactory shape as planned and designed can be obtained and yield can be improved accordingly.

In one embodiment, the light-emitting element production method further includes a step, to be performed between the semiconductor core formation step and the semiconductor shell formation step, of forming an active layer so that surfaces of the first conductivity type protrusion-shaped semiconductors are covered therewith.

According to this embodiment, the light emission efficiency can be enhanced by the active layer.

In one embodiment, the light-emitting element production method further includes a step, to be performed after the semiconductor shell formation step, of forming a transparent electrode layer so that the second conductivity type semiconductor layer is covered therewith.

According to this embodiment, the transparent electrode layer prevents occurrence of voltage drop in the second conductivity type semiconductor layer while allowing penetration therethrough of light radiated from the protrusion-shaped semiconductors. Thus, the protrusion-shaped semiconductors can be made to emit light uniformly from substantially all parts thereof.

There is also provided, according to the present invention, a light-emitting device production method including:

a step of patterning a mask layer on a surface of a first conductivity type semiconductor layer forming part or entirety of a first substrate;

a semiconductor core formation step of forming a plurality of first conductivity type protrusion-shaped semiconductors by anisotropically etching the semiconductor layer with the mask layer used as a mask;

a semiconductor shell formation step of forming a second conductivity type semiconductor layer so that surfaces of the first conductivity type protrusion-shaped semiconductors are covered therewith;

a light-emitting element cut-off step of cutting off the first conductivity type protrusion-shaped semiconductors, which are covered with the second conductivity type semiconductor layer, from the first substrate to obtain light-emitting elements;

a light-emitting element arrangement step of arranging the light-emitting elements on a second substrate; and a light-emitting element interconnection step of providing interconnections to energize the light-emitting elements arranged on the second substrate.

According to the light-emitting device production method of this invention, a desired number of light-emitting elements, which were cut off in the light-emitting element cut-off step, can be arranged with a desired density on the second substrate. Therefore, for example, a surface emitting device can be configured by the rearrangement of a large number of minute light-emitting elements on a large-area substrate. Besides, the high reliability and long life can be attained by the reduction in the heat density.

An illumination device according to an embodiment of the present invention includes a light-emitting device produced by the above light-emitting device production method.

According to the illumination device of this embodiment, since the light-emitting device produced by the light-emitting device production method of the invention is included, there can be obtained an illumination device of good light emission efficiency and high reliability.

A liquid crystal backlight according to an embodiment of the present invention includes a light-emitting device produced by the above light-emitting device production method.

According to the liquid crystal backlight of this embodiment, since the light-emitting device produced by the light-emitting device production method of the invention is included, there can be obtained a backlight of high heat dissipation or radiation efficiency.

There is also provided, according to the present invention, a display device production method including:

a step of patterning a mask layer on a surface of a first conductivity type semiconductor layer forming part or entirety of a first substrate;

a semiconductor core formation step of forming a plurality of first conductivity type protrusion-shaped semiconductors by anisotropically etching the semiconductor layer with the mask layer used as a mask;

a semiconductor shell formation step of forming a second conductivity type semiconductor layer so that surfaces of the first conductivity type protrusion-shaped semiconductors are covered therewith;

a light-emitting element cut-off step of cutting off the first conductivity type protrusion-shaped semiconductors, which are covered with the second conductivity type semiconductor layer, from the first substrate to obtain light-emitting elements;

a light-emitting element arrangement step of arranging the light-emitting elements (200) in correspondence to pixel positions on a second substrate; and a light-emitting element interconnection step of providing interconnections to energize the light-emitting elements (200) arranged in correspondence to the pixel positions on the second substrate.

According to the display device production method of this invention, since the second conductivity type semiconductor layer is formed so as to cover the surfaces of the first conductivity type protrusion-shaped semiconductors, a light-emission area per unit area of the first substrate as a component of the protrusion-shaped semiconductors can be made quite large. That is, a production cost for the first conductivity type protrusion-shaped semiconductors covered with the second conductivity type semiconductor layer functioning as light-emitting elements can be reduced largely. The first conductivity type protrusion-shaped semiconductors covered with the second conductivity type semiconductor layer are cut off from the first substrate, and placed on the second substrate that is to become a panel of the display device, and further subjected to interconnections, by which the display device is produced. The number of pixels of this display device may be about 6,000,000 as an example. Thus, the cost of the individual light-emitting elements is quite important in cases where the light-emitting elements are used for every pixel. By using this production method to produce the display device, production cost for the display device can be cut down.

A display device according to an embodiment of the present invention is produced by the above display device production method.

According to this embodiment, there can be provided a display device at a low cost.

A diode according to another aspect of the present invention includes:

a core part;

a first conductivity type semiconductor layer formed so as to cover the core part; and a second conductivity type semiconductor layer that covers the first conductivity type semiconductor layer, wherein material of the core part and material of the first conductivity type semiconductor layer are different from each other.

According to the diode of this invention, since roles of the two poles of the diode are fulfilled by the first conductivity type semiconductor layer and the second conductivity type semiconductor layer, a desired material may be selected as the material of the core part. Therefore, the core part can be provided with desired properties (refractive index, thermal conductivity, electrical conductivity, etc.) without incurring increases in manufacturing costs or decreases in production yield.

In one embodiment, the core part is larger in refractive index than the first conductivity type semiconductor layer and the diode is a light-emitting diode.

According to this embodiment, generated light is guided to the core part so as to fulfill intense emission at the core part.

In one embodiment, the core part is larger in refractive index than the first conductivity type semiconductor layer and the diode has a photoelectric effect.

According to this embodiment, light less escapes out of the diode, so that the light confinement effect can be enhanced and the photoelectric effect can be enhanced.

In one embodiment, the core part is smaller in refractive index than the first conductivity type semiconductor layer and the diode is a light-emitting diode.

According to this embodiment, generated light is less easily inputted into the core part and more easily reflected by the core part surface. Thus, light can be extracted outside from the first conductivity type semiconductor layer toward the second conductivity type semiconductor layer.

In one embodiment, the core part is larger in thermal conductivity than the first conductivity type semiconductor layer and the diode is a light-emitting diode.

According to this embodiment, since heat is diffused from the first conductivity type semiconductor layer to the core part, heat radiation is facilitated, so that decreases in light emission efficiency due to high temperatures can be avoided.

In one embodiment, the core part is larger in thermal conductivity than the first conductivity type semiconductor layer and the diode has a photoelectric effect.

According to this embodiment, since heat is diffused from the first conductivity type semiconductor layer to the core part, heat radiation is facilitated, so that decreases in photoelectric conversion efficiency due to high temperatures can be avoided.

In one embodiment, the core part is larger in electrical conductivity than the first conductivity type semiconductor layer and the diode is a light-emitting diode.

According to this embodiment, electrical resistance of the core part is lessened so that an electric current is allowed to more easily flow from the core part to the first conductivity type semiconductor layer. Thus, light emission of high efficiency can be fulfilled with loss suppressed.

In one embodiment, the core part is larger in electrical conductivity than the first conductivity type semiconductor layer and the diode has a photoelectric effect.

According to this embodiment, electrical resistance of the core part is lessened so that an electric current is allowed to more easily flow from the first conductivity type semiconductor layer to the core part. Thus, power generation of high efficiency can be fulfilled with loss suppressed.

In one embodiment, the core part is made from silicon.

According to this embodiment, since the production process for the core part made from silicon has already been established, an element of desired configuration can be obtained.

In one embodiment, the diode has been produced by a process of forming the core part, the first conductivity type semiconductor layer and the second conductivity type semiconductor layer on a substrate, and thereafter cutting off the core part, the first conductivity type semiconductor layer, and the second conductivity type semiconductor layer from the substrate.

According to this embodiment, the diodes are separated from the substrate, so that their mounting onto other substrates can be fulfilled more easily.

A diode production method according to an embodiment of the present invention includes the steps of:

forming a core part on a substrate;

forming a first conductivity type semiconductor layer so that the core part is covered therewith; and forming a second conductivity type semiconductor layer so that the first conductivity type semiconductor layer is covered therewith, wherein material of the core part and material of the first conductivity type semiconductor layer are different from each other.

According to the diode production method of this embodiment, since roles of the two poles of the diode are fulfilled by the first conductivity type semiconductor layer and the second conductivity type semiconductor layer, a desired material may be selected as the material of the core part. Thus, there can be produced a diode in which the core part is provided with desired properties.

An illumination device according to an embodiment of the present invention includes the light-emitting diode of the above embodiment.

According to the illumination device of this embodiment, properties (refractive index, thermal conductivity, electrical conductivity) of the core part of the light-emitting diode can be set to desired ones without incurring increases in manufacturing costs or decreases in production yield. Thus, there can be obtained such advantages as an easier setting of directivity of illumination and improvement of illumination efficiency.

A backlight according to an embodiment of the present invention includes the light-emitting diode of the above embodiment.

According to the backlight of this embodiment, properties (refractive index, thermal conductivity, electrical conductivity) of the core part of the light-emitting diode can be set to desired ones. Thus, there can be obtained such advantages as an easier setting of directivity of the backlight and improvement of efficiency of the backlight.

A display device according to an embodiment includes the light-emitting diode of the above embodiment.

According to the display device of this embodiment, properties (refractive index, thermal conductivity, electrical conductivity) of the core part of the light-emitting diode can be set to desired ones. Thus, there can be obtained such advantages as an easier setting of directivity of the backlight and improvement of efficiency of the display device.

A photodetector according to an embodiment includes the diode having a photoelectric effect of the above embodiment.

According to the photodetector of this embodiment, properties (refractive index, thermal conductivity, electrical conductivity) of the core part of the diode having the photoelectric effect can be set to desired ones without incurring increases in manufacturing costs or decreases in production yield. Thus, it becomes possible to achieve improvement in the light confinement effect, improvement in the heat radiation (heat dissipation), suppression of loss, and the like, so that the photoelectric conversion efficiency can be enhanced and the photodetection performance can be improved.

A solar cell according to an embodiment includes the diode having a photoelectric effect of the above embodiment.

According to the solar cell photodetector of this embodiment, properties (refractive index, thermal conductivity, electrical conductivity) of the core part of the diode having the photoelectric effect can be set to desired ones without incurring increases in manufacturing costs or decreases in production yield. Thus, it becomes possible to achieve improvement in the light confinement effect, improvement in the heat radiation (heat dissipation), suppression of loss, and the like, so that electricity is efficiently generated.

According to the light-emitting element of this invention, since the protrusion-shaped semiconductors are made from the first conductivity type semiconductor, increasing the quantity of impurities for imparting the first conductivity type to the protrusion-shaped semiconductors makes it easily achievable to lower the resistance. Therefore, even if the protrusion-shaped semiconductors are elongated in length, increases in resistance of the protrusion-shaped semiconductors can be suppressed, so that uniform light emission over a range from the root to front end portions of the protrusion-shaped semiconductors can be exerted. Thus, the light-emission quantity per unit area of the first conductivity type semiconductor base can be further increased.

According to the diode of this invention, since roles of the two poles of the diode are fulfilled by the first conductivity type semiconductor layer and the second conductivity type semiconductor layer, a desired material may be selected as the material of the core part. Therefore, the core part can be provided with desired properties (refractive index, thermal conductivity, electrical conductivity, etc.) without incurring increases in manufacturing costs or decreases in production yield.

BRIEF DESCRIPTION OF THE DRAWINGS

FIG. 7C is a schematic plan view for illustrating a production method for the light-emitting element of the second embodiment;

DETAILED DESCRIPTION OF THE INVENTION

Hereinbelow, the invention will be described in detail with reference to embodiments shown in the attached drawings.

First Embodiment

Figure 1A:
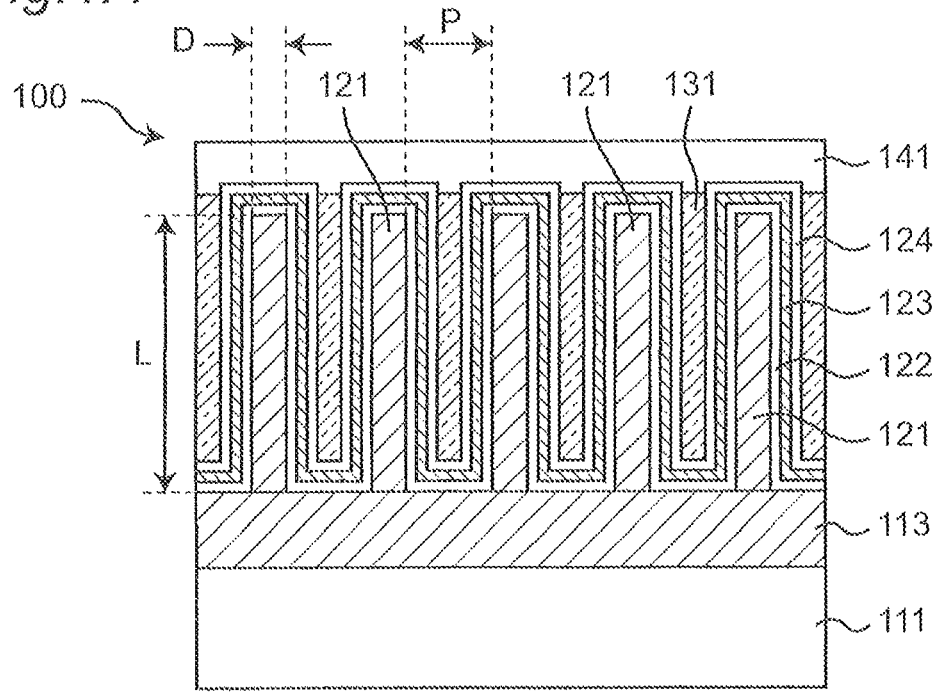
FIG. 1A is a sectional view of a first embodiment of a light-emitting element of the invention.
Figure 1B:
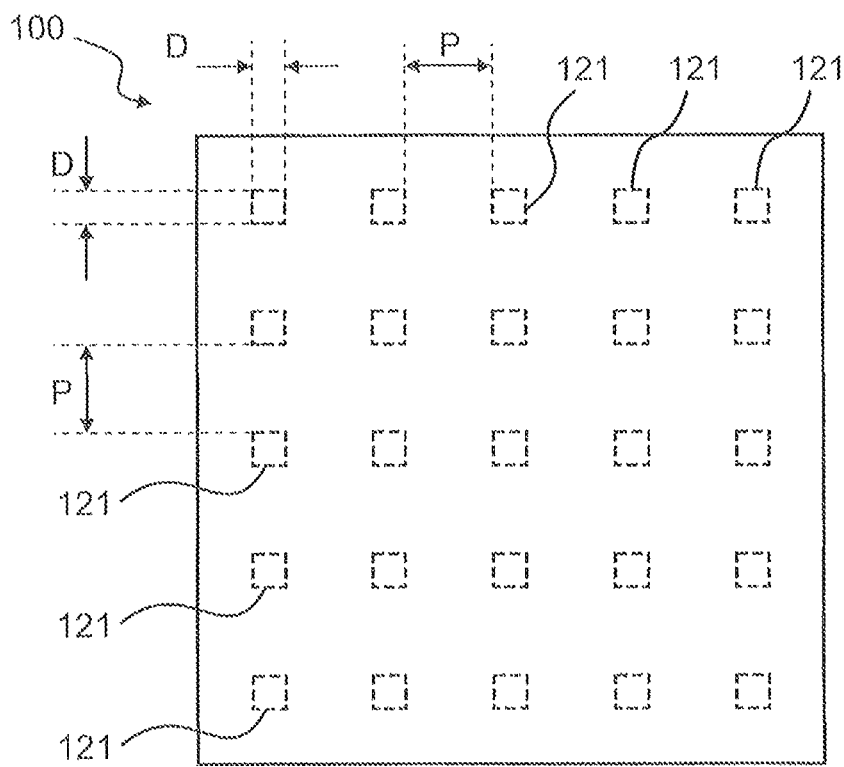
FIG. 1B is a schematic plan view of the first embodiment.

A light-emitting element according to a first embodiment of the invention will be described with reference to FIGS. 1A, 1B, and 2 through 6. FIG. 1A is a sectional view of the light-emitting element of the first embodiment. FIG. 1B is a view of the light-emitting element of the first embodiment as seen looking from above, the view exclusively showing positions of rod-shaped semiconductors. FIGS. 2 through 6 are diagrams for illustrating a production method for the light-emitting element of the first embodiment. The light-emitting element 100 of the first embodiment has an n-type semiconductor layer 113 as a first conductivity type semiconductor base, a plurality of n-type rod-shaped semiconductors 121 formed on the n-type semiconductor layer 113, and a p-type semiconductor layer 123, as a second conductivity type semiconductor layer, covering the rod-shaped (protrusion-shaped) semiconductors 121. As the first conductivity type semiconductor base, a p-type semiconductor layer may be provided in place of the n-type semiconductor layer 113. In this configuration, an n-type semiconductor layer is provided as the second conductivity type semiconductor layer, in place of the p-type semiconductor layer 123. That is, use of p-type for the semiconductor layer 113 that forms the first conductivity type semiconductor base involves use of n-type for the semiconductor layer 123 that forms the second conductivity type semiconductor layer. By contrast, use of n-type for the semiconductor layer 113 involves use of p-type for the semiconductor layer 123. Hereinbelow, an example will be described in which the semiconductor layer 113 as the first conductivity type semiconductor base and the first conductivity type rod-shaped semiconductors 121 are of n-type and in which the second conductivity type semiconductor layer 123 is of p-type. Replacement between n-type and p-type in the following description, however, provides description on an example in which the semiconductor layer 113 as the first conductivity type semiconductor base and the first conductivity type rod-shaped semiconductors 121 are of p-type and in which the second conductivity type semiconductor layer 123 is of n-type.

In the light-emitting element 100 of the first embodiment, as shown in FIGS. 1A and 1B, the n-type semiconductor layer 113 that forms the first conductivity type semiconductor base is formed on a substrate 111, and the plurality of n-type rod-shaped semiconductors 121 as the rod-shaped semiconductors of the first conductivity type are formed in an erect state on the n-type semiconductor layer 113 so as to be spaced apart from one another. Entire surfaces of the n-type rod-like semiconductors 121 and the n-type semiconductor layer 113 are covered with an active layer 122. The p-type semiconductor layer 123 is formed on the entire active layer 122. Besides, the p-type semiconductor layer 123 is entirely covered with a transparent electrode layer 124. Across each of gaps among the plurality of n-type rod-shaped semiconductors 121, parts of the transparent electrode layer 124 covering the active layer 122 covering the rod-shaped semiconductors 121 face each other. The gaps across which parts of the transparent electrode layer 124 face each other are filled with a transparent member 131 having higher transparency than the transparent electrode layer 124.

The transparent electrode layer 124 on top parts of the rod-like semiconductors 121 is not covered with the transparent member 131 but with an upper electrode 141. As shown in FIG. 1A, namely, the upper electrode 141 is formed on the transparent member 131 filling the gaps between the facing parts of the transparent electrode layer 124 and on the transparent electrode layer 124 covering the top parts of the rod-shaped semiconductors 121. Thus the transparent electrode layer 124 is electrically connected to the upper electrode 141.

An insulator such as sapphire, a semiconductor such as silicon, or the like may be used for the substrate 110, whereas the substrate 110 is not limited thereto. Semiconductors including GaN, GaAs, AlGaAs, GaAsP, InGaN, AlGaN, GaP, ZnSe, AlGaInP or the like as base material may be used for the n-type semiconductor 113, the n-type rod-shaped semiconductors 121, and the p-type semiconductor layer 123. Provided that GaN is selected as the n-type semiconductor 113, the n-type rod-shaped semiconductors 121, and the p-type semiconductor layer 123, for instance, InGaN can be used for the active layer 122. For the transparent electrode layer 124, ITO, ZnO, SnO or the like can be used, for instance. For the transparent member 131, a silicon oxide film or transparent resin can be used, for instance. For the upper electrode 141, metal such as gold, silver, copper, aluminum, and tungsten or a transparent electrode made of ITO, ZnO, SnO or the like can be used, for instance. Provided that a silicon substrate or the like that blocks penetration of light is used as the substrate 111, it is necessary to select, as the upper electrode 141, a transparent electrode or the like that allows penetration of light.

The film thickness of the n-type semiconductor layer 113 as the semiconductor base may be 5 μm, the size (thickness) D of the n-type rod-shaped semiconductors 121 may be 1 μm, the length L of the same may be 20 μm, the interval P between the n-type rod-shaped semiconductors 121 may be 3 μm, the film thickness of the active layer 122 may be 10 nm, the film thickness of the p-type semiconductor layer 123 may be 150 nm, and the film thickness of the transparent electrode layer 124 may be 150 nm, for instance. The film thicknesses and the like, however, are not limited to the above ones.

In the embodiment, hereinafter, a silicon substrate is used as the substrate 111, GaN is used for the n-type semiconductor layer 113, the n-type rod-shaped semiconductors 121, and the p-type semiconductor layer 123, InGaN is used for the active layer 122, ITO is used for the transparent electrode layer 124, a silicon oxide film is used for the transparent member 131, and ITO is used for the upper electrode 141, unless otherwise specified. The above-described numerical examples are used as the film thicknesses of these components. Though the first conductivity type is n-type and the second conductivity type is p-type here, the first conductivity type may be p-type and the second conductivity type may be n-type, as described at beginning.

In the light-emitting element of the embodiment, the n-type semiconductor layer 113 forms a lower electrode (cathode), and the light-emitting element (light-emitting diode) can be made to emit light by passage of a current between the lower electrode (cathode) and the upper electrode (anode) 141.

In the light-emitting element of the embodiment, the p-type semiconductor layer 123 is formed so as to cover the n-type rod-shaped semiconductors 121, and thus almost entire side surfaces of the rod-shaped semiconductors 121 emit light. Therefore, an amount of emitted light per unit area of the substrate 111 can be increased as compared with light-emitting diode chips having planar light-emitting layers.

The amount of emitted light per unit area of the substrate 111 can be increased according to increase in the length L of the rod-shaped semiconductors 121. In the light-emitting element of the embodiment in which the rod-shaped semiconductors 121 are composed of n-type semiconductors, resistance of the rod-shaped semiconductors 121 can easily be decreased by increase in amount of impurity that imparts property of n-type to the rod-shaped semiconductors 121. Therefore, the rod-shaped semiconductors 121 can be made to uniformly emit light from parts thereof ranging from a base part to an extremity part even though the length L of the rod-shaped semiconductors 121 is increased. Thus the amount of emitted light per unit area of the substrate 111 can further be increased.

With regard to the length L and the size (thickness) D of the n-type rod-shaped semiconductors 121, a value (L/D) that is the length L divided by the thickness D is preferably ten or larger. That is, the length L is preferably ten times the thickness D or larger. That is because such a configuration notably increases the amount of emitted light per unit area of the substrate 111. In rod-shaped semiconductors composed of active layers as in the prior art, by contrast, it is difficult to make extremity parts of the rod-shaped semiconductors emit light on condition that the value (L/D) that is obtained from division of length L of the rod-shaped semiconductors by thickness D thereof is ten or larger. Therefore, advantages of the invention that are low resistance and high emission intensity become particularly remarkable on condition that the value (L/D) that is the length L divided by the thickness D is ten or greater. It is difficult to make the value (L/D) equal to or larger than fifty in the existing techniques, and such a configuration makes it impossible to ignore the resistance of the first conductivity type rod-shaped semiconductors 121. A light-emitting area (a total area of the active layer 122 in the embodiment) of the element is preferably three or more times the area of the n-type semiconductor layer 113 as the semiconductor base. The area of the n-type semiconductor layer 113 is defined here as an area of the planar semiconductor layer 113 from which the n-type rod-shaped semiconductors 121 and a structure on the n-type rod-shaped semiconductors 121 (namely, the active layer 122, the p-type semiconductor layer 123, the transparent electrode layer 124, the transparent member 131 and the like) have been removed. Such a configuration provides a large amount of emitted light per unit area of the substrate 111 and sufficient effect of cost reduction.

Though the active layer 122 is formed between the n-type rod-shaped semiconductors 121 and the p-type semiconductor layer 123 in the embodiment, this is not essential. It is, however, preferable to provide the active layer 122, which increases light emission efficiency. The active layer 122 ensures satisfactory light emission efficiency because the layer 122 is formed between the n-type rod-shaped semiconductors 121 and the p-type semiconductor layer 123 so as to have a thickness of 10 nm, for instance. That is because the active layer is provided for increasing probability of recombination by confining carriers of both polarities (holes and electrons) in a narrow range. In an element in which all parts including rod-shaped semiconductors are composed of active layers as in the prior art, high light emission efficiency cannot be attained because the confinement of the carriers is insufficient.

Though the transparent electrode layer 124 is formed on the p-type semiconductor layer 123, this is not essential. It is, however, preferable to provide the transparent electrode layer 124, and existence of the transparent electrode layer 124 prevents occurrence of voltage drop in the p-type semiconductor layer 123 while the transparent electrode layer 124 allows light radiated from the active layer 122 to penetrate through the transparent electrode layer 124. Thus the rod-shaped semiconductors 121 can be made to uniformly emit light from all parts thereof.

In a configuration in which the transparent electrode layer 124 is formed on the p-type semiconductor layer 123, it is preferable that not entire gaps among the plurality of n-type rod-shaped semiconductors 121 should be filled with the transparent electrode layer 124. That is, it is preferable that the transparent electrode layer 124 of a small thickness should be formed on the p-type semiconductor layer 123 and that resultant facing gaps which are left among the plurality of n-type rod-shaped semiconductors 121 and across which parts of the transparent electrode layer 124 face with each other should be filled with the transparent member 131 made of a material having higher transparency than the transparent electrode layer 124. That is because the transparent electrode layer 124 in which carriers for passage of currents exist is, in general, poor in transparency. Therefore, the gaps among the plurality of n-type rod-shaped semiconductors 121 are filled with the transparent member 131 made of a silicon oxide film, transparent resin or the like, so that the light emission efficiency of the light-emitting element can be improved.

Though the active layer 122, the p-type semiconductor layer 123, and the transparent electrode layer 124 cover entire surfaces of the n-type rod-shaped semiconductors 121 and the n-type semiconductor layer 113 in the light-emitting element 100 of the embodiment, the layers 122, 123 and 124 do not have to cover the entire surfaces. That is, the active layer 122, the p-type semiconductor layer 123, and the transparent electrode layer 124 have only to cover at least the n-type rod-shaped semiconductors 121. That is because the amount of emitted light per unit area of the substrate 111 can be increased by the covering of the n-type rod-shaped semiconductors 121 with the active layer 122, the p-type semiconductor layer 123, and the transparent electrode layer 124.

Next, a production method for the light-emitting element 100 of the first embodiment will be described with reference to FIGS. 2, 3A, 3B, and 4 through 6.

Figure 2:
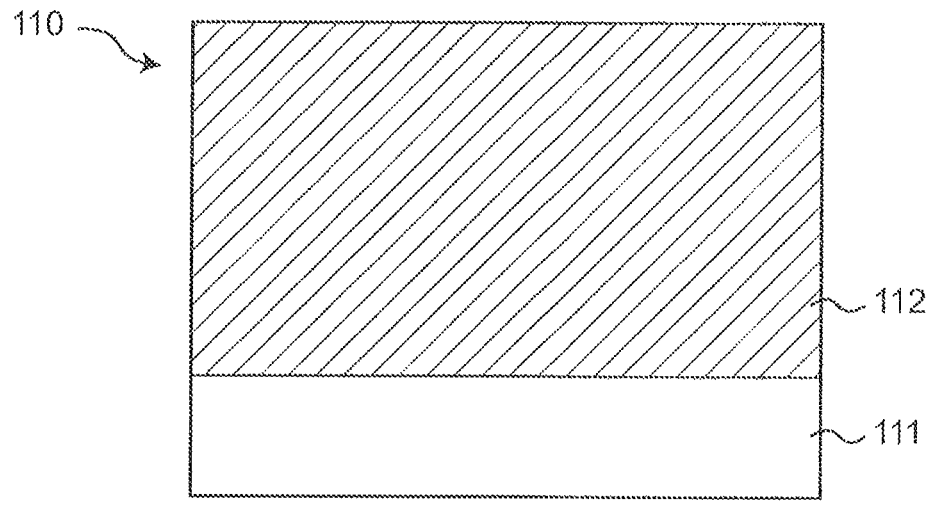
FIG. 2 is a diagram for illustrating a production method for the light-emitting element of the first embodiment.

As shown in FIG. 2, initially, a semiconductor layer 112 composed of n-type GaN is deposited as the first conductivity type semiconductor layer with thickness of 25 µm by MOCVD on the substrate 111 composed of silicon. At this point, the substrate 111 composed of silicon and the semiconductor layer 112 composed of n-type GaN integrally form a first substrate 110. In other words, the semiconductor layer 112 composed of n-type GaN forms a portion of the first substrate 110. A single layer substrate composed of n-type GaN may be prepared instead of carrying out the above procedure. In such a configuration, it can be said that the first conductivity type semiconductor layer composed of n-type GaN forms the whole of the first substrate.

Figure 3A:
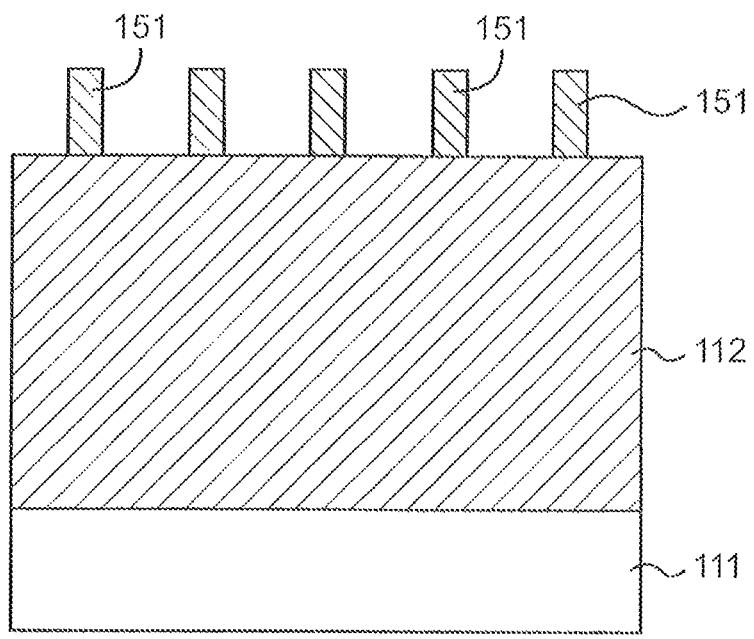
FIG. 3A is a diagram for illustrating the production method for the light-emitting element of the first embodiment.
Figure 3B:
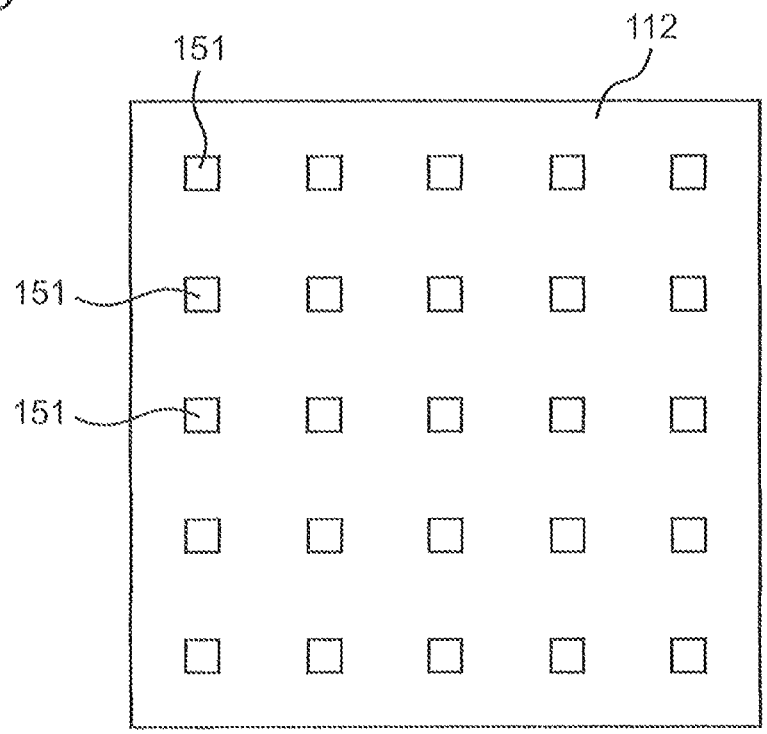
FIG. 3B is a plan view for illustrating the production method for the light-emitting element of the first embodiment.

As shown in FIGS. 3A and 3B (view as seen from above in FIG. 3A), subsequently, patterning of a photoresist 151 is carried out by photolithography process on the semiconductor layer 112 composed of n-type GaN as the first conductivity type semiconductor layer. In this process, for instance, a silicon oxide film may be deposited on an entire surface of the semiconductor layer 112 composed of n-type GaN as the first conductivity type semiconductor layer, and then may be subjected to patterning with photolithography process and etching process.

Figure 4:
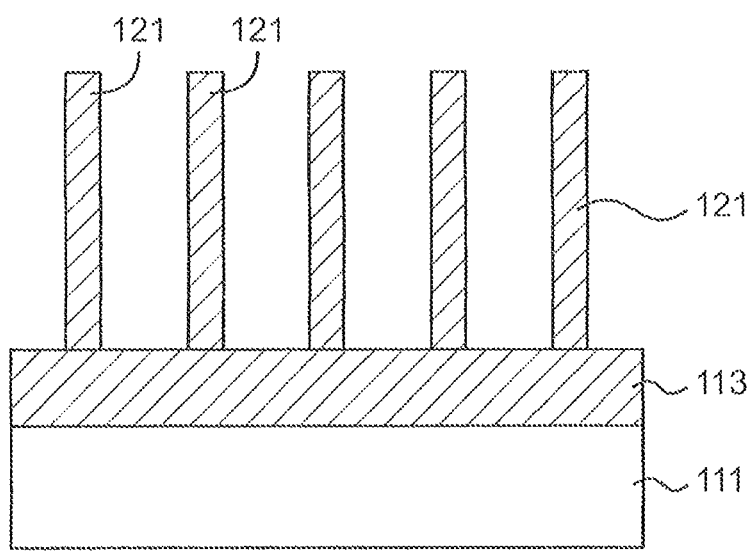
FIG. 4 is a diagram for illustrating the production method for the light-emitting element of the first embodiment.

As shown in FIG. 4, subsequently, the semiconductor layer 112 composed of n-type GaN as the first conductivity type semiconductor layer is subjected to anisotropic dry etching with use of the patterned photoresist 151 as a mask, and the rod-shaped (protrusion-shaped) semiconductors 121 composed of n-type GaN are thereby formed (semiconductor core formation step). In this process, the etching is performed so that the semiconductor layer 112 composed of n-type GaN remains with a film thickness of about 5 µm, and this remaining portion forms the semiconductor layer 113 composed of n-type GaN. The resultant length L of the first conductivity type rod-shaped semiconductors 121 composed of n-type GaN is 20 µm. The plurality of rod-shaped semiconductors 121 are formed in the erect state and spaced apart from one another on the n-type GaN semiconductor layer 113.

Herein, steps that will be described below are preferably performed in order to recover or remove crystal defects caused in the rod-shaped semiconductors 121 by the dry etching.

(Annealing Step)

The substrate 111 on which the rod-shaped semiconductors 121 are formed is annealed in nitrogen atmosphere in order to recover from the crystal defects caused in the rod-shaped semiconductors 121, after the semiconductor core formation step and before a semiconductor shell formation step that will be described later (crystal defect recovery step). By this process the rod-shaped semiconductors 121 are annealed. The annealing can be performed at a temperature between 600° C. and 1200° C., provided that the rod-shaped semiconductors 121 are composed of n-type GaN, for instance. The annealing temperature on condition that the rod-shaped semiconductors 121 are composed of n-type GaN is more preferably in a range of 700 to 900° C. that results in notable recovery from the crystal defects in GaN and that prevents decomposition of GaN.

(Wet Etching Step)

After the semiconductor core formation step and before the semiconductor shell formation step that will be described later, the substrate 111 on which the rod-shaped semiconductors 121 are formed is subjected to wet etching, so that a layer containing at a high density the crystal defects caused in the rod-shaped semiconductors 121 is selectively removed (crystal defect removal step). For the rod-shaped semiconductors 121 of n-type GaN, for instance, hot phosphoric acid heated to between 120° C. and 150° C. is preferably used as etchant.

Reduction in the density of the crystal defects in the rod-shaped semiconductors 121 and improvement in crystallinity thereof can be attained by carrying out the crystal defect recovery step (annealing step) or the crystal defect removal step (wet etching step). Therefore, crystallinity of the active layer (light-emitting layer) 122 and the second conductivity type semiconductor layer 123 is also improved in the semiconductor shell formation step that is subsequently performed, as a result of which the light emission efficiency of the light-emitting element can be improved.

The crystallinity of the rod-shaped semiconductors 121 can more effectively be improved by carrying out both the crystal defect removal step (wet etching step) and the crystal defect recovery step (annealing step) in order of mention, (that is, by initial performance of the wet etching step and subsequent performance of the annealing step).

Figure 5:
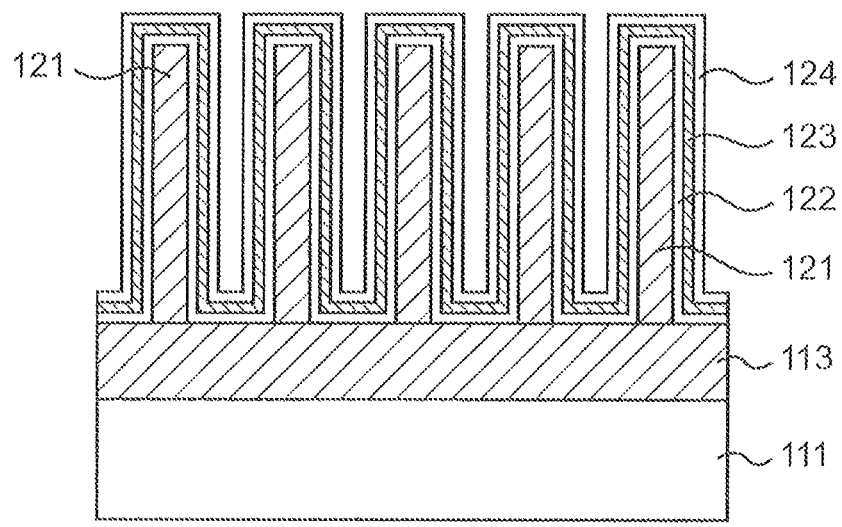
FIG. 5 is a diagram for illustrating the production method for the light-emitting element of the first embodiment.

As shown in FIG. 5, subsequently, the active layer 122 composed of InGaN with a thickness of 10 nm is deposited on the entire surfaces of the semiconductor layer 113 composed of n-type GaN as the first conductivity type semiconductor base and of the rod-shaped semiconductors 121 composed of n-type GaN as the rod-shaped semiconductors of the first conductivity type. Subsequently, the second conductivity type semiconductor layer 123 composed of 150 nm p-type GaN is deposited on the active layer 122 composed of InGaN (semiconductor shell formation step). Moreover, the transparent electrode layer 124 composed of 150 nm ITO is deposited on the second conductivity type semiconductor layer 123 composed of p-type GaN. The active layer 122 composed of InGaN and the second conductivity type semiconductor layer 123 composed of p-type GaN are formed by MOCVD technique. The transparent electrode layer 124 composed of ITO is formed by sputtering, mist CVD or plating.

Figure 6:
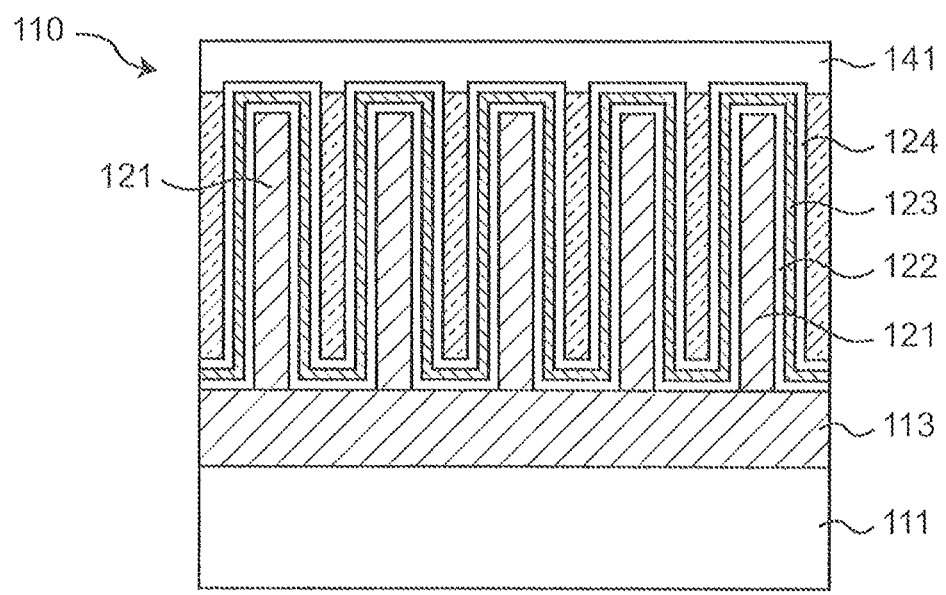
FIG. 6 is a diagram for illustrating the production method for the light-emitting element of the first embodiment.

As shown in FIG. 6, subsequently, the gaps among the first conductivity type rod-shaped semiconductors 121, which are composed of n-type GaN and which are covered with the active layer 122 composed of InGaN, the second conductivity type semiconductor layer 123 composed of p-type GaN, and the transparent electrode layer 124 composed of ITO, are filled with the transparent member 131 composed of the silicon oxide film. The silicon oxide film can be formed by application of SOG (Spin-On Glass). After the application of SOG, the top parts of the transparent electrode layer 124 are exposed by wet etching, and the upper electrode 141 composed of ITO is deposited by sputtering, so that the light-emitting element 100 is finished.

The production method for the light-emitting element 100 includes the step of patterning a mask layer of the photoresist 151 on a surface of the n-type GaN semiconductor layer 112 that forms a portion or entirety of the first substrate 110, the semiconductor core formation step of forming the plurality of rod-shaped semiconductors 121 composed of n-type GaN by anisotropically etching the n-type GaN semiconductor layer with use of the mask layer as the mask, and the semiconductor shell formation step of forming the p-type GaN semiconductor layer 123 so as to cover the surfaces of the rod-shaped semiconductors 121 composed of n-type GaN.

The p-type semiconductor layer 123 is formed by the production method so as to cover the rod-shaped semiconductors 121 composed of n-type GaN, and thus almost entire side surfaces of the rod-shaped semiconductors 121 emit light. Therefore, the amount of emitted light per unit area of the substrate 111 can be increased as compared with light-emitting diode chips having planar light-emitting layers. In the production method, the rod-shaped semiconductors 121 are composed of n-type semiconductor, and the resistance thereof can easily be decreased by the increase in the amount of impurity that imparts the property of n-type. Therefore, the rod-shaped semiconductors 121 can be made to uniformly emit light from their parts ranging from the base part to the extremity part even though the length L of the rod-shaped semiconductors 121 is increased. Thus the amount of emitted light per unit area of the substrate 111 can further be increased. In the production method in which the rod-shaped semiconductors 121 are formed by the photolithography process and the anisotropic etching, the rod-shaped semiconductors 121 having a satisfactory shape as planned can be obtained and yield therefor can be improved.

In the production method, the length L of the n-type rod-shaped semiconductors 121 is preferably ten or greater times the thickness D thereof. That is because such a configuration notably increases the amount of emitted light per unit area of the substrate 111. In rod-shaped semiconductors composed of active layers as in the prior art, by contrast, it is difficult to make extremity parts of the rod-shaped semiconductors emit light on condition that the value (L/D) that is obtained from division of length L of the rod-shaped semiconductors by thickness D thereof is ten or greater. Therefore, advantages of the embodiment that are low resistance and high emission intensity become particularly remarkable on condition that the value (L/D) of the rod-shaped semiconductors 121 is ten or greater. It is difficult in the existing techniques to make the value (L/D) equal to or greater than fifty, and moreover such configuration makes it impossible to ignore the resistance of the n-type first conductivity type rod-shaped semiconductors 121. The light-emitting area (the total area of the active layer 122 in the embodiment) is preferably three or greater times the area of the n-type semiconductor layer 113 as the semiconductor base. Herein, the area of the n-type semiconductor layer (semiconductor base) 113 signifies the area of the planar semiconductor layer 113 from which the n-type GaN rod-shaped semiconductors 121 and the structure thereon (namely the active layer 122, the p-type GaN semiconductor layer 123, the transparent electrode layer 124 and the like) have been removed. Such a configuration provides a large amount of emitted light per the substrate 111 and sufficient effect of cost reduction.

In the production method, the active layer 122 composed of InGaN is formed so as to cover the surfaces of the rod-shaped semiconductors 121 composed of n-type GaN, between the semiconductor core formation step and the semiconductor shell formation step. Thus the light emission efficiency can be increased. The active layer 122 does not have to be formed.

In the production method, the transparent electrode layer 124 is formed so as to cover the p-type GaN semiconductor layer 123 after the semiconductor shell formation step. The transparent electrode layer 124 prevents occurrence of voltage drop in the p-type GaN semiconductor layer 123 while allowing light radiated from the active layer 122 to pass through it. Therefore, the rod-shaped semiconductors 121 can be made to uniformly emit light from all the parts thereof.

In the production method, the transparent electrode layer 124 is formed on the p-type GaN semiconductor layer 123. At this time, not entire gaps among the plurality of n-type rod-shaped semiconductors 121 are filled with the transparent electrode layer 124, but the transparent electrode layer 124 is formed with a small thickness on the p-type GaN semiconductor layer 123, and the remaining gaps (facing gaps across each of which parts of the transparent electrode layer 124 face each other) are filled with the transparent member 131. That is because a transparent electrode is, in general, poor in transparency due to carriers included therein for passage of currents. Therefore, the gaps formed between the first conductivity type rod-shaped semiconductors 121 are filled with a silicon oxide film, transparent resin or the like, and thus the light emission efficiency of the light-emitting element can be improved.

Second Embodiment

Figure 7A:
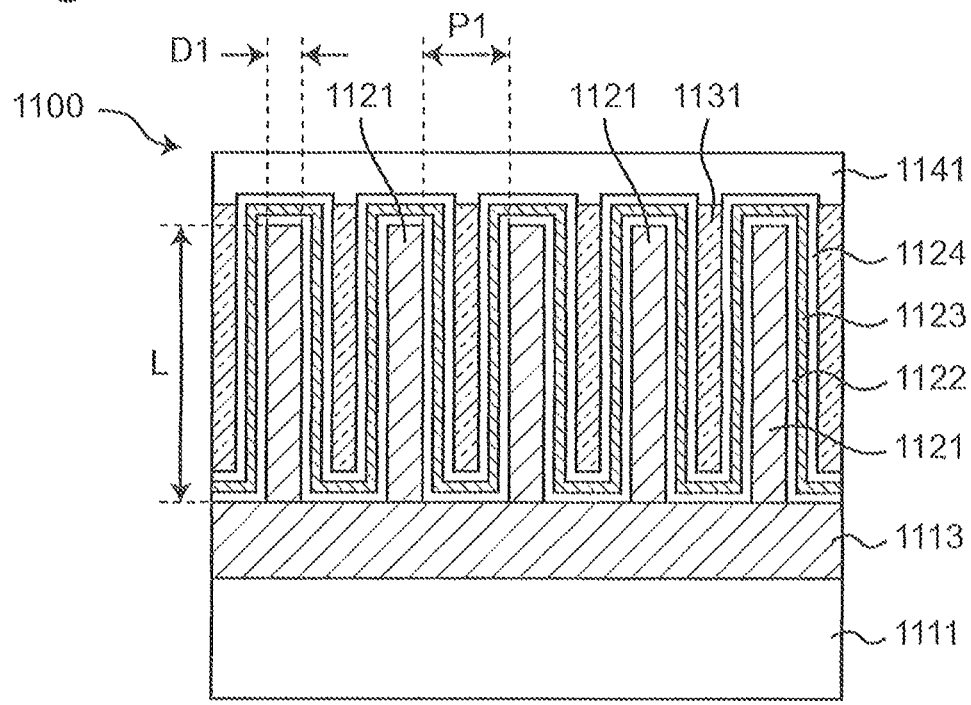
FIG. 7A is a sectional view of a second embodiment of a light-emitting element of the invention.
Figure 7B:
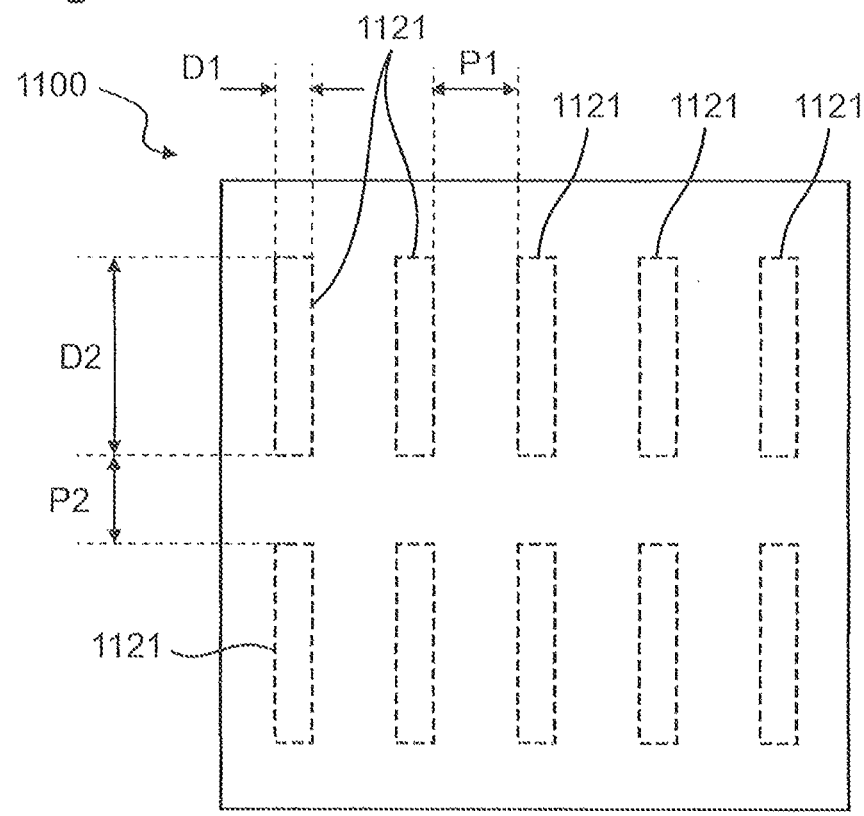
FIG. 7B is a schematic plan view of the light-emitting element of the second embodiment as seen looking from above.

Next, a second embodiment of a light-emitting element of the invention will be described with reference to FIGS. 7A through 7C. FIG. 7A is a sectional view of the light-emitting element of the second embodiment. FIG. 7B is a plan view of the light-emitting element of the second embodiment as seen looking from above, the plan view exclusively showing positions of plate-like semiconductors. FIG. 7C is a plan view for illustrating a production method for the light-emitting element of the second embodiment.

The light-emitting element 1100 of the second embodiment is different from the first embodiment in that the plate-like semiconductors 1121 are provided in place of the plurality of rod-shaped (protrusion-shaped) semiconductors 121 of the first conductivity type (n-type) in the light-emitting element 100 of the first embodiment. For the second embodiment, therefore, description will be omitted on details of parts thereof common to those of the first embodiment.

In FIGS. 7A and 7B, reference numeral 1100 denotes the light-emitting element, numeral 1111 denotes a substrate, numeral 1113 denotes an n-type semiconductor layer, numeral 1121 denotes the plate-shaped (protrusion-shaped) semiconductor, numeral 1122 denotes an active layer, numeral 1123 denotes a p-type semiconductor layer, numeral 1124 denotes a transparent electrode layer, numeral 1131 denotes a transparent member, and numeral 1141 denotes an upper electrode. The substrate 1111, the n-type semiconductor layer 1113, the plate-shaped semiconductors 1121, the active layer 1122, the p-type semiconductor layer 1123, the transparent electrode layer 1124, the transparent member 1131, and the upper electrode 1141 are made of materials similar to or same as those of the substrate 111, the n-type semiconductor layer 113, the rod-shaped semiconductors 121, the active layer 122, the p-type semiconductor layer 123, the transparent electrode layer 124, the transparent member 131, and the upper electrode 141, respectively, which have been described for the first embodiment.

The film thickness of the n-type semiconductor layer 1113 as a semiconductor base may be 5 µm, the thickness D1 of the n-type plate-shaped semiconductors 1121 may be 1 µm, the width D2 thereof may be 5 µm, the height L thereof may be 20 µm, distances P1, P2 (see FIG. 7B) between the n-type plate-shaped semiconductors 1121 may be 3 µm, the film thickness of the active layer 1122 may be 10 nm, the film thickness of the p-type semiconductor layer 1123 may be 150 nm, and the film thickness of the transparent electrode layer 1124 may be 150 nm, for instance. The film thicknesses and the other sizes, however, are not limited to the above-described ones.

In the light-emitting element of the embodiment, the n-type semiconductor layer 1113 forms a lower electrode (cathode), and the light-emitting element (light-emitting diode) can be made to emit light by passage of a current between the lower electrode (cathode) and the upper electrode (anode) 1141.

In the light-emitting element of the embodiment, the p-type semiconductor layer 1123 is formed so as to cover the n-type plate-shaped semiconductors 1121, and thus almost entire side surfaces of the plate-shaped semiconductors 1121 emit light. Therefore, an amount of emitted light per unit area of the substrate 1111 can be increased as compared with light-emitting diode chips having planar light-emitting layers.

The amount of emitted light per unit area of the substrate 1111 can be increased according to increase in the height L of the plate-shaped semiconductors 1121. In the light-emitting element of the embodiment in which the plate-shaped semiconductors 1121 are composed of n-type semiconductors, resistance of the plate-shaped semiconductors 1121 can easily be decreased by increase in amount of impurity that imparts property of n-type to the plate-shaped semiconductors 1121. Therefore, the plate-shaped semiconductors 1121 can be made to uniformly emit light from their parts ranging from a base part to an extremity part even though the height L of the plate-shaped semiconductors 1121 is increased. Thus the amount of emitted light per unit area of the substrate 1111 can further be increased.

The plate-shaped semiconductors 1121 are used in the embodiment, and advantages of being shaped like a plate will be described as follows. In general, emission efficiency of a light-emitting element depends on the surface orientation of a light-emitting layer. In a GaN-based light-emitting element, for instance, a nonpolar plane (a-plane or m-plane) is preferably used as a light-emitting plane. With use of the plate-shaped semiconductor, setting of a nonpolar plane as a primary surface (a surface having the width D2 in FIG. 7B) thereof increases the light emission efficiency as a whole.

Though the active layer 1122 is formed between the n-type plate-shaped semiconductors 1121 and the p-type semiconductor layer 1123 in the embodiment, this is not essential. It is, however, preferable to provide the active layer 1122, which increases the light emission efficiency. The active layer 1122 ensures satisfactory light emission efficiency because the layer 1122 is formed between the n-type plate-shaped semiconductors 1121 and the p-type semiconductor layer 1123 so as to have a thickness of 10 nm, for instance. That is because the active layer is provided for increasing the probability of recombination by confining carriers of both polarities (holes and electrons) in a narrow region.

Though the transparent electrode layer 1124 is formed on the p-type semiconductor layer 1123, this is not essential. It is, however, preferable to provide the transparent electrode layer 1124, and existence of the transparent electrode layer 1124 prevents occurrence of voltage drop in the p-type semiconductor layer 1123 while the transparent electrode layer 1124 allows penetration of light radiated from the active layer 1122. Therefore, the plate-shaped semiconductors 1121 can be made to uniformly emit light from all the parts thereof.

In a configuration in which the transparent electrode layer 1124 is formed on the p-type semiconductor layer 1123, it is preferable that not entire gaps among the plurality of n-type plate-shaped semiconductors 1121 should be filled with the transparent electrode layer 1124. That is, it is preferable that the transparent electrode layer 1124 of a small thickness should be formed on the p-type semiconductor layer 1123 and that resultant facing gaps which are left among the plurality of n-type plate-shaped semiconductors 1121 and across which parts of the transparent electrode layer 1124 face with each other should be filled with the transparent member 1131 made of a material having higher transparency than the transparent electrode layer 1124. That is because the transparent electrode layer 1124 in which carriers for passage of currents exist is, in general, poor in transparency. Therefore, the gaps among the plurality of n-type plate-shaped semiconductors 1121 are filled with the transparent member 1131 made of a silicon oxide film, transparent resin or the like, so that the light emission efficiency of the light-emitting element can be improved.

Though the active layer 1122, the e p-type semiconductor layer 1123, and the transparent electrode layer 1124 covers entire surfaces of the n-type plate-shaped semiconductors 1121 and the n-type semiconductor layer 1113 in the light-emitting element 1100 of the embodiment, the layers 1122, 1123 and 1124 do not have to cover the entire surfaces. That is, the active layer 1122, the p-type semiconductor layer 1123, and the transparent electrode layer 1124 have only to cover at least the n-type plate-shaped semiconductors 1121. That is because the amount of emitted light per unit area of the substrate 1111 can be increased by the covering of the n-type plate-shaped semiconductors 1121 with the active layer 1122, the p-type semiconductor layer 1123, and the transparent electrode layer 1124.

Next, a production method for the light-emitting element 1100 of the second embodiment will be described with reference to FIG. 7C. The production method for the light-emitting element 1100 of the second embodiment is almost the same as the production method for the light-emitting element 100 that has been described with reference to FIGS. 2 through 6 for the first embodiment. The production method for the light-emitting element 1100 of the second embodiment is different from the production method for the light-emitting element 1100 only in that a photoresist 1151 on the semiconductor layer 1112 composed of n-type GaN is patterned into an oblong, or rectangular shape by a photolithography process as shown in FIG. 7C instead of performing the step described with reference to FIG. 3A for the first embodiment.

The p-type semiconductor layer 1123 is formed by the production method of the second embodiment so as to cover the plate-shaped semiconductors 1121 composed of n-type GaN, and thus almost entire side surfaces of the plate-shaped semiconductors 1121 emit light. Therefore, the amount of emitted light per unit area of the substrate 1111 can be increased as compared with light-emitting diode chips having planar light-emitting layers. In the production method, the plate-shaped semiconductors 1121 are composed of n-type semiconductors, and the resistance thereof can easily be decreased by the increase in the amount of impurity that imparts the property of n-type. Therefore, the plate-shaped semiconductors 1121 can be made to uniformly emit light from the parts of each ranging from the base part to the extremity part even though the length L of the plate-shaped semiconductors 1121 is increased. Thus the amount of emitted light per unit area of the substrate 1111 can further be increased. In the production method in which the plate-shaped semiconductors 1121 are formed by the photolithography process and the anisotropic etching, the plate-shaped semiconductors 1121 having a satisfactory shape as planned can be obtained and yield therefor can be improved.

In the production method, the active layer 1122 composed of InGaN is formed so as to cover the surfaces of the plate-shaped semiconductors 1121 composed of n-type GaN, between the semiconductor core formation step and the semiconductor shell formation step. Thus the light emission efficiency can be increased. The active layer 1122 does not have to be formed.

In the production method, the transparent electrode layer 1124 is formed so as to cover the p-type GaN semiconductor layer 1123 after the semiconductor shell formation step. The transparent electrode layer 1124 prevents occurrence of voltage drop in the p-type GaN semiconductor layer 1123 while allowing penetration of light radiated from the active layer 1122. Therefore, the plate-shaped semiconductors 1121 can be made to uniformly emit light from all the parts thereof.

In the production method, the transparent electrode layer 1124 is formed on the p-type GaN semiconductor layer 1123. At this time, not entire gaps among the plurality of n-type plate-shaped semiconductors 1121 are filled with the transparent electrode layer 1124, but the transparent electrode layer 1124 is formed with the small thickness on the p-type GaN semiconductor layer 1123, and the remaining gaps (facing gaps across each of which parts of the transparent electrode layer 1124 face each other) are filled with the transparent member 1131. That is because a transparent electrode is, in general, poor in transparency due to carriers included therein for passage of currents. Therefore, the gaps defined between the first conductivity type plate-shaped semiconductors 1121 are filled with a silicon oxide film, transparent resin or the like, and thus the light emission efficiency of the light-emitting element can be improved.

Though the rod-shaped semiconductors 121 and the plate-shaped semiconductors 1121 are used in the first embodiment described formerly and the second embodiment, the shape of the semiconductors is not limited thereto. It is essentially important that the first conductivity type protrusion-shaped semiconductors are formed on the first conductivity type semiconductor layer which forms the semiconductor base and that the first conductivity type protrusion-shaped semiconductors are covered with the second conductivity type semiconductor layer. Therefore, alternatively, the first conductivity type protrusion-shaped semiconductors may be in shape of curved plates or in shape of rings (tubes) that result from closure of plate-like semiconductors, without limitation to the shapes of rods and plates. As for the protrusion-shaped semiconductors of the invention, plate-shaped semiconductors arrayed in two directions may be connected together at intersections thereof so as to form one latticed protrusion-shaped semiconductor. Alternatively, the protrusion-shaped semiconductors may be in shape of columns, elliptic columns, polygonal columns, cones, pyramids, hemispheres, spheres or the like.

Third Embodiment

Next, a production method for light-emitting elements and a light-emitting device as a third embodiment of the invention will be described with reference to FIGS. 8 through 17. FIGS. 8 through 17 are diagrams showing steps of forming the light-emitting elements and the light-emitting device in the third embodiment.

Process steps in former half of the production method of the third embodiment are the same as the steps for production of the first embodiment that have been described with reference to FIGS. 2 through 5. Therefore, duplicate description on the steps for production of FIGS. 2 through 5 for the first embodiment is omitted here and steps subsequent to the steps of FIGS. 2 through 5 will be described. Alternatively, in the steps in the former half in the production method of the third embodiment, the step described with reference to FIG. 3A in the first embodiment may be replaced by the step described with reference to FIG. 7C for the second embodiment, so that the first conductivity type protrusion-shaped semiconductors may be the plate-shaped semiconductors.

Figure 8:
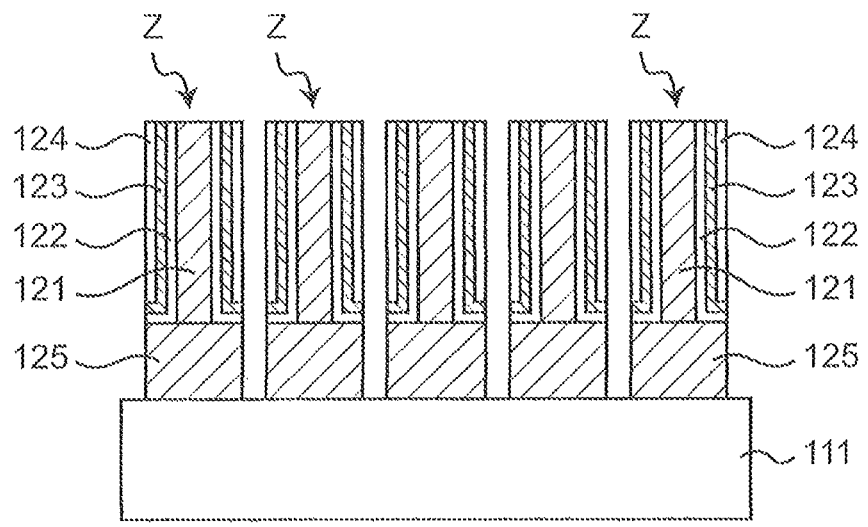
FIG. 8 is a diagram for illustrating a production method for light-emitting elements and a light-emitting device of a third embodiment of the invention.

By the step described above with reference to FIG. 5, the active layer 122 composed of InGaN, the second conductivity type semiconductor layer 123 composed of p-type GaN, and the transparent electrode layer 124 composed of ITO are deposited, in order of mention, on the surfaces of the n-type GaN rod-shaped semiconductors 121. After that, anisotropic dry etching is performed. By the anisotropic dry etching, as shown in FIG. 8, portions are removed from each of the transparent electrode layer 124 composed of ITO, the second conductivity type semiconductor layer 123 composed of p-type GaN, the active layer 122 composed of InGaN, the first conductivity type rod-shaped semiconductors 121 composed of GaN, and the first conductivity type semiconductor layer 113 composed of n-type GaN, as a result of which portions of the substrate 111 composed of silicon are exposed. Thus the InGaN active layer 122, the p-type GaN semiconductor layer 123, and the ITO transparent electrode layer 124 are left behind on side walls of the remaining rod-shaped semiconductors 121 composed of n-type GaN. The semiconductor layer 113 composed of n-type GaN results in a plurality of n-type GaN semiconductor layers 125 spaced apart from one another on the silicon substrate 111. In this state, one n-type GaN rod-shaped semiconductor 121 stands on each of the n-type GaN semiconductor layers 125, and a plurality of parts Z each composed of the n-type GaN semiconductor layer 125, the n-type GaN rod-shaped semiconductor 121, the InGaN active layer 122, the p-type GaN semiconductor layer 123, and the ITO transparent electrode layer 124 stand on the silicon substrate 111 so as to be spaced apart from one another.

Figure 9:
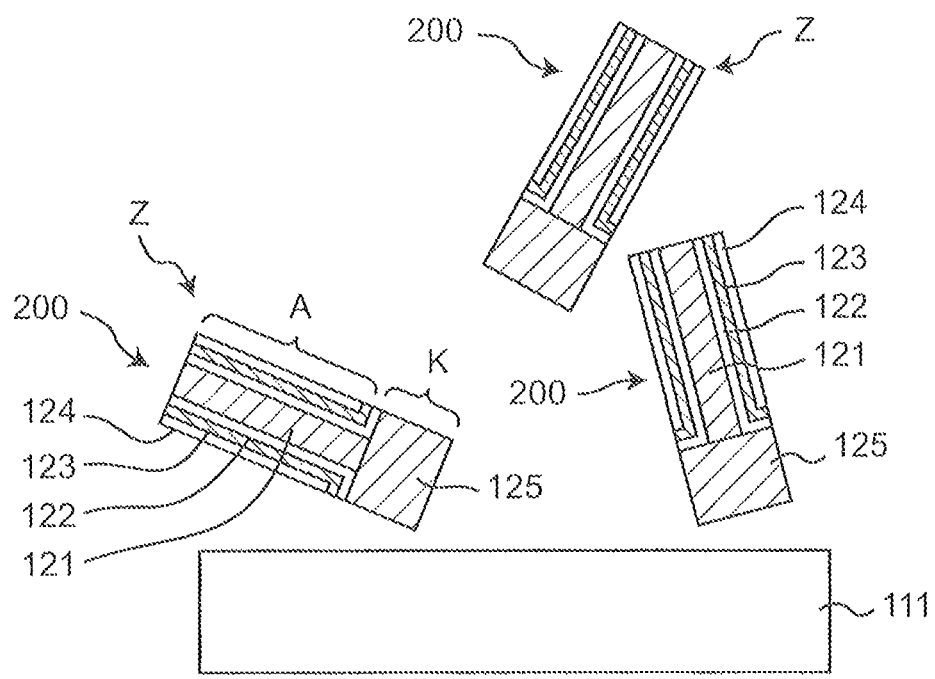
FIG. 9 is a diagram for illustrating the production method of the third embodiment.

Next, as shown in FIG. 9, the plurality of parts Z protruding on a surface of the silicon substrate 111 are cut off from the silicon substrate 111 (light-emitting element cut-off step). At this point, the n-type GaN semiconductor layer 112 forming a portion of the first substrate 110 in FIG. 2 mentioned above is entirely used for formation of upper structure (the n-type GaN rod-shaped semiconductors 121, the n-type GaN semiconductor layers 125). Accordingly, the silicon substrate 111 is synonymous with the first substrate 110.

As shown in FIG. 9, the cut-off parts Z form respective light-emitting elements 200. On a side of each light-emitting element 200 that was in contact with the silicon substrate 111, the n-type GaN semiconductor layer 125 is exposed. On a side thereof that was remote from the silicon substrate 111, the transparent electrode layer 124 composed of ITO that is in electrical contact with the p-type GaN semiconductor layer 123 is exposed. The n-type GaN semiconductor layer 125 forms a cathode electrode K, and the transparent electrode layer 124 forms an anode electrode A. In the cut-off step, the rod-shaped parts Z are cut off from the silicon substrate 111 by vibration of the rod-shaped parts Z induced by emission of ultrasonic waves in a solution, for instance. On condition that the first conductivity type protrusion-shaped semiconductors are the plate-shaped semiconductors, the light-emitting elements cut off in this manner are also in shape of plates. Steps that will be described below, however, are common to the plate-shaped light-emitting elements also, and the following description will be given on premise that the light-emitting elements are in shape of rods.

The production method of the third embodiment includes the step of patterning the mask layer, with use of the photoresist 151, on the surface of the n-type semiconductor layer 112 forming a portion of the first substrate 110, the semiconductor core formation step of forming the plurality of n-type rod-shaped semiconductors 121 by the anisotropic etching of the n-type semiconductor layer 112 with use of the mask layer as the mask, and the semiconductor shell formation step of forming the p-type GaN semiconductor layer 123 so as to cover the surfaces of the n-type rod-shaped semiconductors 121, which steps have been described with reference to FIGS. 2 through 5 above. The whole of the first substrate 110 may be composed of the n-type semiconductor layer 112.

In addition to those, the production method of the third embodiment includes the light-emitting element cut-off step of cutting off the n-type rod-shaped semiconductors 121 covered with the p-type semiconductor layer 123 from the first substrate 110, which step has been described with reference to FIGS. 8 and 9. By those steps, each of the rod-shaped light-emitting elements 200 formed by processing of the n-type GaN semiconductor layer 112 eventually forms an independent light-emitting element.

Therefore, diversification of usage of the light-emitting elements and improvement in utility value thereof can be attained in that each light-emitting element 200 can separately and freely be used. For instance, a desired number of cut-off light-emitting elements 200 can be arranged with a desired density. In this process, a surface emitting device can be configured by rearrangement of a large number of minute light-emitting elements 200 on a large-area substrate as an example. Besides, high reliability and long life can be attained by reduction in density of heat generation. The p-type semiconductor layer 123 is formed by the production method so as to cover the n-type rod-shaped semiconductors 121, and thus almost entire side surfaces of the rod-shaped semiconductors 121 emit light. Thus a large number of light-emitting elements 200 with a large total amount of emitted light can be obtained from the substrate 111 (first substrate 110) having a small area. In the production method, the rod-shaped semiconductors 121 are composed of n-type semiconductors, and the resistance thereof can easily be decreased by increase in the amount of impurity that imparts the property of n-type.

Therefore, the rod-shaped semiconductors 121 can be made to uniformly emit light from parts thereof ranging from the base part to the extremity part even though the length L of the rod-shaped semiconductors 121 is increased. In the production method, the rod-shaped semiconductors 121 are formed by the photolithography process and the anisotropic etching, and thus the rod-shaped semiconductors 121 having a satisfactory desired shape as planned and the resultant light-emitting elements 200 having a satisfactory desired shape can be obtained. Accordingly, yield of the light-emitting elements 200 can be improved.

In the production method, the active layer 122 is formed so as to cover the surfaces of the n-type rod-shaped semiconductors 121 between the semiconductor core formation step and the semiconductor shell formation step. Thus the light emission efficiency can be increased. The active layer 122 does not have to be formed.

In the production method, the transparent electrode layer 124 is formed so as to cover the p-type semiconductor layer 123 after the semiconductor shell formation step. The transparent electrode layer 124 prevents occurrence of voltage drop in the p-type semiconductor layer 123 while allowing penetration therethrough of light radiated from the active layer 122. Therefore, the rod-shaped semiconductors 121 can be made to uniformly emit light from all the parts thereof.

Next, with sequential reference to FIGS. 10 to 17, a step of placing the light-emitting elements 200 cut off from the silicon substrate 111 (first substrate 110) on a second substrate 210 and providing interconnections therefor will be described.

Figure 10:
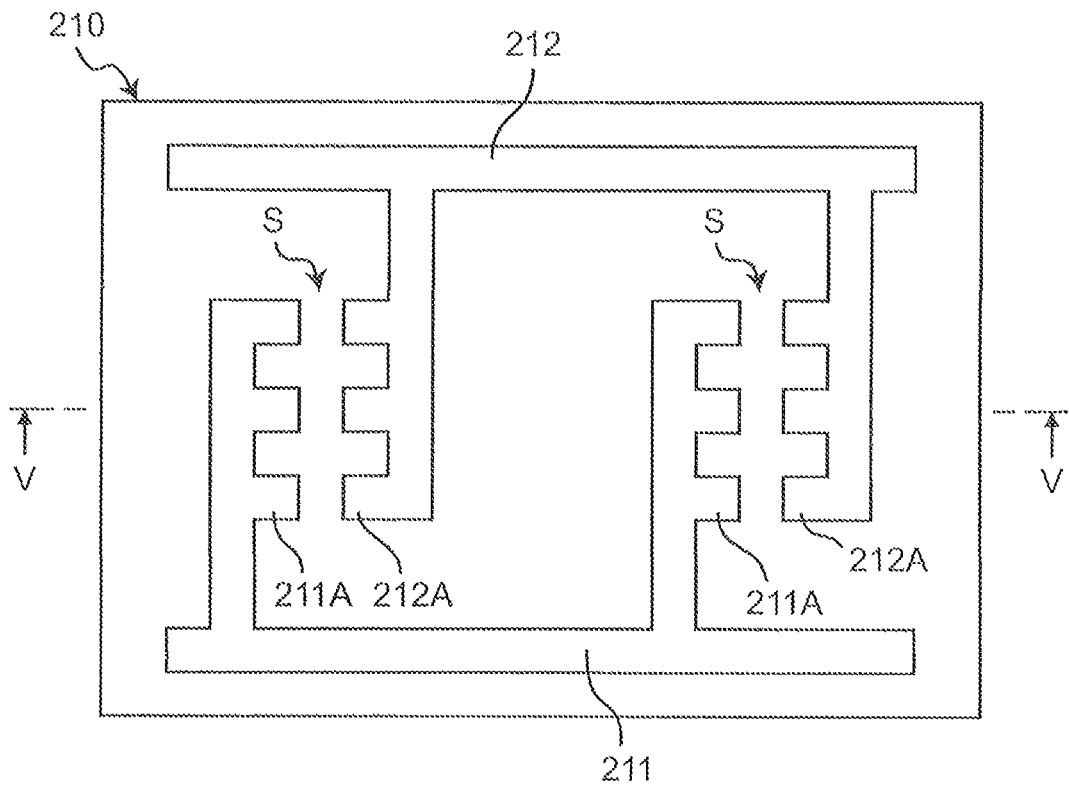
FIG. 10 is a diagram for illustrating the production method of the third embodiment.

Initially, a second substrate 210 which is formed with a first electrode 211 and a second electrode 212 on a surface thereof as shown in FIG. 10 is prepared. The second substrate 210 is an insulated substrate and the first and second electrodes 211 and 212 are metal electrodes. Metal electrodes in desired shapes can be formed as the first and second electrodes 211 and 212 on the surface of the second substrate 210 with use of a printing technique, for example. The first and second electrodes 211, 212 can also be formed by uniform deposition of a metal film and a photosensitive film on the surface of the second substrate 210, followed by exposure and development of the photosensitive film into desired electrode patterns, and etching of the metal film with the patterned photosensitive film used as a mask.

Gold, silver, copper, tungsten, aluminum, tantalum, alloys thereof or the like can be used as metal material from which the first and second electrodes 211, 212 are produced. The second substrate 210 is a substrate of which a top surface has insulation property, and in which a silicon oxide film is formed on a surface of an insulator such as glass, ceramic, alumina, or resin or on a surface of a semiconductor such as silicon. On condition that a glass substrate is used as the second substrate 210, it is desirable to form an insulating film such as silicon oxide film and silicon nitride film on a surface thereof.

Surfaces of the first and second electrodes 211, 212 may be covered with an insulating film not shown. This configuration produces following effects. In the subsequent fine object arrangement step, a voltage is applied across the first electrode 211 and the second electrode 212 in a state in which liquid is introduced onto the second substrate 210. At this time, advantageously, flow of a current between the electrodes is prevented. Such a current might cause a voltage drop in the electrodes and the resultant failure of the arrangement of the light-emitting elements or might cause dissolution of the electrodes due to an electrochemical effect. A silicon oxide film, silicon nitride film or the like can be used, for instance, as the insulating film that cover the first and second electrodes 211, 212. On the other hand, a configuration in which the first and second electrodes are not covered with such an insulating film would facilitate electric connection between the first, second electrodes 211, 212 and the light-emitting elements 200 and thus facilitate use of the first and second electrodes 211, 212 as interconnections.

Sites where the light-emitting elements 200 are to be placed are defined by sites S where a facing part 211A of the first electrode 211 and a facing part 212A of the second electrode 212 face each other. Namely, in a light-emitting element arrangement step that will be described later, the light-emitting elements 200 are arranged in the sites S where the first and second electrodes 211 and 212 face each other, so as to bridge a gap between the first and second electrodes 211 and 212. For this reason, it is preferable that a distance between the first and second electrodes 211 and 212 in the sites S where the facing parts 211A and 212A of the first and second electrodes 211 and 212 face each other should be slightly smaller than the length of the light-emitting elements 200. On condition that the light-emitting elements 200 are in shape of a strip and have the length of 20 μm, for instance, the distance between the facing parts 211A of the first electrode 211 and the facing parts 212A of the second electrode 212 is preferably between 12 μm and 18 μm. That is, the distance is preferably on the order of 60 to 90% of the length of the light-emitting elements 200 and more preferably on the order of 80 to 90% of the length.

Figure 11:
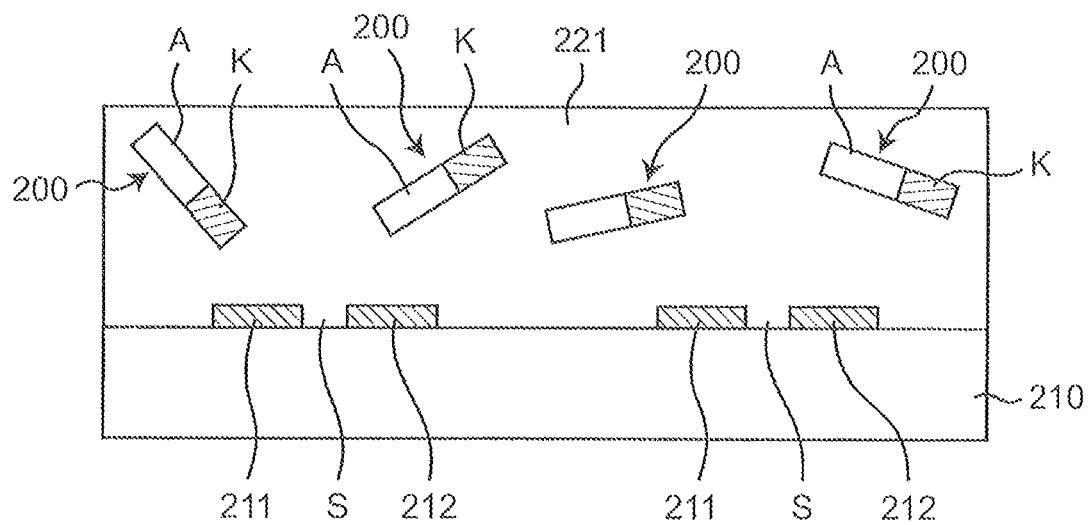
FIG. 11 is a diagram for illustrating the production method of the third embodiment.

Next, as shown in FIG. 11, a fluid 221 including a plurality of light-emitting elements 200 is introduced onto the second substrate 210. The plurality of light-emitting elements 200 are dispersed in the fluid 221. FIG. 11 shows a section of the second substrate 210, taken along line V-V of FIG. 10.

Liquid such as IPA (isopropyl alcohol), ethanol, methanol, ethylene glycol, propylene glycol, acetone, and water or mixture thereof can be used as the fluid 221, whereas the fluid 221 is not limited thereto. Preferable properties the fluid 221 should have are low viscosity such that the arrangement of the light-emitting elements is not hindered, an ion concentration that is not remarkably high, and volatility such that the substrate can be dried after the arrangement of the light-emitting elements is performed. Use of the liquid having a remarkably high ion concentration prevents an electric field from permeating the liquid, because of prompt formation of electric double layers on the electrodes, when a voltage is applied across the first and second electrodes 211, 212, and consequently inhibits the arrangement of the light-emitting elements.

Though not shown, a cover is preferably provided over the second substrate 210 so as to face the second substrate 210. The cover is provided so as to parallel the second substrate 210 and a uniform clearance (e.g., 500 μm) is provided between the second substrate 210 and the cover. The clearance is filled with the fluid 221 including the light-emitting elements 200. This makes it possible to make the fluid flow through a channel made of the clearance at uniform velocity and to uniformly distribute the plurality of light-emitting elements 200 on the second substrate 210 in the fine object arrangement step that will be described next. This also prevents the fluid 221 from evaporating of the fluid, causing convection in the fluid, and disturbing the arrangement of the light-emitting elements 200 in the subsequent fine object arrangement step.

Figure 12:
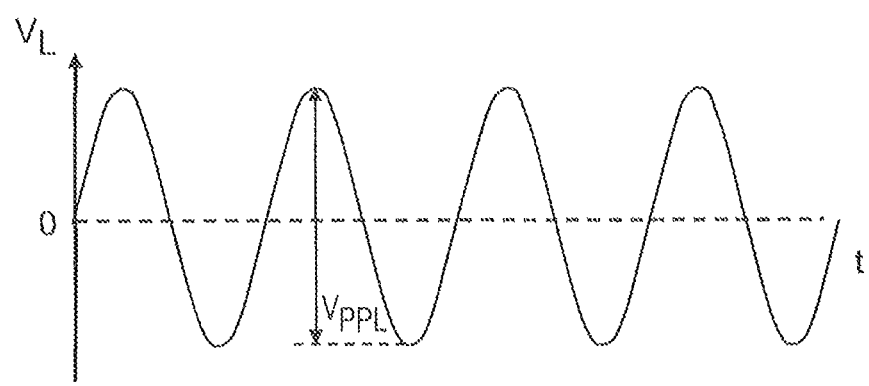
FIG. 12 are waveform charts showing waveforms of voltages that are applied across electrodes in the production method of the third embodiment.
Figure 12:
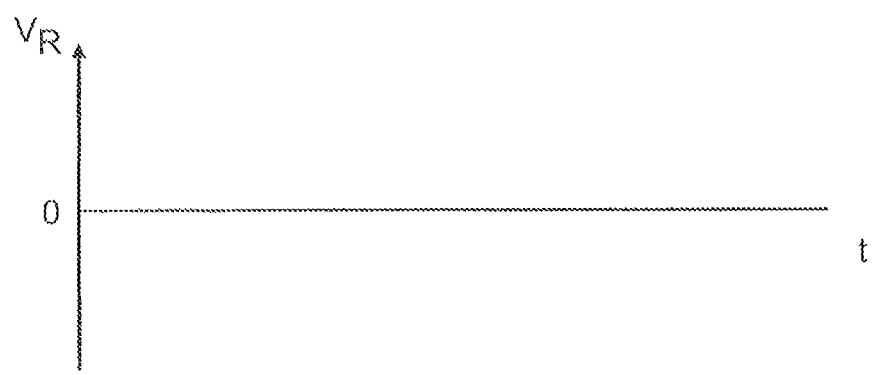

Subsequently, voltages having such wave forms as shown in FIG. 12 are applied to the first electrode 211 and the second electrode 212, and the light-emitting elements 200 are consequently arranged in specified positions on the second substrate 210 as shown in a plan view of FIG. 13 and a sectional view of FIG. 14 (light-emitting element arrangement step). FIG. 14 shows a section taken along line V-V in FIG. 13.

A principle by which the light-emitting elements 200 are arranged in the specified positions on the second substrate 210 can be described as follows. Such an AC voltage as shown in FIG. 12 is applied across the first electrode 211 and the second electrode 212. A reference potential $V_R$ shown in FIG. 12 is applied to the second electrode 212 and the AC voltage with amplitude of VPPL/2 are applied to the first electrode 211. Upon application of a voltage between the first electrode 211 and the second electrode 212, an electric field is produced in the fluid 221. By the electric field, polarization occurs or electric charges are induced in the light-emitting elements 200, and electric charges are induced on surfaces of the light-emitting elements 200. Through agency of the induced electric charges, attractive forces act between the first and second electrodes 211, 212 and the light-emitting elements 200. Actually, existence of electric field gradient around objects is required for occurrence of dielectrophoresis, and dielectrophoresis does not act on objects existing in parallel flat plates that are indefinitely large. In such electrodes arrangement as shown in FIG. 11, however, dielectrophoresis occurs because the closer to the electrodes, the stronger the electric field.

Figure 13:
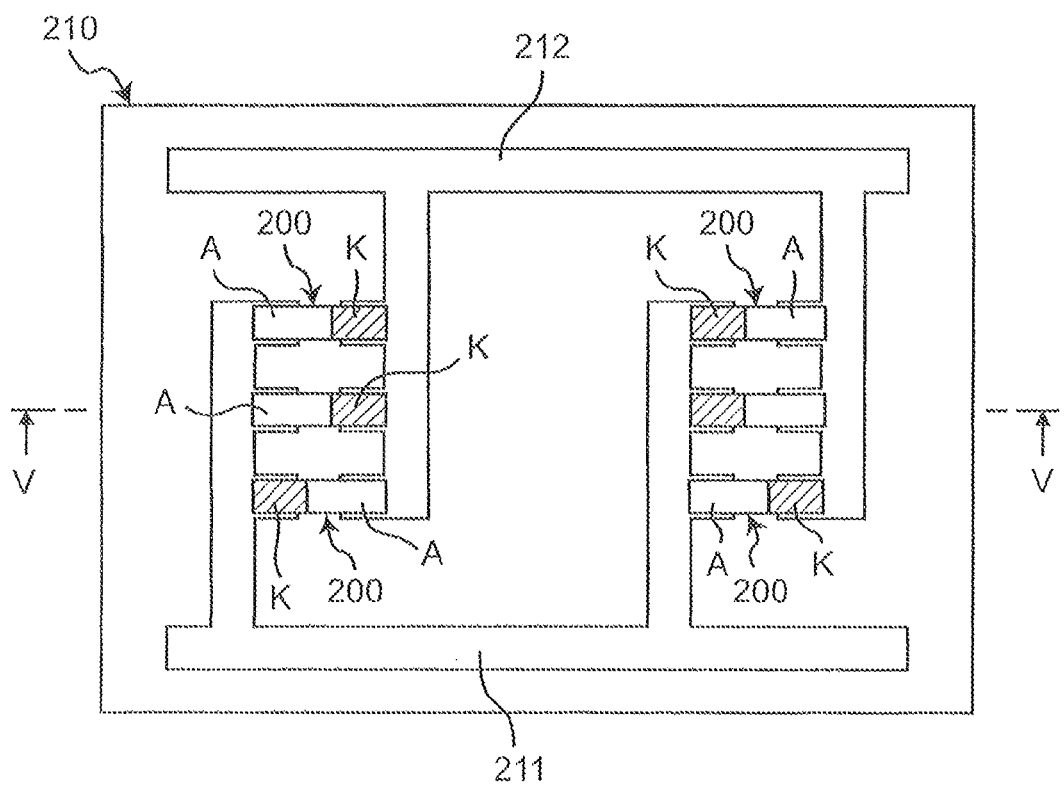
FIG. 13 is a diagram for illustrating the production method of the third embodiment.
Figure 14:
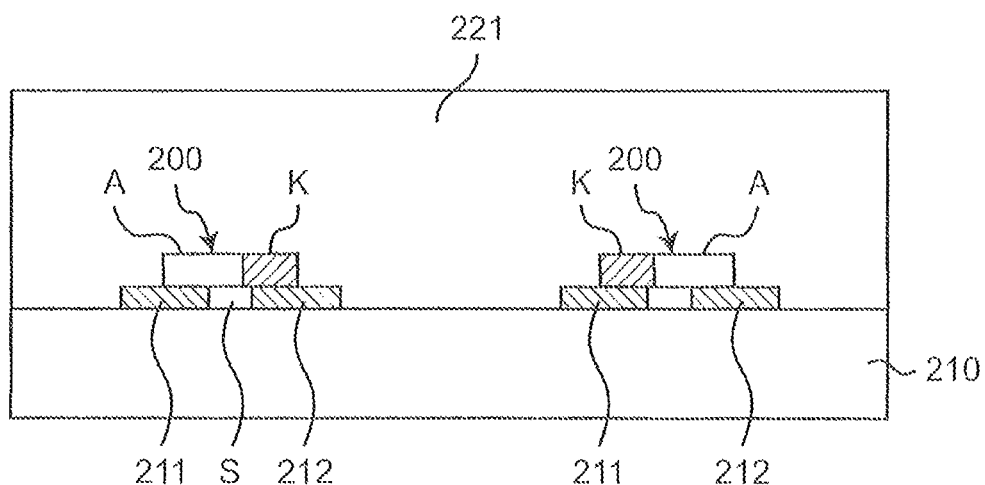
FIG. 14 is a diagram for illustrating the production method of the third embodiment.

It is to be noted that orientations (polarities) of the light-emitting elements 200 become random as shown in FIG. 13, providing the light-emitting element arrangement step is performed under the method. Herein, the orientation (polarity) of the light-emitting element 200 signifies either an orientation in which the anode A of the light-emitting element 200 resides at the right of the cathode K or an orientation in which the anode A of the light-emitting element 200 resides at the left of the cathode K, in FIG. 13. A method of suitably operating the light-emitting device in which the orientations of the plurality of light-emitting elements 200 are arranged at random in this manner will be described later.

Frequency of the AC voltage applied to the first electrode 211 with use of IPA as the fluid 221 is preferably set between 10 Hz and 1 MHz and is more preferably set between 50 Hz and 1 kHz because the arrangement is thereby made most stable. AC voltages applicable across the first electrode 211 and the second electrode 212 are not limited to those with sine waves and have only to change periodically as in rectangular waves, triangular waves, sawtooth waves and the like. VPPL which is a double of the amplitude of the AC voltage applied to the first electrode 211 can be set between 0.1V and 10V, because the value of smaller than 0.1V deteriorates the arrangement of the light-emitting elements 200, and the value of larger than 10V deteriorates the yield of the arrangement due to immediate adherence of the light-emitting elements 200 onto the substrate 110. Therefore, the value of VPPL is preferably set between 1V and 5V and is more preferably on the order of 1V.

Figure 15:
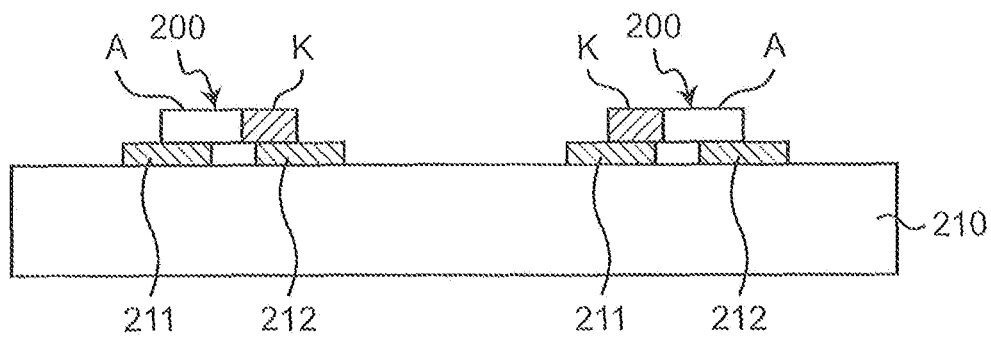
FIG. 15 is a diagram for illustrating the production method of the third embodiment.

After completion of the arrangement of the light-emitting elements 200 on the second substrate 210, as shown in FIG. 15, evaporation of liquid in the fluid 221 and drying are carried out by heating of the second substrate 210 while the AC voltage is still applied across the first electrode 211 and the second electrode 212 so that the light-emitting elements 200 are made to adhere onto the second substrate 210. Alternatively, the light-emitting elements 200 are made to adhere onto the second substrate 210 by application of a sufficiently high voltage (10 to 100 V) across the first electrode 211 and the second electrode 212 after the completion of the arrangement of the light-emitting elements 200 on the second substrate 210, then the application of the high voltage is halted, and the second substrate 210 is thereafter dried.

Figure 16:
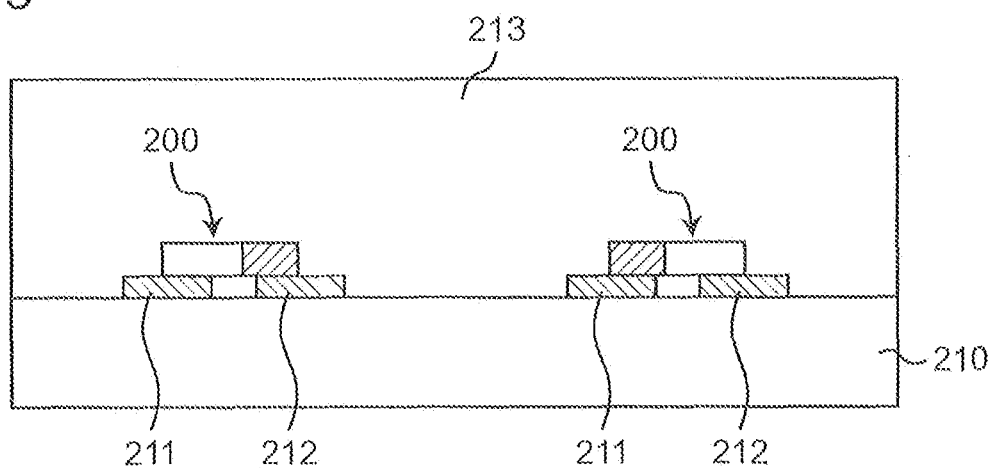
FIG. 16 is a diagram for illustrating the production method of the third embodiment.

Thereafter, as shown in FIG. 16, an interlayer insulating film 213 composed of a silicon oxide film is deposited on the overall surface of the second substrate.

Figure 17:
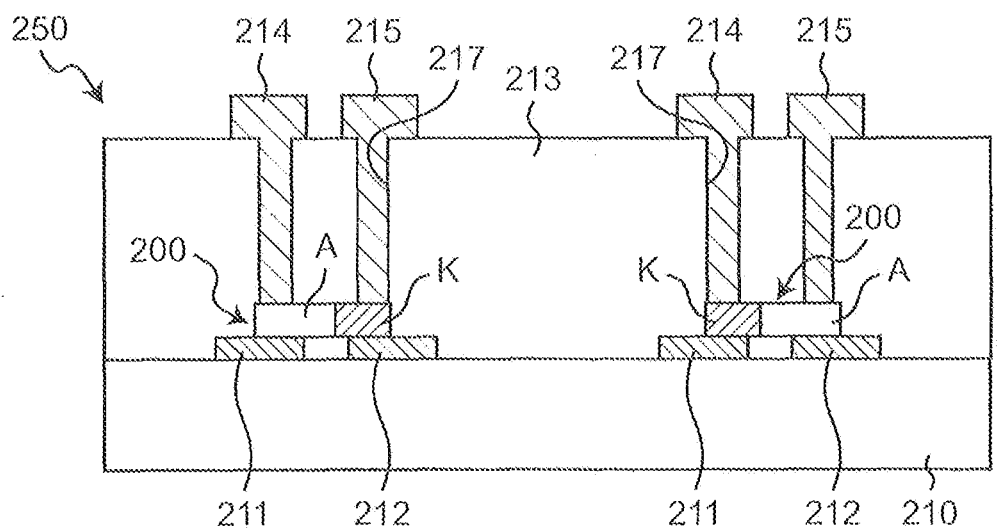
FIG. 17 is a diagram for illustrating the production method of the third embodiment.

Thereafter, as shown in FIG. 17, contact holes 217 are formed through the interlayer insulating film 213 by a conventional photolithography step and a dry etching step, and metal interconnections 214, 215 are formed by patterning of metal with a metal deposition step, a photolithography step and an etching step (light-emitting element interconnection step). Thus the anodes A and the cathodes K of the light-emitting elements 200 can respectively be interconnected. As a result, the light-emitting device 250 is finished.

As described above, the production method of the third embodiment includes the step of patterning the mask layer, with use of the photoresist 151, on the surface of the n-type semiconductor layer 112 forming a portion or the whole of the first substrate 110, the semiconductor core formation step of forming the plurality of n-type rod-shaped semiconductors 121 by the anisotropic etching of the n-type semiconductor layer 112 with use of the mask layer as the mask, and the semiconductor shell formation step of forming the p-type semiconductor layer 123 so that the layer 123 covers the surfaces of the n-type rod-shaped semiconductors 121, which steps have been described with reference to FIGS. 2 through 5 above. The production method of the third embodiment further includes the light-emitting element cut-off step of cutting off the n-type rod-shaped semiconductors 121, covered with the p-type semiconductor layer 123, from the first substrate 110 which step has been described with reference to FIGS. 8 and 9. In addition to those, the production method includes the light-emitting element arrangement step of arranging the n-type rod-shaped semiconductors 121, cut off from the silicon substrate 111 of the first substrate 110 and covered with the p-type semiconductor layer 123, on the second substrate 210, and the light-emitting element interconnection step of providing the interconnections 214, 215 for energizing the n-type rod-shaped semiconductors 121 arranged on the second substrate 210 and covered with the p-type semiconductor layer 123.

By such steps for production, a desired number of cut-off light-emitting elements 200 described above can be arranged at a desired density on the second substrate 210. Therefore, a surface emitting device can be configured by the rearrangement of a large number of minute light-emitting elements 200 on the large-area second substrate 210 as an example. Besides, the high reliability and long life can be attained by the reduction in the heat density.

Providing that the light-emitting element arrangement step is performed, as described above, the orientations (that is, whether the anode A is positioned at the right of the cathode K or at the left of the cathode K, in FIG. 13) of the light-emitting elements 200 become random as shown in FIG. 13. As a matter of course, a DC voltage may be applied across the two metal interconnections 214, 215 in such a state. In this case, however, reverse voltage is applied to about half of the light-emitting elements 200 and thus no light is emitted therefrom. Accordingly, an AC voltage is preferably applied across the two metal interconnections 214, 215. This makes it possible for all the light-emitting elements 200 to emit light.

Fourth Embodiment

With reference to FIGS. 18 through 21, subsequently, an illumination device having the light-emitting device formed with use of the production method for the light-emitting device of the invention as the third embodiment of the invention will be described.

Figure 18:
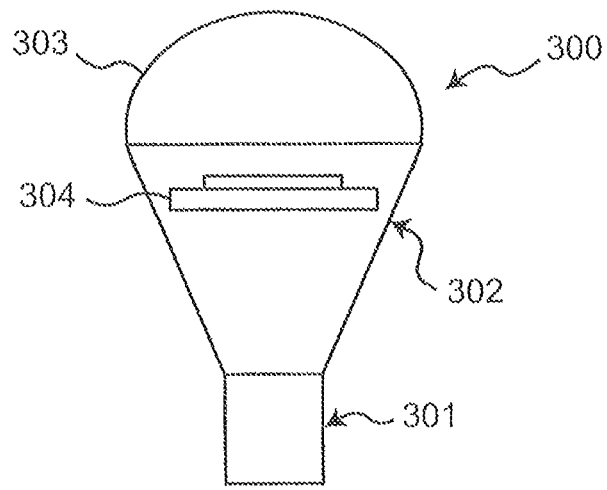
FIG. 18 is a side view of an illumination device as a fourth embodiment of the invention.

FIG. 18 is a side view of an LED bulb 300 that is the illumination device of fourth embodiment. The LED bulb 300 includes a base 301 as a power connection part that is to be connected to a commercial power supply by being fitted in an external socket, a conical radiator part 302 having one end connected to the base 301 and the other end gradually increasing in diameter, and a translucent part 303 covering the other end side of the radiator part 302. A light-emitting part 304 is placed in the radiator part 302.

Figure 19:
FIG. 19 is a side view of a light-emitting part of the illumination device.
Figure 20:
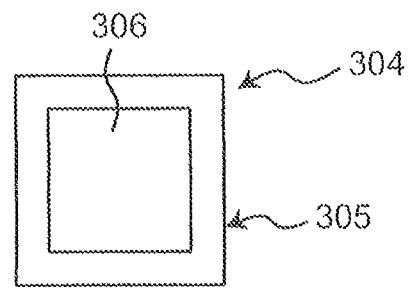
FIG. 20 is a top plan view of the light-emitting part of the illumination device.
Figure 21:
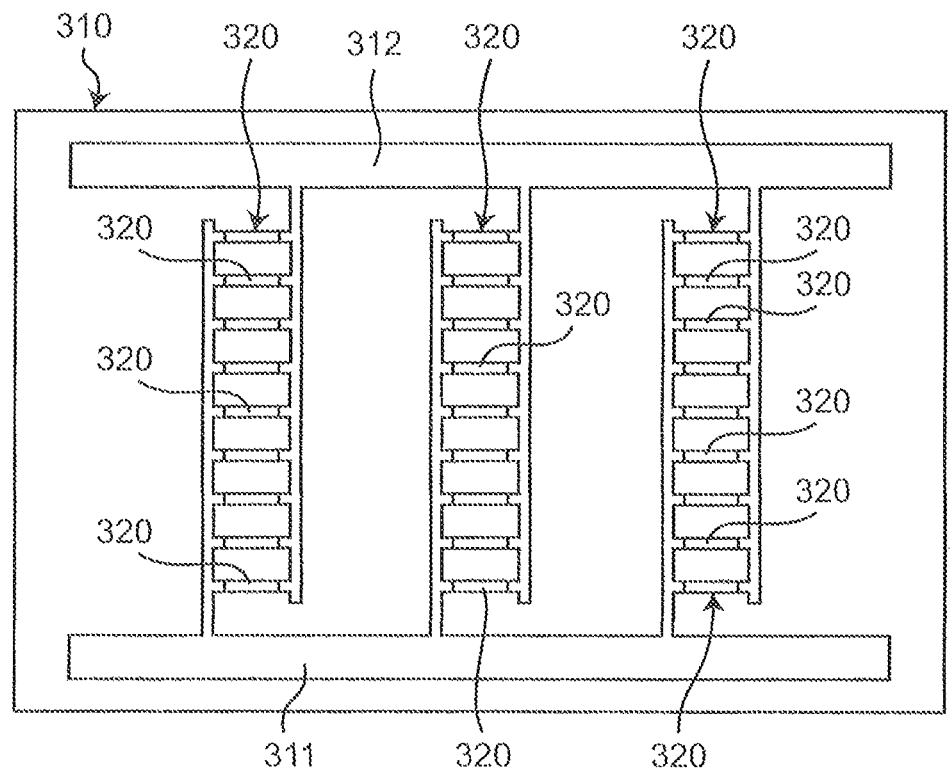
FIG. 21 is a plan view of a light-emitting device at the light-emitting part.

In the light-emitting part 304, as shown in a side view of FIG. 19 and a top plan view of FIG. 20, a light-emitting device 306 on which a large number of light-emitting elements are placed is mounted on a square radiator plate 305. As shown in FIG. 21, the light-emitting device 306 is composed of a substrate 310, a first electrode 311 and a second electrode 312 that are formed on the substrate 310, and the large number of light-emitting elements 320. The methods described for the third embodiment are preferably used as a method of arranging the minute light-emitting elements (light-emitting diodes) 320 on the substrate 310 and a method of providing interconnections therefor. That is, the light-emitting device 306 is produced by the methods described for the third embodiment.

Though twenty-seven light-emitting elements 320 are depicted in FIG. 21, a larger number of light-emitting elements can be arranged. On condition that one light-emitting element 320 has length of 20 μm and diameter of 1 μm as exemplified for the second embodiment and provides luminous flux of 5 millilumens, for instance, a light-emitting substrate that provides total luminous flux of 250 lumens can be provided by arrangement of 50,000 light-emitting elements 320 on the substrate 310.

With use of the light-emitting device 306 in which the large number of light-emitting elements 320 are arranged on the substrate 310, in this manner, following effects can be obtained as compared with light-emitting devices in which one light-emitting element or several light-emitting elements are arranged. Initially, the heat density caused by light emission can be made law and uniform because the light-emitting elements 320 each have a small light-emitting area and are dispersed on the substrate 310. By contrast, conventional light-emitting elements (light-emitting diodes) have large light-emitting areas (that may amount to 1 mm$^2$) and thus have large densities of heat generation caused by light emission. As a result, light-emitting layers thereof having increased temperatures exert influence on light emission efficiency, reliability and the like. The light emission efficiency and reliability can be improved by the arrangement of a large number of minute light-emitting elements 320 on the substrate 310 of the light-emitting device 306 as in the third embodiment.

Fifth Embodiment

Figure 22:
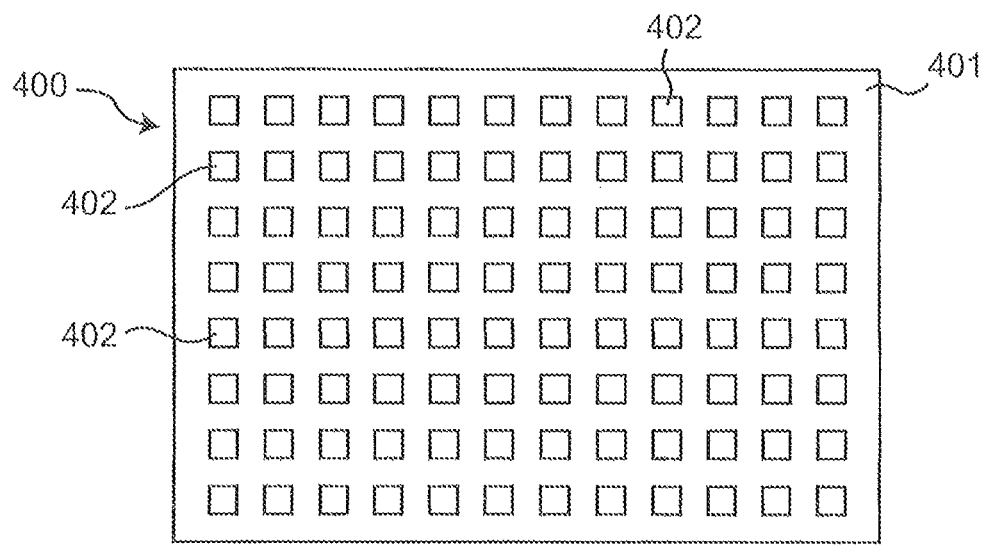
FIG. 22 is a plan view showing a backlight as a fifth embodiment of the invention.

FIG. 22 is a *(plan view showing a backlight as a fifth embodiment of the invention)*. This fifth embodiment includes a light-emitting device produced by a light-emitting device production method of the invention as described in the foregoing third embodiment.

As shown in FIG. 22, a backlight 400 of this fifth embodiment includes a plurality of light-emitting devices 402 which are mounted so as to be spaced from one another with a specified interval on a rectangular-shaped support substrate 401 as an example of the heat sink. In this case, each light-emitting device 402 is a light-emitting device produced by using the light-emitting device production method of the foregoing second embodiment. The light-emitting device 402 has 100 or more light-emitting elements arranged on a substrate (not shown).

According to the backlight having the above construction, use of the light-emitting devices 402 makes it possible to realize a backlight which is less variations in brightness and which can fulfill longer life and higher efficiency. Also, the mounting of the light-emitting devices 402 on the support substrate 401 allows the heat-releasing effect to be further enhanced.

Sixth Embodiment

Next, an LED display as a sixth embodiment of the invention will be described with reference to FIG. 23. The sixth embodiment relates to a display device produced by using a method similar to the light-emitting device production method of the invention.

Figure 23:
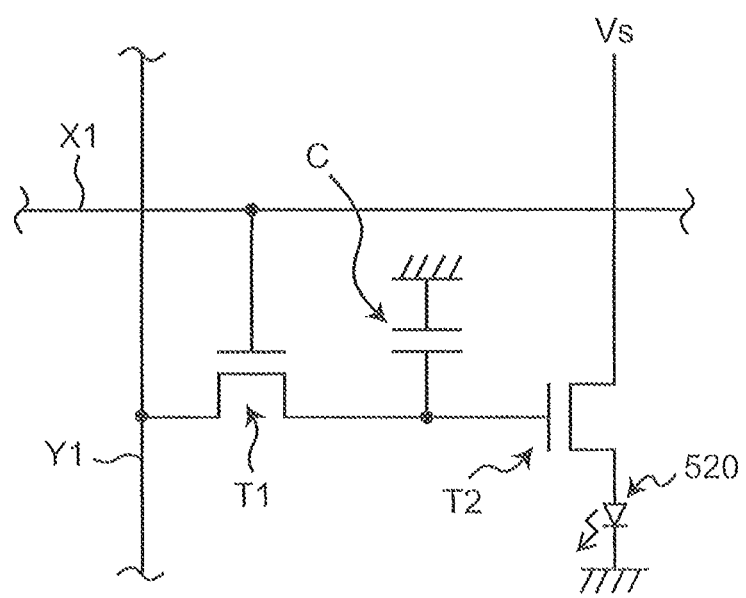
FIG. 23 is a circuit diagram showing a circuit in one pixel of an LED display as a sixth embodiment of the invention.

FIG. 23 shows a circuit of one pixel of the LED display as the sixth embodiment of the invention. This LED display is produced by using the light-emitting element or light-emitting device production method of the invention. The light-emitting element 200 described in the third embodiment can be used as the light-emitting elements included in this LED display.

This LED display is of an active matrix address scheme, in which a selecting voltage pulse is fed to a row address line X1 while a data signal is fed to a column address line Y1. As the selecting voltage pulse is inputted to a gate of a transistor T1 so that the transistor T1 is turned on, the data signal is transmitted from the source to the drain of the transistor T1, thus the data signal stored as a voltage in a capacitor C. A transistor T2 is for use of driving a pixel LED 520, and the light-emitting element 200 described in the third embodiment can be used for the pixel LED 520.

The pixel LED 520 is connected to a power supply Vs via the transistor T2. Therefore, as the transistor T2 is turned on by a data signal from the transistor T1, the pixel LED 520 is driven by the power supply Vs.

In the LED display of this embodiment, pixels (one of which is shown in FIG. 23) are arrayed in a matrix form. Pixel LEDs 520 and transistors T1, T2 of the individual pixels arrayed in the matrix form are formed on the substrate.

The LED display in this embodiment can be fabricated by taking steps, for example, as shown below.

First, the light-emitting elements 200 are formed by the semiconductor core formation step, the semiconductor shell formation step and the light-emitting element cut-off step described with reference to FIGS. 2 to 5, FIG. 8 and FIG. 9 of the production method of the third embodiment. Next, the transistors T1, T2 are formed on a glass or other substrate by using ordinary TFT formation process. Next, a first electrode and a second electrode for arranging the minute light-emitting elements, which are to become the pixel LEDs 520, are formed on the substrate on which the transistors, or TFTs, have been formed. Next, by using the process described with reference to FIGS. 10 to 16 of the third embodiment, the minute light-emitting elements 200 are placed at specified positions on the substrate (light-emitting element arrangement step). Thereafter, the interconnection step is performed, by which the minute light-emitting elements 200 are connected to the drains of the associated transistors T2 and the ground line (light-emitting element interconnection step).

That is, the production process, as described with reference to FIGS. 2 to 5 in the third embodiment, includes: a step of patterning a mask layer with photoresist 151 onto a surface of the n-type semiconductor layer 112 forming part or entirety of the first substrate 110; a semiconductor core formation step of forming a plurality of n-type rod-shaped semiconductors 121 by anisotropically etching the n-type semiconductor layer 112 with the mask layer used as a mask; and a semiconductor shell formation step of forming a p-type semiconductor layer 123 so that surfaces of the n-type rod-shaped semiconductors 121 are covered therewith. The production process further includes a light-emitting element cut-off step of cutting off the n-type rod-shaped semiconductors 121 covered with the p-type semiconductor layer 123 from the first substrate 110, as described with reference to FIGS. 8 and 9 in the third embodiment. In addition, the production process also includes: a light-emitting element arrangement step of arranging the n-type rod-shaped semiconductors 121 covered with the p-type semiconductor layer 123 and cut off from the silicon substrate 111 of the first substrate 110, so that the n-type rod-shaped semiconductors 121 are placed in correspondence to pixel positions on the second substrate; and a light-emitting element interconnection step of providing interconnections to energize the n-type rod-shaped semiconductors 121 covered with the p-type semiconductor layer 123 and placed in correspondence to the pixel positions on the second substrate.

According to the above-described production method, since the p-type semiconductor layer 123 is formed so as to cover the surfaces of the n-type rod-shaped semiconductors 121, light-emission area per unit area of the first substrate 110 is quite large and can be, for example, ten times as large as that of planar epitaxial growth. For obtainment of equal light emission quantity, the number of substrates can be lessened to, for example, 1/10 so that the production cost can be reduced to a large extent. That is, a production cost for the n-type rod-shaped semiconductors 121 covered with the p-type semiconductor layer 123 functioning as light-emitting elements can be reduced largely. Then, the n-type rod-shaped semiconductors 121 covered with the p-type semiconductor layer 123 are cut off from the silicon substrate 111 of the first substrate 110, and placed on the second substrate that is to become a panel of the display device of this embodiment, and further subjected to interconnections, by which the display device is produced. Since the pixels of the display device in this embodiment counts about 6,000,000 as an example, the cost of the light-emitting elements is quite important in cases where the light-emitting elements are used for every pixel. Thus, by using the above-described process to produce the display device, production cost for the display device can be cut down.

In the arrangement method of the light-emitting elements 200, which serve as the pixel LEDs 520 in this embodiment, for arrangement onto the second substrate (see FIGS. 10 to 16), since the anodes and cathodes of the pixel LEDs 520 are randomly oriented, the pixel LEDs 520 are AC-driven.

The above description is given on a case where, as an example, the semiconductor layer 113 as a first conductivity type semiconductor base and the first conductivity type n-type rod-shaped semiconductors 121 are set to the n type while the second conductivity type semiconductor layer 123 is set to the p type. However, it is also possible that the semiconductor layer 113 as a first conductivity type semiconductor base and the first conductivity type rod-shaped semiconductors 121 are set to the p type while the second conductivity type semiconductor layer 123 is set to the n type.

Seventh Embodiment

Figure 24A:
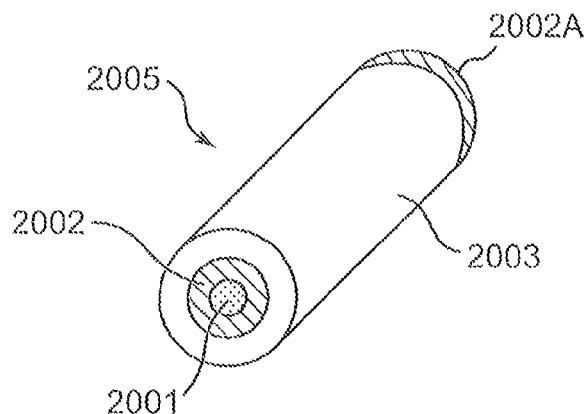
FIG. 24A is a perspective view of a light-emitting diode as a seventh embodiment of a diode of the invention.
Figure 24B:
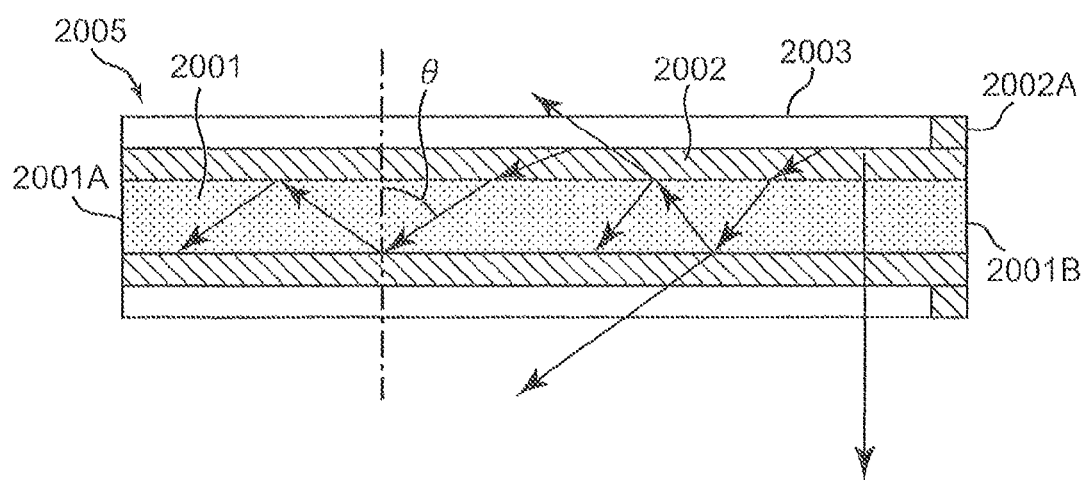
FIG. 24B is a sectional view of the light-emitting diode of the seventh embodiment.

FIG. 24A is a perspective view of a light-emitting diode 2005 as a seventh embodiment of a diode of the invention. FIG. 24B is a sectional view of the light-emitting diode 2005.

The light-emitting diode 2005 of this seventh embodiment includes a columnar rod-shaped core 2001 as a core part, a cylindrical-shaped first shell 2002 as a first conductivity type semiconductor layer that covers the columnar rod-shaped core 2001, and a cylindrical-shaped second shell 2003 as a second conductivity type semiconductor layer that covers the cylindrical-shaped first shell 2002. Both end portions 2001A, 2001B of the rod-shaped core 2001 are exposed from the first and second shells 2002, 2003. The first shell 2002 has a flange-like end portion 2002A, and this end portion 2002A is exposed from the second shell 2003.

The rod-shaped core 2001 is made from SiC, the first shell 2002 is made from n-type GaN, and the second shell 2003 is made from p-type GaN. The rod-shaped core 2001 made from SiC has a refractive index in a range of from 3 to 3.5, and the first shell 2002 made from n-type GaN has a refractive index of 2.5. Also, the rod-shaped core 2001 made from SiC has a thermal conductivity of 450 W/(m·K), and the first shell 2002 made from n-type GaN has a thermal conductivity of 210 W/(m·K).

According to the light-emitting diode 2005 of this embodiment, the refractive index n1 (=3 to 3.5) of the rod-shaped core 2001 is larger than the refractive index n2 (=2.5) of the first shell 2002. Therefore, light generated at a pn junction between the first and the second shells 2002, 2003 is easily inputted through the first shell 2002 into the rod-shaped core 2001, and moreover light inputted into the rod-shaped core 2001 is totally reflected easily by the interface between the rod-shaped core 2001 and the first shell 2002. That is, as shown in FIG. 24B, on condition that an incident angle θ on the interface between the rod-shaped core 2001 and the first shell 2002 is equal to or more than $\sin^{-1}(n2/n1)$ (i.e. equal to or more than 45.6° to 56.4°), there occurs total reflection of the light at the interface. Therefore, the light generated as shown above can be confined within the rod-shaped core 2001 made from SiC, so that light can be outputted from the end portions 2001A, 2001B of the rod-shaped core 2001 as in a waveguide. Thus, the light-emitting diode 2005 of this seventh embodiment is suitable for directional light-emitting devices.

Figure 24C:
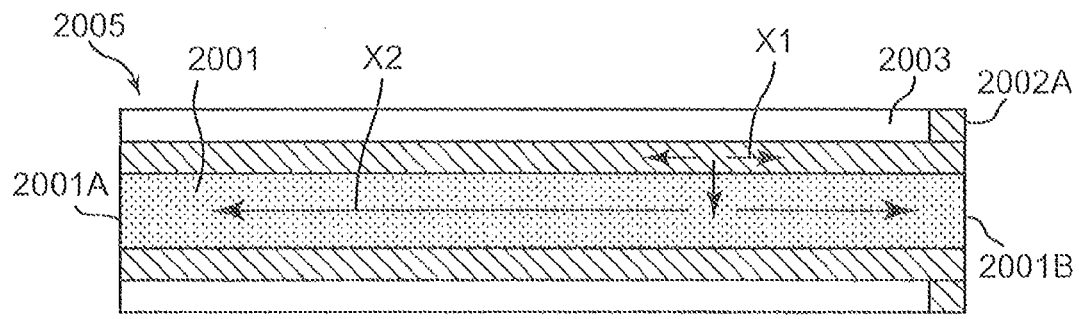
FIG. 24C is a sectional view schematically showing a process in which heat propagates in the light-emitting diode of the seventh embodiment.

Also in the light-emitting diode 2005 of this embodiment, since the thermal conductivity (450 (W/(m·K))) of the rod-shaped core 2001 is higher than the thermal conductivity (210 (W/(m·K))) of the first shell 2002 made from n-type GaN, heat generated at the pn junction between the first and second shells 2002, 2003 is less easily diffused through the first shell 2002 as shown by arrow X1 in FIG. 24C while the heat is easily diffused through the rod-shaped core 2001 to the whole diode as shown by arrow X2. As a result of this, heat due to light emission of the rod-shaped light-emitting diode 2005 can be radiated more easily. Moreover, heat is diffused through the rod-shaped core 2001, so that temperature uniformization on the overall rod-shaped light-emitting diode 2005 can be achieved and decreases in light emission efficiency due to high-temperature concentration can be prevented.

Figure 25A:
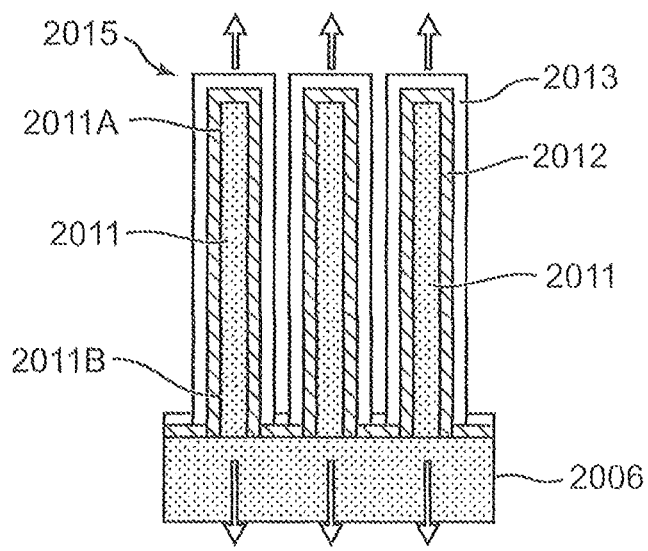
FIG. 25A is a sectional view showing a state in which a plurality of light-emitting diodes in accordance with a modification of the seventh embodiment are formed in an erect state on a substrate.
Figure 25B:
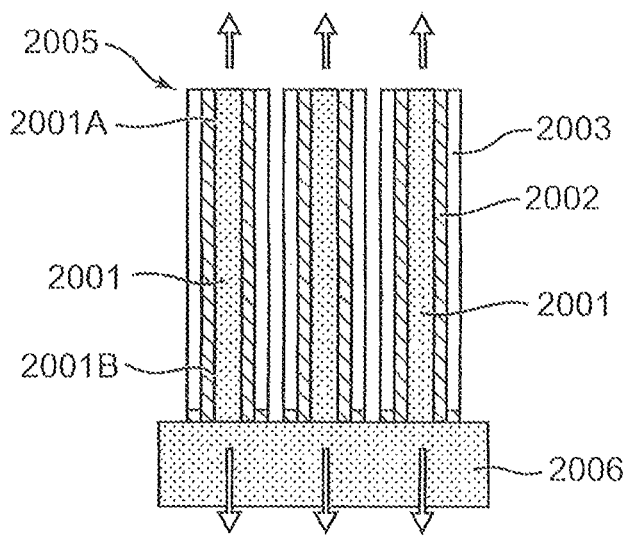
FIG. 25B is a sectional view showing a state in which a plurality of light-emitting diodes of the seventh embodiment are formed in an erect state on a substrate.
Figure 25C:
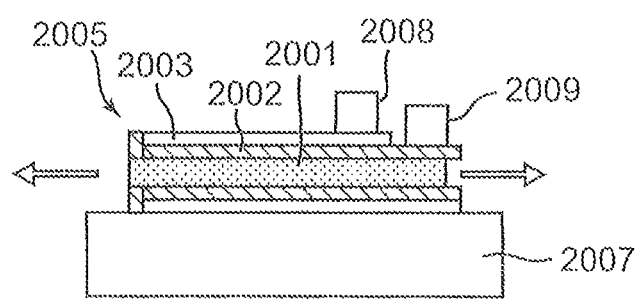
FIG. 25C is a sectional view showing a state in which the light-emitting diode of the seventh embodiment is laid on its side on a substrate.

In a case where a plurality of the light-emitting diodes 2005 are formed on a SiC substrate 2006 in an erect state so as to be spaced apart from one another as shown in FIG. 25B, it is achievable to obtain intense light emission, from both end portions 2001A, 2001B of the rod-shaped core 2001, in an extending direction (major axis direction) in which the rod-shaped core 2001 extends. On the other hand, in a case where the light-emitting diodes 2005 are placed in a sidelong laid-down state on a GaN substrate 2007 as shown in FIG. 25C, intense light emission from both end portions 2001A, 2001B can be obtained in the extending direction (major axis direction) of the rod-shaped core 2001 which is in this case along the GaN substrate 2007. In addition, in the light-emitting diode 2005 of FIG. 25C, a circumferential portion in one end portion of the second shell 2003 is removed so that a circumferential portion in one end portion of the first shell 2002 is exposed, where a contact electrode 2009 is formed at the exposed portion of the first shell 2002 while a contact electrode 2008 is formed on the second shell 2003.

Also, as a modification of the light-emitting diode 2005, a plurality of light-emitting diodes 2015 may be formed on the SiC substrate 2006 in an erect state so as to be spaced apart from one another as shown in FIG. 25A, each light-emitting diode 2015 including a SiC rod-shaped core 2011, an n-type GaN first shell 2012 that covers the SiC rod-shaped core 2011, and a p-type GaN second shell 2013 that covers the n-type GaN first shell 2012. In this light-emitting diode 2015, an end portion 2011A of the SiC rod-shaped core 2011 is covered with the n-type GaN first shell 2012 and the p-type GaN second shell 2013. This light-emitting diode 2015 is capable of obtaining intense light emission in the major axis direction from an end portion 2011B of the rod-shaped core 2011 through the SiC substrate 2006.

Figure 26A:
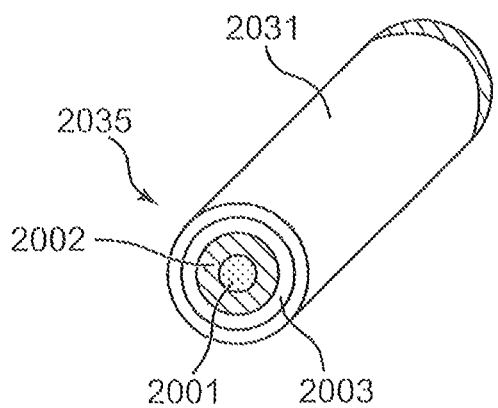
FIG. 26A is a perspective view of a light-emitting diode in accordance with another modification of the seventh embodiment.
Figure 26B:
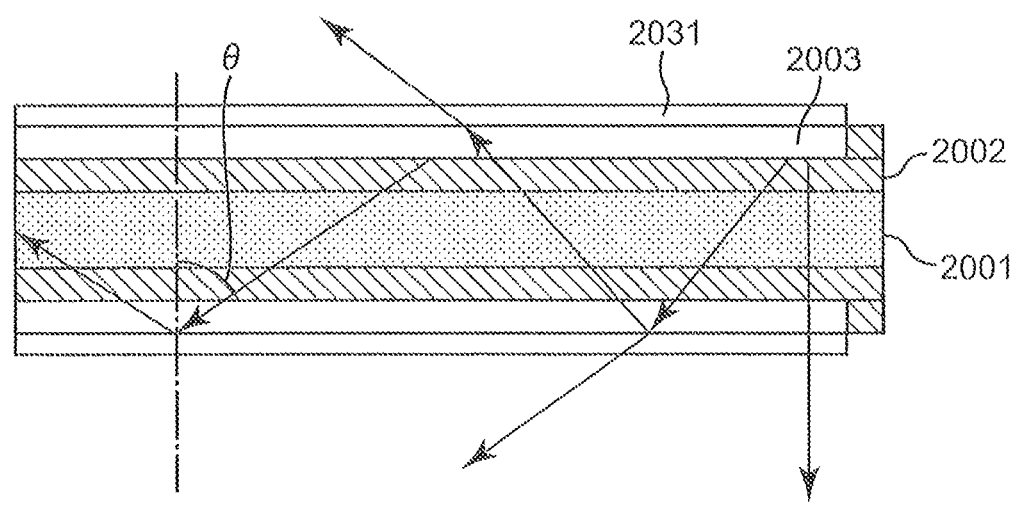
FIG. 26B is a sectional view of the light-emitting diode in accordance with another modification mentioned above.

As another modification of the light-emitting diode 2005 of the seventh embodiment described with reference to FIGS. 24A and 24B, it is also possible to provide a light-emitting diode 2035 including a third shell 2031 that covers a circumferential surface of the cylindrical-shaped second shell 2003 made from p-type GaN, as shown in FIGS. 26A and 26B. This third shell 2031 is made from a material having a refractive index (e.g., ZnO with a refractive index n4=1.95) lower than that of the cylindrical-shaped second shell 2003 made from p-type GaN. In this light-emitting diode 2035, the third shell 2031 formed outside the second shell 2003 and having a refractive index n4 lower than the refractive index n3 of the second shell 2003 functions as a reflecting film. That is, on condition that the incident angle θ onto the interface between the second shell 2003 and the third shell 2031 is equal to or more than $\sin^{-1}(n4/n3)$, there occurs total reflection of light at the interface as shown in FIG. 26B. Therefore, light generated at the pn junction of the first and the second shells 2002, 2003 less escapes out of the diode, so that light can be outputted from both end portions 2001A, 2001B of the rod-shaped core 2001, hence higher directivity.

Although the seventh embodiment has been described about the light-emitting diode 2005, it should be understood that a photodetector may be made up from a diode having a photoelectric effect and including the columnar rod-shaped core 2001, the cylindrical-shaped first shell 2002, and the cylindrical-shaped second shell 2003 with a structure similar to that of the light-emitting diode 2005. According to this photodetector, since the refractive index n1 of the rod-shaped core 2001 is larger than the refractive index n2 of the first shell 2002, light less easily escapes out of the diode, so that light confinement effect can be enhanced and the photoelectric effect can be enhanced. Also according to this photodetector, since the thermal conductivity of the rod-shaped core 2001 is larger than the thermal conductivity of the first shell 2002, heat radiation, or heat dissipation can be improved while temperature uniformization, or uniform temperature distribution can be fulfilled, so that decreases in photoelectric conversion efficiency due to high-temperature concentration can be avoided. Thus, according to this photodetector, the photodetection performance can be improved.

Although the seventh embodiment has been described about the light-emitting diode 2005, it should be understood that a solar cell may be made up from a diode having a photoelectric effect and including the columnar rod-shaped core 2001, the cylindrical-shaped first shell 2002, and the cylindrical-shaped second shell 2003 with a structure similar to that of the light-emitting diode 2005. According to this solar cell, since the refractive index n1 of the rod-shaped core 2001 is larger than the refractive index n2 of the first shell 2002, light less easily escapes out of the diode, so that light confinement effect can be enhanced and the power generation effect can be enhanced. Also according to this solar cell, since the thermal conductivity of the rod-shaped core 2001 is larger than the thermal conductivity of the first shell 2002, heat radiation can be improved while temperature uniformization can be fulfilled, so that decreases in photoelectric conversion efficiency due to high-temperature concentration can be avoided. Thus, according to this solar cell, the power generation performance can be improved.

Figure 27A:
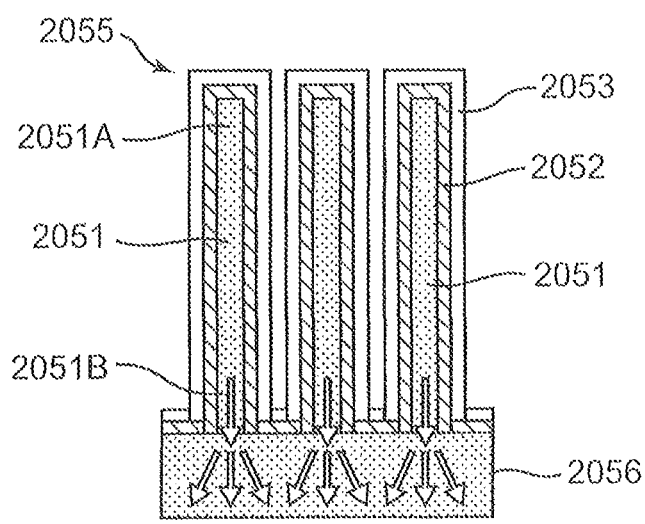
FIG. 27A is a sectional view showing a state in which a plurality of diodes that each form a photodetector, a solar cell or the like and that have a configuration similar to that of the light-emitting diodes in accordance with the modification of the seventh embodiment are formed in an erect state on a substrate.
Figure 27B:
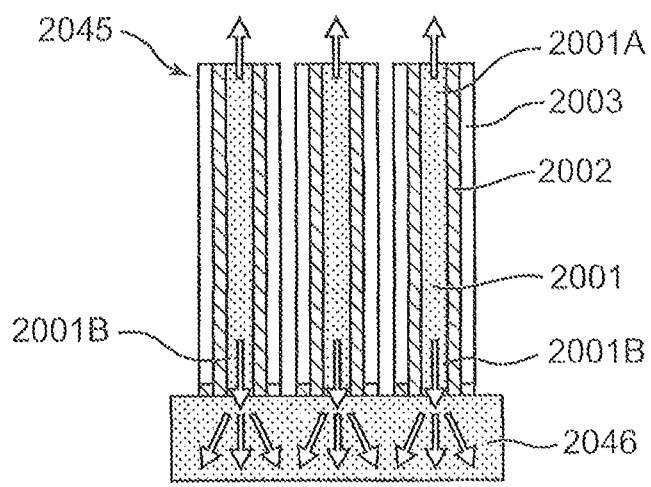
FIG. 27B is a sectional view showing a state in which a plurality of diodes that each form a photodetector, a solar cell or the like and that have a configuration similar to that of the light-emitting diodes of the seventh embodiment are formed in an erect state on a substrate.

Further, in a case where a plurality of diodes 2045 having a photoelectric effect with a structure similar to or same as that of the light-emitting diode 2005 forming the photodetector and the solar cell are formed on a SiC substrate 2046 in an erect state and spaced apart from one another as shown in FIG. 27B, heat is diffused in the whole diode through the rod-shaped core 2001, so that heat can be diffused from the end portion 2001B at the root of the rod-shaped core 2001, to the substrate 2046 while heat can be released also from the end portion 2001A at the front of the rod-shaped core 2001. Therefore, heat radiation can be improved while temperature uniformization can be fulfilled, so that decreases in photoelectric conversion efficiency due to high-temperature concentration can be avoided. Thus, there can be provided a photodetector of good detection performance as well as a solar cell of good power generation efficiency.

Figure 27C:
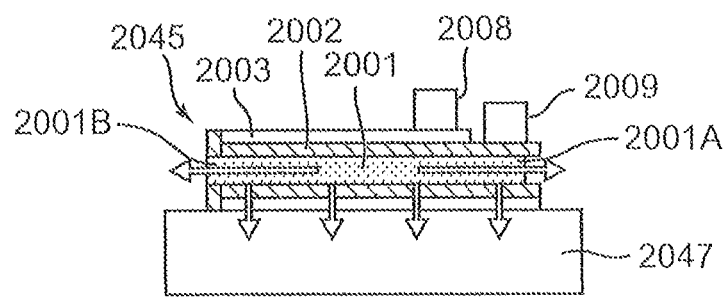
FIG. 27C is a sectional view showing a state in which a diode that forms a photodetector, a solar cell or the like and that has the configuration similar to that of the light-emitting diodes of the seventh embodiment is laid on its side on a substrate.

Also in a case where the diode 2045 is placed in a sidelong laid-down state on a GaN substrate 2047 as shown in FIG. 27C, heat is diffused through the rod-shaped core 2001 to the whole diode while heat can also be radiated from both ends 2001A, 2001B of the rod-shaped core 2001 and moreover large contact area with the GaN substrate 2047 allows heat to escape more easily to the substrate 2047. Therefore, heat radiation can be improved while temperature uniformization can be fulfilled, so that decreases in photoelectric conversion efficiency due to high-temperature concentration can be avoided. Thus, there can be provided a photodetector of good detection performance as well as a solar cell of good power generation efficiency. In addition, in the diode 2045 of FIG. 27C, a circumferential portion in one end portion of the second shell 2003 is cut off so that a circumferential portion in one end portion of the first shell 2002 is exposed, where a contact electrode 2009 is formed at the exposed portion of the first shell 2002 while a contact electrode 2008 is formed on the second shell 2003.

Also, as a modification of the light-emitting diode 2045, a plurality of diodes 2055 may be formed on a SiC substrate 2056 in an erect state so as to be spaced apart from one another, as shown in FIG. 27A, each diode 2055 having a photoelectric effect and including a SiC rod-shaped core 2051, an n-type GaN first shell 2052 that covers the SiC rod-shaped core 2051, and a p-type GaN second shell 2053 that covers the n-type GaN first shell 2052. In this diode 2055 having a photoelectric effect, an end portion 2051A of the SiC rod-shaped core 2051 is covered with the n-type GaN first shell 2052 and the p-type GaN second shell 2053. In this case, heat is diffused in the whole diode through the rod-shaped core 2051, so that heat can be diffused from a root end portion 2051B of the rod-shaped core 2051 to the SiC substrate 2056. Therefore, heat radiation can be improved while temperature uniformization can be fulfilled, so that decreases in photoelectric conversion efficiency due to high-temperature concentration can be avoided. Thus, there can be provided a photodetector of good detection performance as well as a solar cell of good power generation efficiency.

In the above-described embodiments and modifications, the first shells 2002, 2052 are provided by the n-type GaN, and the second shells 2003, 2053 are provided by the p-type GaN. Instead, it is also implementable that the first shells 2002, 2052 are provided by the p-type GaN, and the second shells 2003, 2053 are provided by n-type GaN.

Eighth Embodiment

Figure 28A:
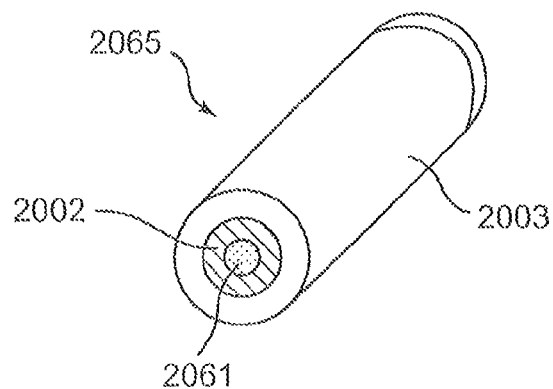
FIG. 28A is a perspective view of a light-emitting diode as a diode of an eighth embodiment of the invention.
Figure 28B:
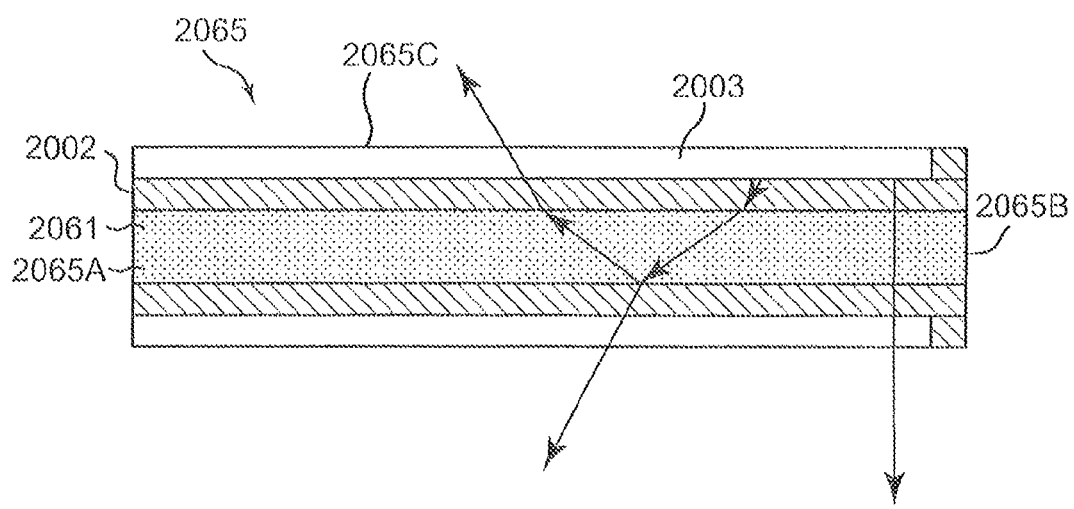
FIG. 28B is a sectional view of the light-emitting diode of the eighth embodiment.

FIG. 28A is a perspective view of a light-emitting diode 2065 as a diode of an eighth embodiment of the invention. FIG. 28B is a sectional view of the light-emitting diode 2065. The light-emitting diode 2065 of this eighth embodiment differs from the light-emitting diode 2005 of the foregoing seventh embodiment shown in FIGS. 24A and 24B only in that the columnar rod-shaped core 2001 made from SiC and serving as a core part of the light-emitting diode 2005 of the seventh embodiment is replaced with a columnar rod-shaped core 2061 made from $SiO_2$. Therefore, the eighth embodiment will be described below mainly on differences from the seventh embodiment, where the same components as in the seventh embodiment will be designated by the same reference signs.

The rod-shaped core 2061 made from $SiO_2$ has a refractive index of 1.45, while the first shell 2002 made from n-type GaN has a refractive index of 2.5. According to the light-emitting diode 2065 of the eighth embodiment, the refractive index n1 (=1.45) of the rod-shaped core 2061 is smaller than refractive index n2 (=2.5) of the first shell 2002. Therefore, light generated at the pn junction between the first and the second shells 2002, 2003 is less easily inputted into the rod-shaped core 2061, and moreover light incident in the rod-shaped core 2061 undergoes no total reflection at the interface between the rod-shaped core 2061 and the first shell 2002. Thus, the rod-shaped light-emitting diode 2065, in which light is outputted from both end faces 2065A, 2065B and the whole side surface 2065C, is suitable for surface emitting devices.

Figure 29A:
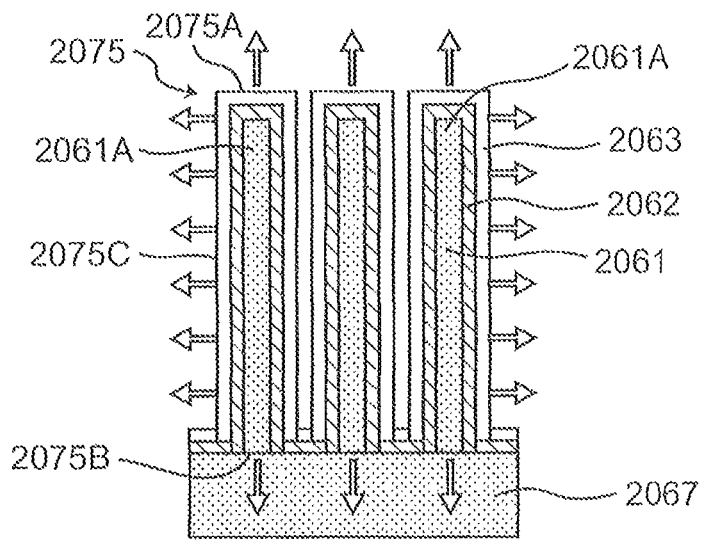
FIG. 29A is a sectional view showing a state in which a plurality of light-emitting diodes in accordance with a modification of the eighth embodiment are formed in an erect state on a substrate.
Figure 29B:
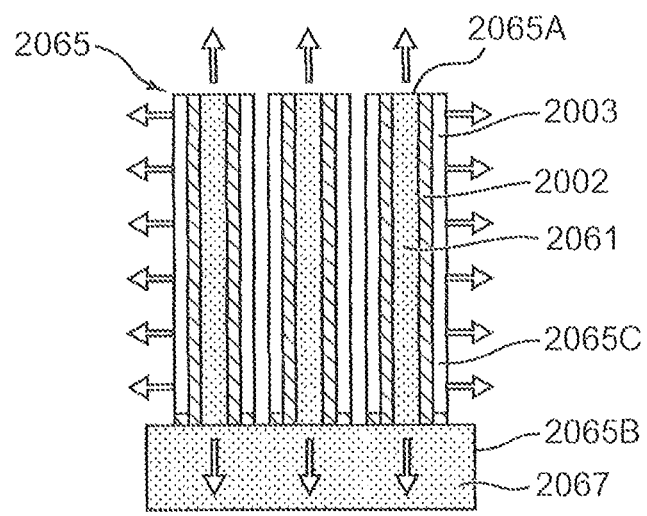
FIG. 29B is a sectional view showing a state in which a plurality of light-emitting diodes of the eighth embodiment are formed in an erect state on a substrate.
Figure 29C:
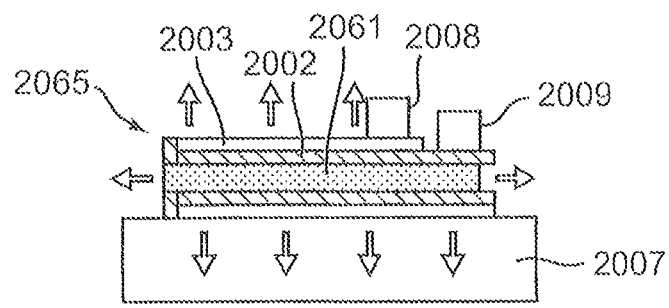
FIG. 29C is a sectional view showing a state in which the light-emitting diode of the eighth embodiment is laid on its side on a substrate.

In a case where a plurality of the light-emitting diodes 2065 are formed on a $SiO_2$ substrate 2067 in an erect state and spaced apart from one another as shown in FIG. 29B, light can be outputted in all directions from both end faces 2065A, 2065B and the whole side surface 2065C of each rod-shaped light-emitting diode 2065. Also in a case where the light-emitting diode 2065 is placed in a sidelong laid-down state on the GaN substrate 2007 as shown in FIG. 29C, light can be outputted in all directions from both end faces 2065A, 2065B and whole side surface 2065C in the extending direction of the rod-shaped core 2061. In addition, in the diode 2065 of FIG. 29C, a circumferential portion in one end portion of the second shell 2003 is cut off so that a circumferential portion in one end portion of the first shell 2002 is exposed, where a contact electrode 2009 is formed at the exposed portion of the first shell 2002 while a contact electrode 2008 is formed on the second shell 2003.

Also, as a modification of the light-emitting diode 2065, a plurality of light-emitting diodes 2075 may be formed on a $SiO_2$ substrate 2067 in an erect state so as to be spaced apart from one another as shown in FIG. 29A, each diode 2075 including a $SiO_2$ rod-shaped core 2061, an n-type GaN first shell 2062 that covers the $SiO_2$ rod-shaped core 2061, and a p-type GaN second shell 2063 that covers the n-type GaN first shell 2062. In this light-emitting diode 2075, an end portion 2061A of the $SiO_2$ rod-shaped core 2061 is covered with the n-type GaN first shell 2062 and the p-type GaN second shell 2063. In this case also, light can be outputted in all directions from both end portions 2075A, 2075B and whole side surface 2075C of the light-emitting diodes 2075.

In this embodiment, the first shells 2002, 2062 are made from n-type GaN while the second shells 2003, 2063 are made from p-type GaN. However, it is also implementable that the first shells 2002, 2062 are made from p-type GaN while the second shells 2003, 2063 are made from n-type GaN.

Ninth Embodiment

Figure 30A:
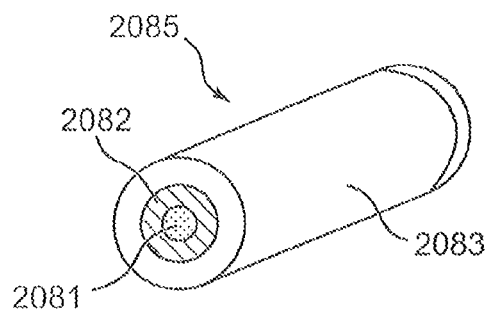
FIG. 30A is a perspective view of a light-emitting diode as a diode of a ninth embodiment of the invention.
Figure 30B:
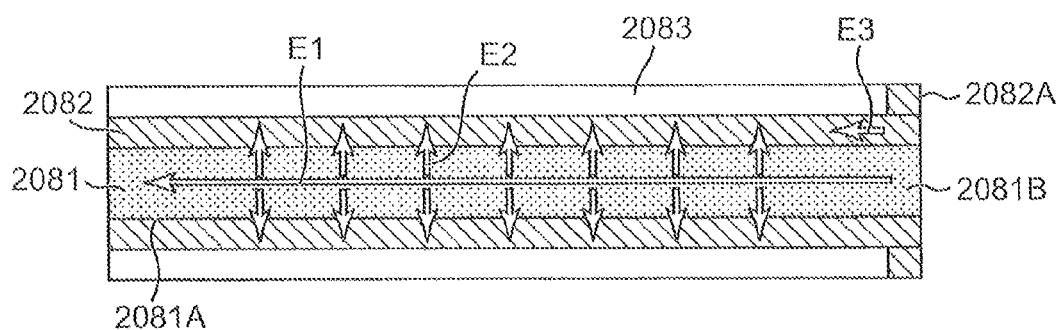
FIG. 30B is a sectional view showing current paths, by arrows, in the light-emitting diode of the ninth embodiment.

FIG. 30A is a perspective view of a light-emitting diode 2085 as a diode of a ninth embodiment of the invention. FIG. 30B is a sectional view of the light-emitting diode 2085.

The light-emitting diode 2085 of the ninth embodiment includes a columnar rod-shaped core 2081 as a core part, a cylindrical-shaped first shell 2082 as a first conductivity type semiconductor layer that covers the columnar rod-shaped core 2081, and a cylindrical-shaped second shell 2083 as a second conductivity type semiconductor layer that covers the cylindrical-shaped first shell 2082. As shown in FIG. 30B, end faces of both end portions 2081A, 2081B of the rod-shaped core 2081 are exposed from the first, second shells 2082, 2083. The first shell 2082 has a flange-like end portion 2082A, and this end portion 2082A is exposed from the second shell 2083.

The rod-shaped core 2081 is made from n-type Si, the first shell 2082 is made from n-type GaN, and the second shell 2083 is made from p-type GaN. The rod-shaped core 2081 made from n-type Si has an electrical conductivity of $1.0 \times 10^5$ (/Ωm), and the first shell 2082 made from n-type GaN has an electrical conductivity of $1.0 \times 10^4$ (/Ωm).

According to the light-emitting diode 2085 of this embodiment, the electrical conductivity ($1.0 \times 10^5$(/Ωm)) of the rod-shaped core 2081 is higher than the electrical conductivity ($1.0 \times 10^4$(/Ωm)) of the first shell 2082. Therefore, as shown by arrows E1, E2, E3 in FIG. 30B, a current more easily flows through conduction by the rod-shaped core 2081, as compared with the first shell 2082, so that a current more easily flows through the rod-shaped core 2081 to the whole first shell 2082. Thus, light emission of high efficiency can be fulfilled with loss suppressed.

Figure 30C:
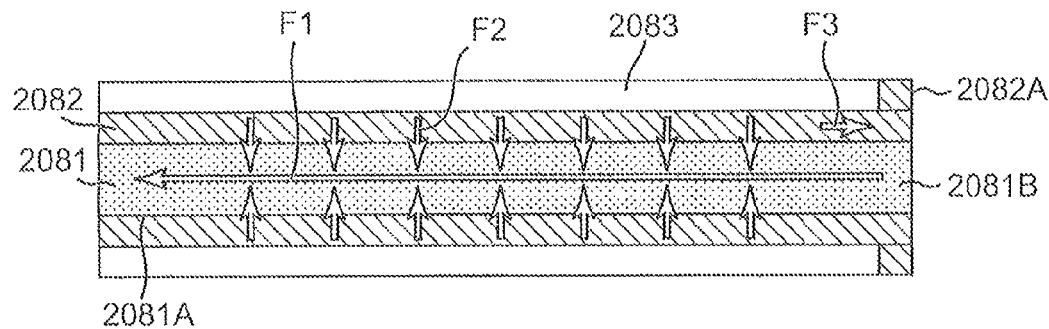
FIG. 30C is a sectional view showing current paths, by arrows, in a photoelectric conversion element (e.g., photodetector, solar cell or the like) composed of a structure similar to the light-emitting diode of the ninth embodiment.

Although this embodiment has been described about the light-emitting diode 2085, yet a photoelectric conversion element (photodetector or solar cell) may be constituted with a structure similar to that of the light-emitting diode 2085. In this case also, as shown by arrows F1, F2, F3 in FIG. 30C, a current more easily flows through conduction by the rod-shaped core 2081, as compared with the first shell 2082, so that a current more easily flows through the rod-shaped core 2081 to the whole first shell 2082. Thus, improvement in photodetection performance as well as improvement in power generation efficiency can be achieved with loss suppressed.

Figure 31A:
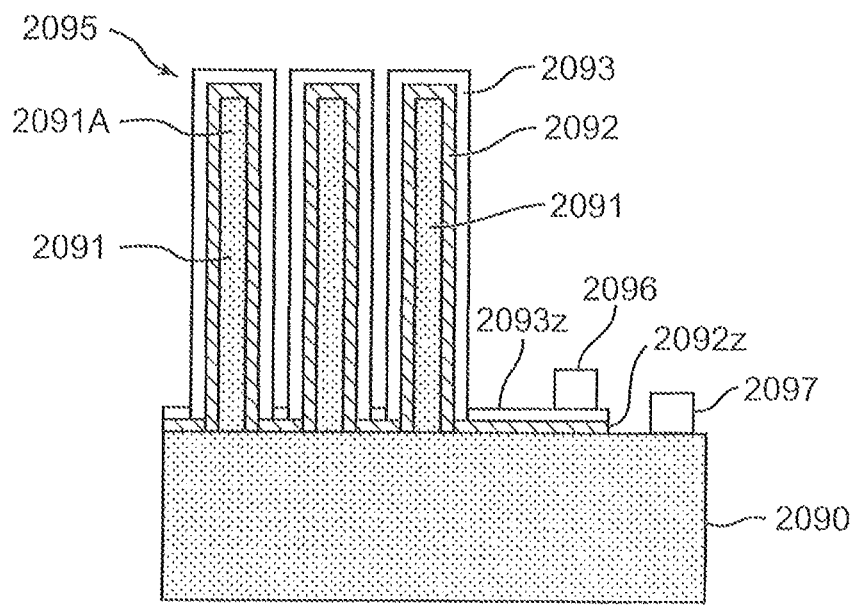
FIG. 31A is a sectional view showing a state in which a plurality of light-emitting diodes in accordance with a modification of the ninth embodiment are formed in an erect state on a substrate.

Also, a plurality of light-emitting diodes 2095 shown in FIG. 31A as a modification of the light-emitting diode 2085 may be formed on an n-type Si substrate 2090 in an erect state and spaced apart from one another. This light-emitting diode 2095 is composed of a rod-shaped core 2091 made from n-type Si, an n-type GaN first shell 2092 that covers the n-type Si rod-shaped core 2091, and a p-type GaN second shell 2093 that covers the n-type GaN first shell 2092. In this light-emitting diode 2095, an end portion 2091A of the n-type Si rod-shaped core 2091 is covered with the n-type GaN first shell 2092 and the p-type GaN second shell 2093. As shown in FIG. 31A, an n-type GaN extension part 2092Z formed on a substrate 2090 runs in succession to the n-type GaN first shell 2092, and a p-type GaN extension part 2093Z formed on the n-type GaN extension part 2092Z runs in succession to the p-type GaN second shell 2093. Then, a contact electrode 2096 is formed on the p-type GaN extension part 2093Z, and a contact electrode 2097 is formed on the n-type Si substrate 2090. In the example shown in FIG. 31A, a contact electrode needs to be formed neither on the n-type Si rod-shaped core 2091 nor on the n-type GaN first shell 2092, while the contact electrode 2097 only needs to be formed on the n-type Si substrate 2090. Thus, the formation of contact electrodes is facilitated.

Figure 31B:
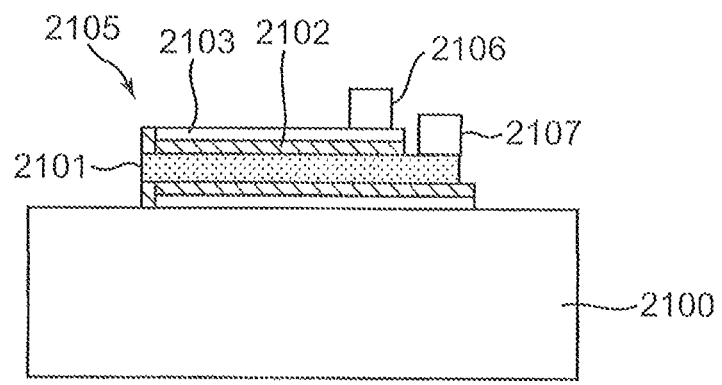
FIG. 31B is a sectional view showing a state in which a light-emitting diode in accordance with another modification of the ninth embodiment is laid on its side on a substrate.

Also, a light-emitting diode 2105 shown in FIG. 31B as another modification of the light-emitting diode 2085 may be placed in a sidelong laid-down state on a GaN substrate 2100. In the light-emitting diode 2105 shown in FIG. 31B, a circumferential portion in one end portion of the n-type Si rod-shaped core 2101 is exposed from first, second shells 2102, 2103. The first shell 2102 is made from n-type GaN, and the second shell 2103 is made from p-type GaN. Then, a contact electrode 2106 is formed on an outer circumferential surface of the second shell 2103, and a contact electrode 2107 is formed at one end portion of the exposed n-type Si rod-shaped core 2101. The light-emitting diode 2105 shown in FIG. 31B is obtained by, for example, cutting off one from those in the erected state on the Si substrate 2090 shown in FIG. 31A and then placing on a GaN substrate 2100 as another substrate in a sidelong laid-down state. In one example shown in FIG. 31B, a contact electrode does not need to be formed on the n-type GaN first shell 2102, while it is appropriate enough that the contact electrode 2106 is formed on the p-type GaN second shell 2103 and the contact electrode 2107 is formed on the n-type Si rod-shaped core 2101. Thus, the formation of contact electrodes is facilitated.

Although the light-emitting diodes 2095, 2105 have been described in FIGS. 31A and 31B, it should be understood that a photoelectric conversion element (photodetector or solar cell) may be made with a structure similar to that of the light-emitting diodes 2095, 2105. Also, although the first shells 2082, 2092, 2102 are made from the n-type GaN and the second shells 2083, 2093, 2103 are made from the p-type GaN in the above embodiment, it is also possible that the first shells 2082, 2092, 2102 are made from the p-type GaN and the second shells 2083, 2093, 2103 are made from the n-type GaN.

Tenth Embodiment

Figure 32A:
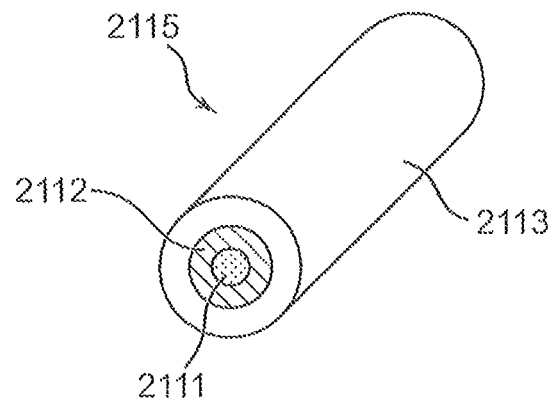
FIG. 32A is a perspective view of a light-emitting diode as a diode of a tenth embodiment of the invention.
Figure 32B:
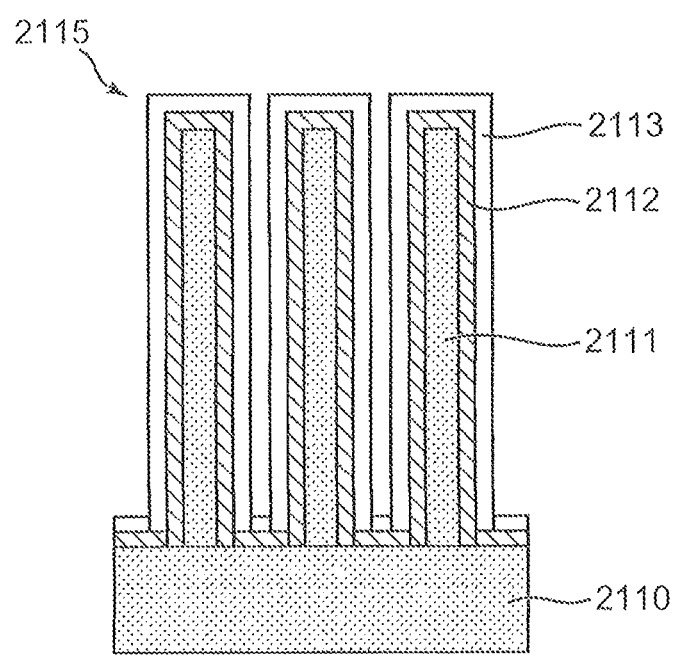
FIG. 32B is a sectional view showing a state in which a plurality of light-emitting diodes of the tenth embodiment are formed in an erect state on a substrate.

FIG. 32A is a perspective view of a light-emitting diode 2115 as a diode of a tenth embodiment of the invention. FIG. 32B is a sectional view showing a state in which a plurality of the light-emitting diodes 2115 are formed on an Si substrate 2110 in an erect state so as to be spaced apart from one another.

The light-emitting diode 2115 includes a core 2111 made from silicon, a first shell 2112 made from n-type GaN as a first conductivity type semiconductor layer formed so as to cover the core 2111, and a second shell 2113 made from p-type GaN as a second conductivity type semiconductor layer formed so as to cover the first shell 2112.

According to the light-emitting diode 2115 of this embodiment, since the core 2111 is made from silicon, a formation process for the core 2111 is established. Therefore, a light-emitting diode 2115 of desired good configuration can be obtained. Also, use quantity of the first conductivity type semiconductor can be reduced as compared with cases where the core is made all from a first conductivity type semiconductor. Thus, a cost reduction can be achieved.

Figure 33A:
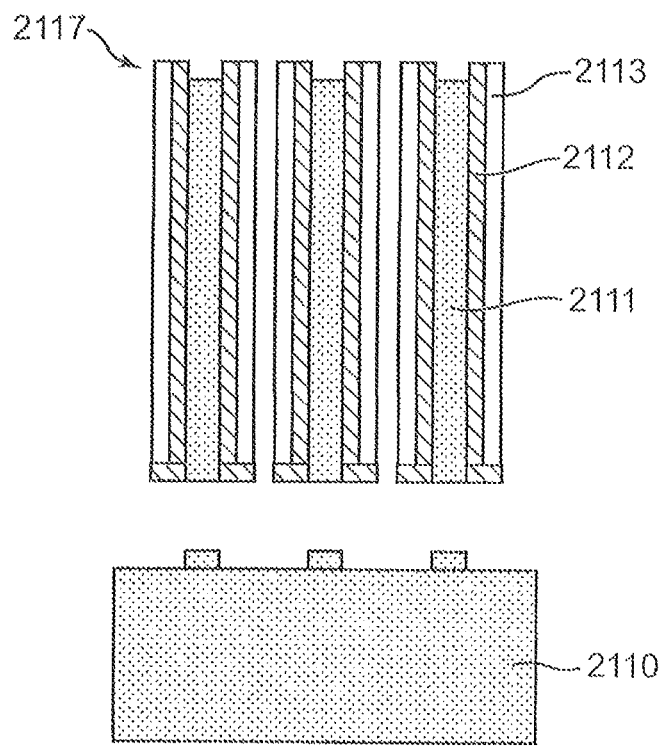
FIG. 33A is a sectional view showing light-emitting diodes, as a modification of the tenth embodiment, cut off from a substrate for production.
Figure 33B:
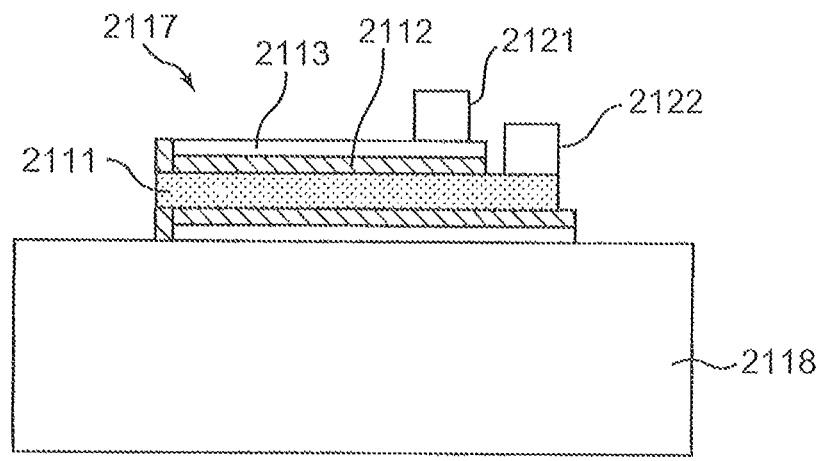
FIG. 33B is a sectional view showing a state in which a cut-off light-emitting diode of FIG. 33A is mounted so as to be laid on its side on a substrate for mounting.

In addition, a plurality of light-emitting diodes 2115 formed in an erect state and spaced apart from one another on the Si substrate 2110 as a fabrication substrate as shown in FIG. 32B may be cut off from the Si substrate 2110 by etching or the like as shown in FIG. 33A, by which light-emitting diodes 2117 cut off from the Si substrate 2110 are obtained. Then, a light-emitting diode 2117 can be mounted in a sidelong laid-down state on a GaN substrate 2118 as a mounting substrate as shown in FIG. 33B. That is, the light-emitting diode 2117 cut off from the substrate can be mounted easily onto a desired mounting substrate other than a fabrication substrate.

For example, the first and second shells 2112, 2113 of the light-emitting diode 2115 formed in an erect state on the Si substrate 2110 are etched by RIE (Reactive Ion Etching), and the Si substrate 2110 is dry etched by $CF_4$ or the like, followed by application of ultrasonic waves in an IPA (Isopropyl Alcohol) or other solution. Thus, the light-emitting diode 2115 can be cut off from the Si substrate 2110.

In addition, in the light-emitting diode 2117 of FIG. 33B, a circumferential portion in one end portion of the first, second shells 2112, 2113 is removed so that a corresponding circumferential portion in one end portion of the core 2111 is exposed, where a contact electrode 2122 is formed at the exposed portion in the one end portion of the core 2111 while a contact electrode 2121 is formed on the second shell 2113. Further, a photodetector or solar cell, which is a photoelectric conversion element, may be constituted by a diode having a photoelectric effect with a structure similar to that of the light-emitting diodes 2115, 2177. In addition, although the first shell 2112 is made from the n-type GaN and the second shell 2113 is made from the p-type GaN in the above embodiment, it is also allowable that the first shell 2112 is made from the p-type GaN and the second shell 2113 is made from the n-type GaN.

Eleventh Embodiment

Next, a diode production method as an eleventh embodiment of the invention will be described with reference to FIGS. 34A-34I. FIGS. 34A-34I are sectional views for explaining each production step in this production method.

Figure 34A:
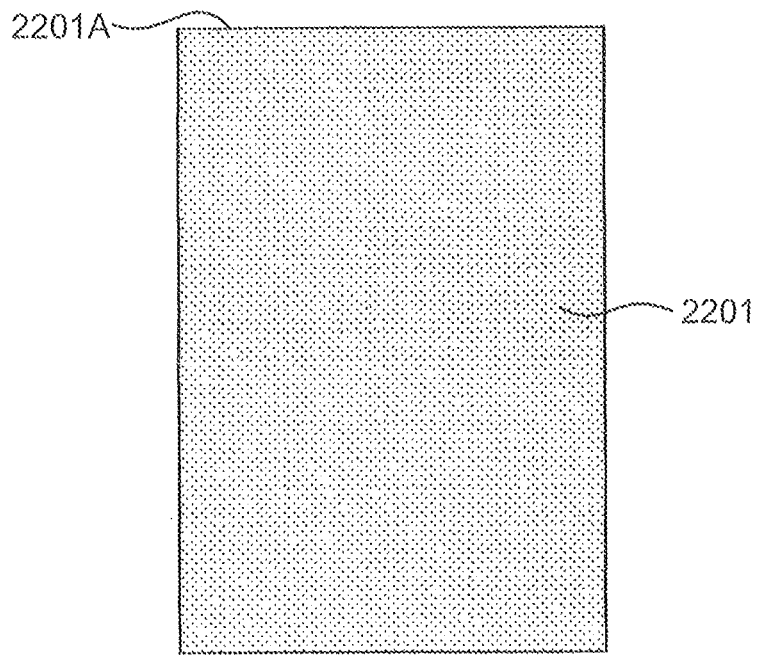
FIG. 34A is a sectional view showing a process step in a production method for diodes as an eleventh embodiment of the invention.

First, as shown in FIG. 34A, an n-type Si substrate 2201 is prepared, and a $SiO_2$ film (not, shown) of TEOS (tetraethyl orthosilicate) or the like is deposited to a thickness of several μm on a surface 2201A of the n-type Si substrate 2201. Preferably, the film thickness of the $SiO_2$ film is set to 1 μm or more.

Figure 34B:
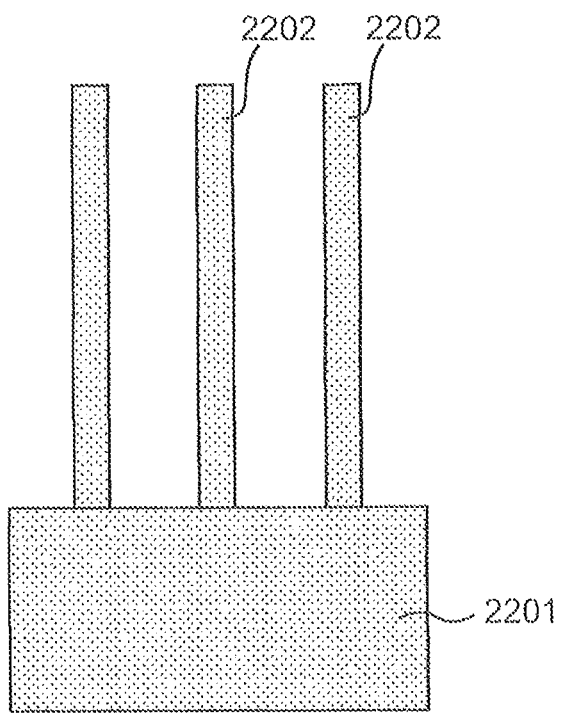
FIG. 34B is a sectional view showing a process step in the eleventh embodiment.

Thereafter, photoresist process is performed, and anisotropic etching such as RIE (Reactive Ion Etching) is performed on the SiO$_2$ film (not shown), so that the n-type Si substrate 2201 is partly exposed from the SiO$_2$ film. Further, anisotropic etching with a high selection ratio relative to the SiO$_2$ film is performed on the n-type Si substrate 2201 partly exposed from the SiO$_2$ film until an etching depth reaches 25 μm. In this process, although the photoresist is etched, yet the SiO$_2$ film serves as a mask so that the etching to the n-type Si substrate 2201 can be continued. In this way, as shown in FIG. 34B, a plurality of n-type Si rod cores 2202 can be formed on the n-type Si substrate 2201 so as to be erect at predetermined intervals.

Next, the n-type Si substrate 2201, on which the plurality of n-type Si cores 2202 have been formed, is subjected to asking and cleaning processes, and thereafter a thermal oxide film is formed on the surface of the n-type Si substrate 2201 with the plurality of cores 2202 formed thereon. Thereafter, the thermal oxide film is peeled off with HF (hydrofluoric acid), by which a Si surface free from defects and dust is obtained.

Next, the n-type Si substrate 2201, on which the plurality of cores 2202 have been formed, is set to an MOCVD (Metal Organic Chemical Vapor Deposition) apparatus and subjected to thermal cleaning for tens of minutes in a 1200° C. hydrogen atmosphere, by which a natural oxidation film is removed and the Si surface is hydrogen terminated. Thereafter, the substrate temperature is lowered to 1100° C., under which an AlN layer (not shown) and an Al$_x$Ga$_{1-x}$N (0<x<1) layer (not shown) are grown. It is noted that these AlN layer and Al$_x$Ga$_{1-x}$N (0<x<1) layer do not necessarily need to be formed.

Figure 34C:
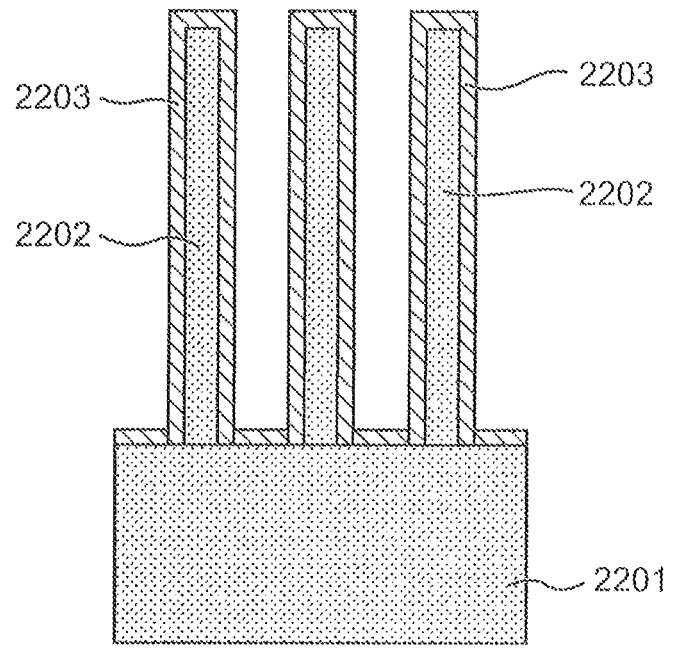
FIG. 34C is a sectional view showing a process step in the eleventh embodiment.
Figure 34D:
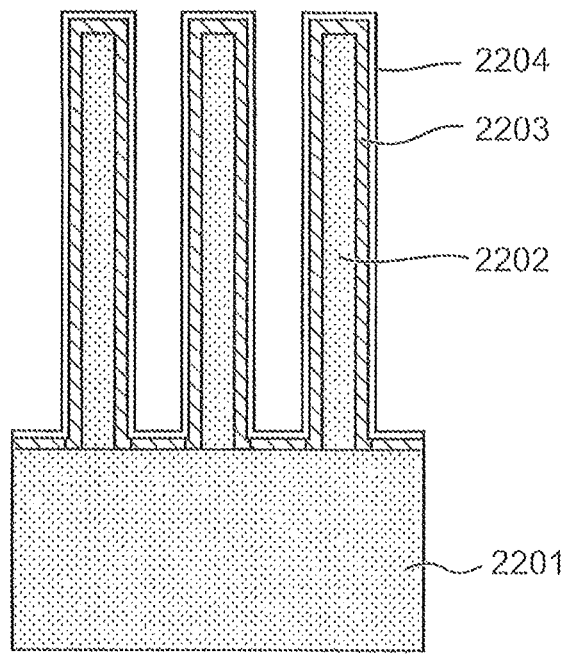
FIG. 34D is a sectional view showing a process step in the eleventh embodiment.
Figure 34E:
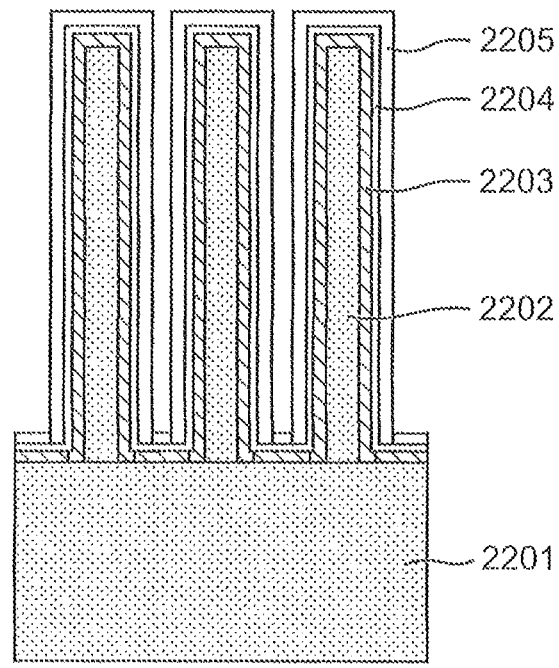
FIG. 34E is a sectional view showing a process step in the eleventh embodiment.

Next, as shown in FIG. 34C, n-type GaN is grown by MOCVD (Metal Organic Chemical Vapor Deposition), by which a first conductivity type first shell 2203 is formed. Next, as shown in FIG. 34D, a quantum well layer (active layer) 2204 in a multiple quantum well (MQW) structure of several to several-tens of layers of Ga$_{1-y}$In$_y$N/Ga$_{1-z}$In$_z$N (0<Y, Z<1) is grown by MOCVD. Next, a p-Al$_n$Ga$_{1-n}$N (0<n<1) layer (not shown) is grown on the quantum well layer (active layer) 2204, and further, as shown in FIG. 34E, p-type GaN is grown by MOCVD so that a second conductivity type second shell 2205 that covers the quantum well layer 2204 is formed. It is noted that the quantum well layer 2204 and the p-Al$_n$Ga$_{1-n}$N (0<n<1) layer (not shown) thereon do not necessarily need to be formed.

Figure 34F:
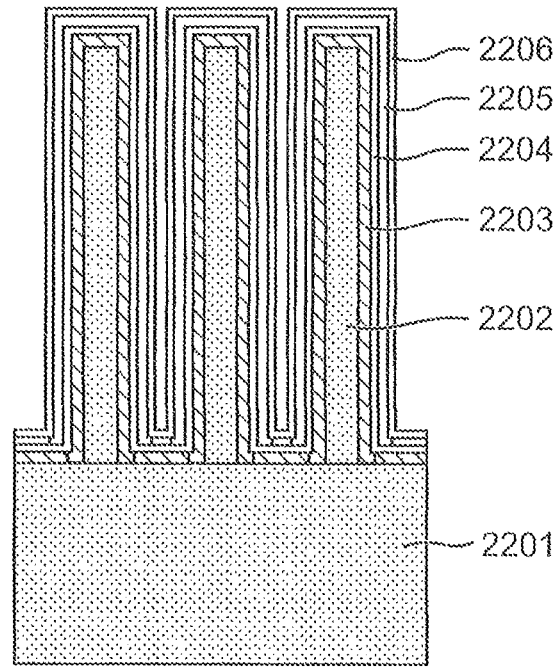
FIG. 34F is a sectional view showing a process step in the eleventh embodiment.

Next, as shown in FIG. 34F, ITO (Indium Tin Oxide) is formed on the p-type GaN second shell 2205 by CVD, sputtering or plating, by which an ITO conductive film 2206 is formed. In addition, after the formation of the ITO, a p-type translucent electrode may also be formed by performing a 10-min. annealing at 650° C. in a mixed atmosphere of nitrogen and oxygen. Besides, instead of the ITO conductive film 2206, a ZnO conductive film or a FTO (Fluorine-doped Tin Oxide) conductive film may be adopted.

Figure 34G:
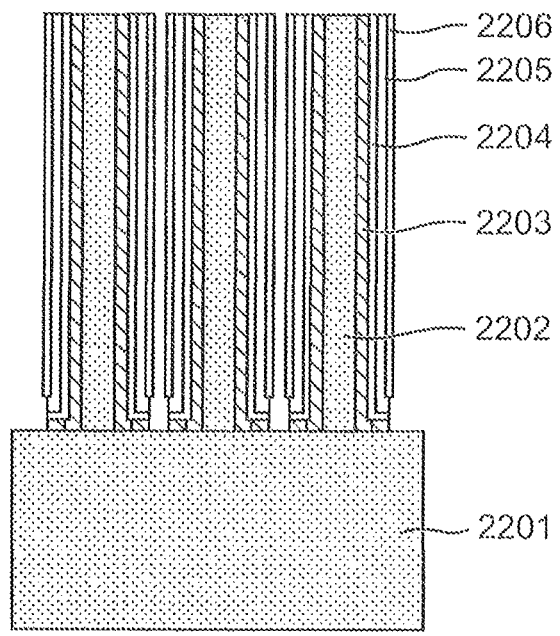
FIG. 34G is a sectional view showing a process step in the eleventh embodiment.

Next, the ITO conductive film 2206, the p-type GaN second shell 2205, the quantum well layer 2204, and the n-type GaN first shell 2203 are etched by RIE with use of Cl$_2$ or other etching gas. By this etching, as shown in FIG. 34G, front end faces of the plurality of n-type Si cores 2202 are exposed while the surface of n-type Si substrate 2201 is partly exposed.

Figure 34H:
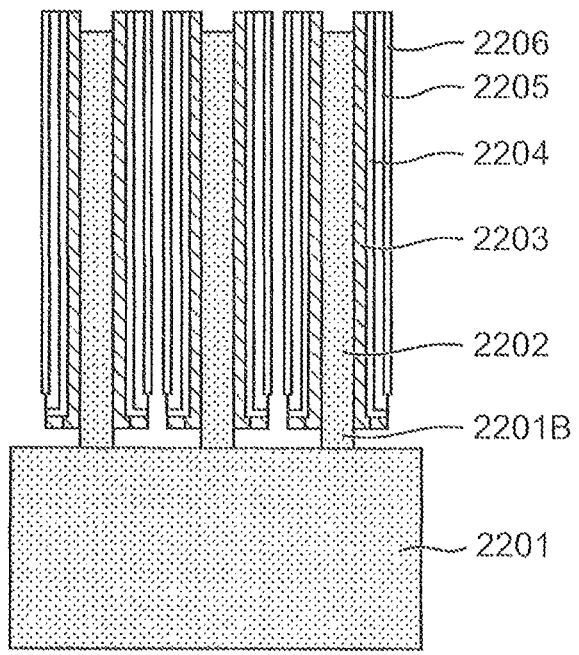
FIG. 34H is a sectional view showing a process step in the eleventh embodiment.

Next, with use of CF$_4$ or other etching gas, dry etching for selective etching of Si is performed. As a result of this, as shown in FIG. 34H, front end portions of the n-type Si cores 2202 are etched, while the n-type Si substrate 2201 is etched from its surface so that n-type Si portions 2201B immediately under the n-type Si cores 2202 are left.

Figure 34I:
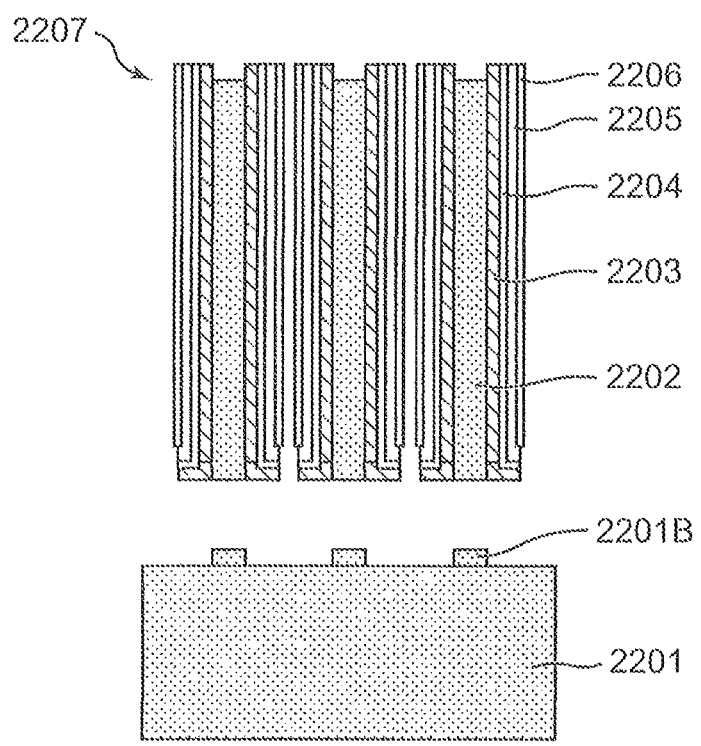
FIG. 34I is a sectional view showing a process step in the eleventh embodiment.

Next, the n-type Si substrate 2201 is immersed in IPA or other solution and ultrasonic waves are applied thereto so that the n-type Si cores 2202 are cut off from the portions 2201B of the n-type Si substrate 2201 as shown in FIG. 34I. As a result, a plurality of light-emitting diodes 2207 cut off from the n-type Si substrate 2201 are obtained.

Given that a layer (e.g. SiO$_2$, refractive index n=1.45) lower in refractive index than the ITO conductive film 2206 is formed on the surface of the ITO conductive film 2206 after the formation of the ITO conductive film 2206 shown in FIG. 34F in the production method of the eleventh embodiment, it becomes possible to guide light along a major axis direction of the cores 2202, so that a light-emitting diode capable of intense emission in one direction can be provided.

The embodiment of the production method has been described above under conditions that the Si substrate 2201 is an n-type Si substrate and the cores 2202 are n-type Si cores. First to third modifications in which materials of the substrate and the cores are changed are shown in (1), (2) and (3) below. It is noted that the first shell 2203, the quantum well layer 2204, the second shell 2205, and the ITO conductive film 2206 are formed in the same way as in the above embodiment.

(1) In the first modification, the substrate 2201 is a SiC substrate and the cores 2202 are SiC cores. In this case, the cores of SiC are formed by, for example, RIE (Reactive Ion Etching) with a SiO$_2$ film used as a mask.

(2) In the second modification, the substrate 2201 is a SiO$_2$ substrate and the cores 2202 are SiO$_2$ cores. In this case, a known lithography process and a known dry etching process that are used for ordinary semiconductor process can be utilized for formation of the cores of SiO$_2$.

(3) In the third modification, the substrate 2201 is an n-type Si substrate and the cores 2202 are n-type Si cores. In this case, the cores 2202 of n-type Si can be formed by VLS (Vapor-Liquid-Solid) growth process.

Although the first conductivity type first shell 2203 is made from n-type GaN and formed by MOCVD in the above embodiment, yet CVD, plating, sputtering or other process may also be adopted depending on the material of the first conductivity type first shell 2203. Further, although the substrate 2201, the cores 2202 and the first shell 2203 are set to the n-type while the second shell 2205 is set to the p-type in the above embodiment, yet it is also allowable that the substrate 2201, the cores 2202 and the first shell 2203 are set to the p-type while the second shell 2205 is set to the n-type. Also, a photoelectric conversion element (photodetector or solar cell) may be constituted by a diode fabricated by the same process as in this embodiment.

Twelfth Embodiment

Next, a light-emitting diode according to a twelfth embodiment of the invention will be described with reference to the sectional view of FIG. 35A. The light-emitting diode 2300 of this twelfth embodiment is partly given by using the one fabricated by steps up to FIG. 34F of the foregoing eleventh embodiment of the light-emitting diode production method.

Figure 35A:
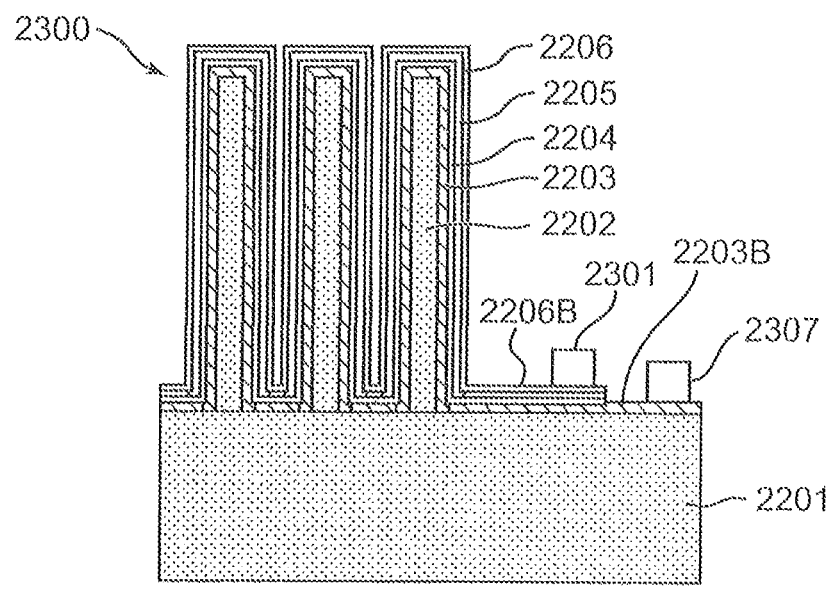
FIG. 35A is a sectional view of a light-emitting diode of a twelfth embodiment of the invention.

In the light-emitting diode 2300 of the twelfth embodiment, as shown in FIG. 35A, end portions of the conductive film 2206, the p-type GaN second shell 2205 and the quantum well layer 2204, which extend along the surface of the n-type Si substrate 2201, are removed by RIE or other etching, so that an end portion 2203B of the n-type GaN first shell 2203 is exposed. Then, a contact electrode 2307 is formed at the exposed end portion 2203B of the first shell 2203, and a contact electrode 2301 is formed at an end portion 2206B of the conductive film 2206.

In the light-emitting diode 2300 of this embodiment, each of a plurality of n-type Si rod-shaped cores 2202 formed in an erect state and spaced apart from one another on the n-type Si substrate 2201 is covered with the n-type GaN first shell 2203, the quantum well layer 2204 and the p-type GaN second shell 2205 in succession. Therefore, according to the light-emitting diode 2300, the light emission area can be increased as compared with cases of flat multilayered film without the rod-shaped core 2202, so that the light emission quantity can be increased at low cost.

Figure 35B:
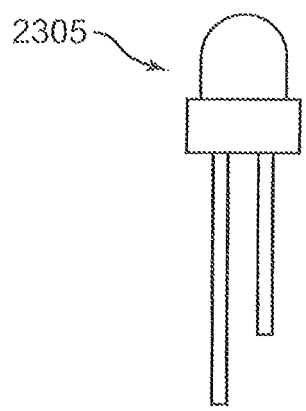
FIG. 35B is a representation showing a light-emitting element in which the light-emitting diode of the twelfth embodiment is mounted.
Figure 35C:
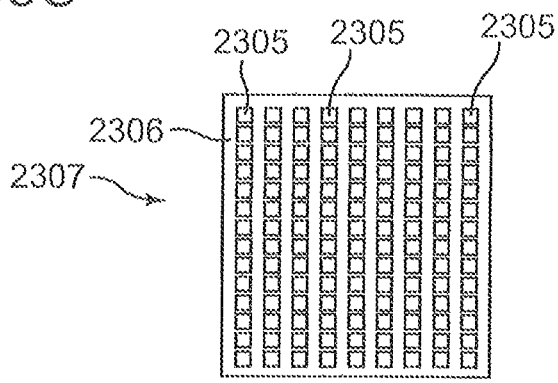
FIG. 35C is a plan view of an illumination device in which a plurality of light-emitting elements of FIG. 35B are mounted on a substrate.

Also, a light-emitting element 2305 shown in FIG. 35B on which the light-emitting diode 2300 is mounted can be mounted in a grid-like pattern with distances therebetween on a support substrate 2306 as shown in FIG. 35C to make up an illumination device 2307. This illumination device 2307 may also be assigned as a backlight or a display device.

Although a light-emitting diode fabricated by steps up to FIG. 34F of the eleventh embodiment is used as the light-emitting diode 2300 in this embodiment, yet a light-emitting diode fabricated by steps up to shown in FIG. 34F in the modifications of the eleventh embodiment may also be used. Further, although the substrate 2201, the cores 2202 and the first shell 2203 are set to the n-type and the second shell 2205 is set to the p-type in the above embodiment, yet it is also allowable that the substrate 2201, the cores 2202 and the first shell 2203 are set to the p-type and the second shell 2205 is set to the n-type.

Thirteenth Embodiment

Next, a light-emitting diode according to a thirteenth embodiment of the invention will be described with reference to the sectional view of FIG. 36A. The light-emitting diode 2400 of the thirteenth embodiment is given by using the light-emitting diode 2207 fabricated by steps up to shown in FIG. 34I in the eleventh embodiment of the light-emitting diode production method.

Figure 36A:
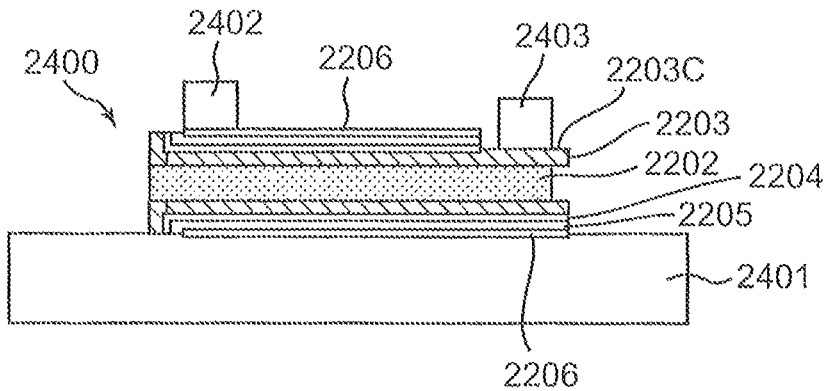
FIG. 36A is a sectional view of a light-emitting diode of a thirteenth embodiment of the invention.

As shown in FIG. 36A, in the light-emitting diode 2400 of the thirteenth embodiment, front end portions of the conductive film 2206, the p-type GaN second shell 2205 and the quantum well layer 2204 of the light-emitting diode 2207 fabricated in the foregoing eleventh embodiment are removed by etching, so that a front end portion 2203C of the n-type GaN first shell 2203 is exposed. A contact electrode 2403 is formed at the portion 2203C of the first shell 2203, and a contact electrode 2402 is formed on the conductive film 2206. Then, the light-emitting diode 2400 is placed in a sidelong laid-down state on a substrate 2401. The substrate 2401 may be a flexible substrate or a glass substrate as an example, but the substrate 2401 may also be an insulated substrate of other materials.

Figure 36B:
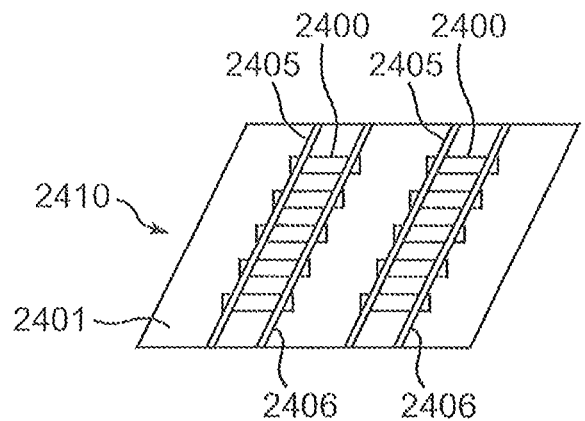
FIG. 36B is a schematic representation of a light-emitting element in which a plurality of light-emitting diodes of the thirteenth embodiment are arranged on a substrate.

As shown in FIG. 36B, a plurality of the light-emitting diodes 2400 may be arrayed on the substrate 2401 to make up a light-emitting element 2410. In this light-emitting element 2410, interconnections 2405, 2406 are connected to the contact electrodes 2402, 2403 of each light-emitting diode 2400 in each column.

Figure 36C:
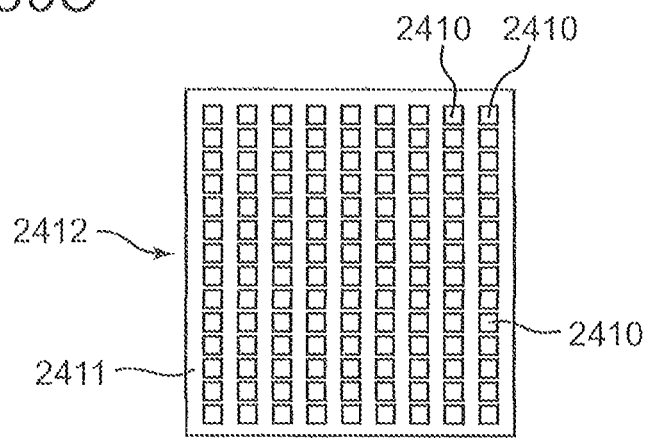
FIG. 36C is a plan view of an illumination device in which a plurality of light-emitting elements of FIG. 36B are mounted on a support substrate.

Further as shown in FIG. 36C, a plurality of the light-emitting elements 2410 may be mounted on a support substrate 2411 in a grid-like pattern with distances therebetween to make up an illumination device 2412. Instead of the illumination device 2412, a backlight or a display device may be provided.

In addition, although the light-emitting diode fabricated in the eleventh embodiment is used as the light-emitting diode 2400 in this embodiment, yet a light-emitting diode fabricated in the modifications of the eleventh embodiment may be used instead.

Fourteenth Embodiment

Figure 37A:
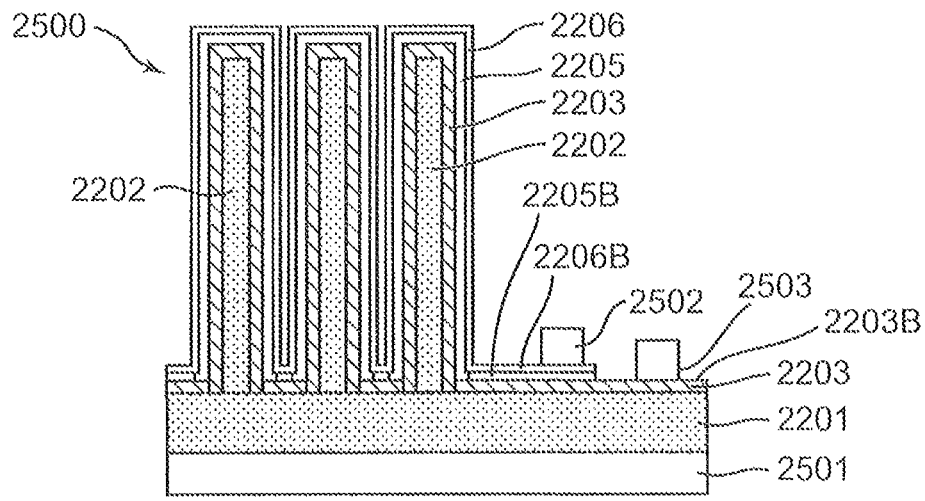
FIG. 37A is a sectional view of a photoelectric conversion element as a diode of a fourteenth embodiment of the invention.

Next, a photoelectric conversion element as a fourteenth embodiment of the diode of the invention will be described with reference to the sectional view of FIG. 37A. The photoelectric conversion element of this fourteenth embodiment may be a photodetector or a solar cell. The photoelectric conversion element of the fourteenth embodiment is given by using one fabricated by steps up to FIG. 34F in the foregoing eleventh embodiment of the light-emitting diode production method from which the step of formation of the quantum well layer 2204 shown in FIG. 34D is excluded.

Therefore, in the photoelectric conversion element 2500 of this embodiment, each of a plurality of n-type Si rod-shaped cores 2202 formed with distances therebetween on the n-type Si substrate 2201 is covered with the n-type GaN first shell 2203, the p-type GaN second shell 2205 and the ITO conductive film 2206 in succession. Also, the n-type Si substrate 2201 is placed on an insulated substrate 2501. Further, in the photoelectric conversion element 2500 of this embodiment, as shown in FIG. 37A, ends of portions 2206B, 2205B of the conductive film 2206 and the p-type GaN second shell 2205, which extend along the surface of the n-type Si substrate 2201, are removed by RIE or other etching, so that an end portion 2203B of the n-type GaN first shell 2203 is exposed. Then, a contact electrode 2503 is formed at the exposed end portion 2203B of the first shell 2203, and a contact electrode 2502 is formed at the end portion 2205B of the second shell 2205 or the end portion 2206B of the conductive film 2206.

In the photoelectric conversion element 2500 of this embodiment, each of the plurality of n-type Si rod-shaped cores 2202 formed in an erect state so as to be spaced apart from one another on the n-type Si substrate 2201 is covered with the n-type GaN first shell 2203 and the p-type GaN second shell 2205 in succession. Therefore, according to the photoelectric conversion element 2500, the pn-junction area per unit area of the substrate 2201 can be increased as compared with cases of flat multilayered film without the rod-shaped cores 2202, so that the cost per unit area of the pn-junction area can be reduced. Also, since light enter into gaps between the individual n-type Si rod-shaped cores 2202, a light confinement effect can be obtained, so that photoelectric conversion efficiency per unit area can be increased.

Although the diode fabricated in the eleventh embodiment is used in the photoelectric conversion element 2500 of this embodiment, yet diodes fabricated in the modifications of the eleventh embodiment may also be used instead.

Figure 37B:
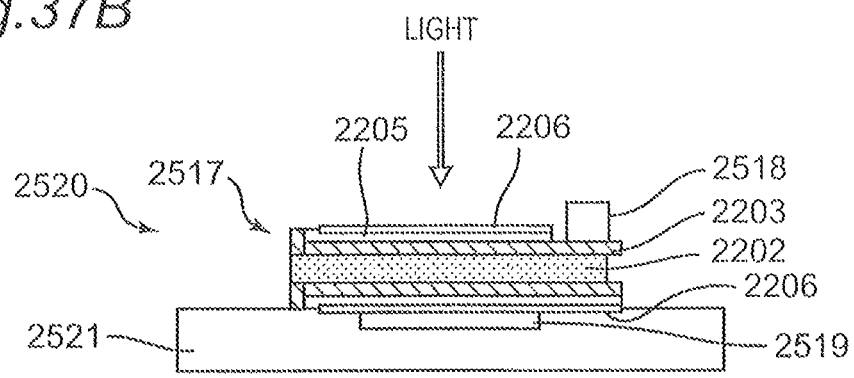
FIG. 37B is a sectional view of a modification of the fourteenth embodiment.

In a modification of the photoelectric conversion element 2500 of the fourteenth embodiment, a photoelectric conversion element 2520 shown in FIG. 37B is provided by using a diode fabricated by steps up to FIG. 34I in the foregoing eleventh embodiment from which the step of formation of the quantum well layer 2204 shown in FIG. 34D is excluded.

In a diode 2517 included in the photoelectric conversion element 2520 of this modification, circumferential portions in front end portions of the conductive film 2206 and the p-type GaN second shell 2205 are removed by etching so that a circumferential portion in a front end portion of the n-type GaN first shell 2203 is exposed. A contact electrode 2518 is formed at the exposed front end portion of the n-type GaN first shell 2203 while a contact electrode 2519 is formed on the conductive film 2206 on one side of the n-type Si rod-shaped cores 2202 opposite to the side on which the contact electrode 2518 is formed.

In the photoelectric conversion element 2520 of this modification, as shown in FIG. 37B, the diode 2517 has the contact electrode 2519 which is placed on a substrate 2521 in a sidelong laid-down state so as to be positioned on the side facing the substrate 2521. It is noted that a flexible substrate or a conductive substrate may be adopted as the substrate 2521.

Figure 37C:
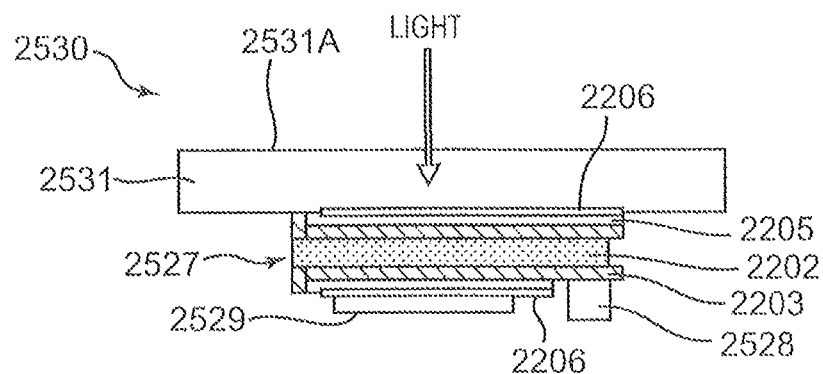
FIG. 37C is a sectional view of another modification of the fourteenth embodiment.
Figure 38:
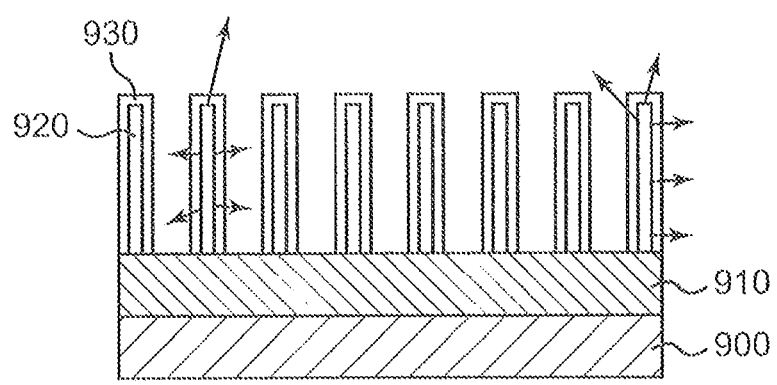
FIG. 38 is a representation showing a conventional light-emitting element.
Figure 39:
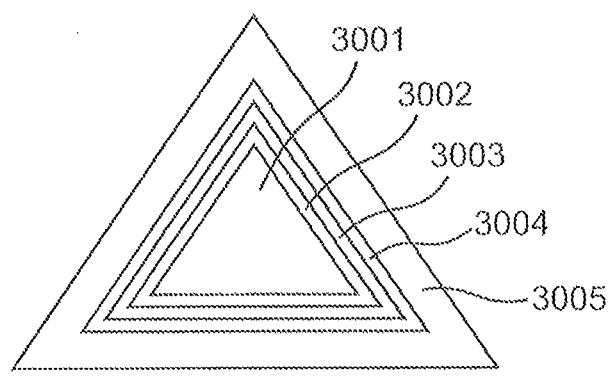
FIG. 39 is a representation showing a conventional light-emitting diode.

In another modification of the photoelectric conversion element 2500 of the fourteenth embodiment, a photoelectric conversion element 2530 shown in FIG. 37C is provided by using a diode fabricated by steps up to FIG. 34I in the foregoing eleventh embodiment from which the step of formation of the quantum well layer 2204 shown in FIG. 34D is excluded.

In a diode 2527 included in the photoelectric conversion element 2530 of this modification, circumferential portions in front end portions of the conductive film 2206 and the p-type GaN second shell 2205 are removed by etching so that a circumferential portion in a front end portion of the n-type GaN first shell 2203 is exposed. A contact electrode 2528 is formed at the exposed front end portion of the n-type GaN first shell 2203 while a contact electrode 2529 is formed on the conductive film 2206 on the same side as the side on which the contact electrode 2528 is formed.

In the photoelectric conversion element 2530 of this modification, as shown in FIG. 37C, the diode 2527 is so constituted that the ITO conductive film 2206 is adjacent to a back face 2531B of a substrate 2531 counter to its light incident surface 2531A, and that the contact electrodes 2528, 2529 are placed each in a sidelong laid-down state so as to be positioned on the side opposite to the side facing the substrate 2531. It is noted that a glass substrate or a light-pervious substrate may be adopted as the substrate 2531.

In the photoelectric conversion elements 2520, 2530 of the modifications of this embodiment, diodes fabricated in the eleventh embodiment are used. However, diodes fabricated in the modifications of the eleventh embodiment may also be used. Also, although the rod-shaped core as a core part is provided in a columnar shape in the foregoing individual embodiments, yet the rod-shaped core may be provided in a polygonal-prismatic shape or an elliptical-cylindrical shape as well as a conical shape, an elliptical-conical shape, a polygonal-pyramidal shape or the like. Also, although the first, second shells are provided in a cylindrical shape in the individual embodiments, yet the shells may also be in a polygonal-cylindrical shape, an elliptical-cylindrical shape, a conical shape, an elliptical-conical shape, a polygonal-pyramidal shape, or the like in correspondence to the shape of the core part.

The invention claimed is:

1. A light-emitting element comprising:
a first conductivity type semiconductor base having an area;
a plurality of first conductivity type protrusion-shaped semiconductors formed on the first conductivity type semiconductor base; and
a second conductivity type semiconductor layer that covers the protrusion-shaped semiconductors,
the light emitting element having a light emitting area larger than the area of the first conductivity type semiconductor base, the light emitting area being given by a total area of the second conductivity type semiconductor layer.

2. The light-emitting element as claimed in claim 1, wherein
the first conductivity type protrusion-shaped semiconductors comprise first conductivity type rod-shaped semiconductors.

3. The light-emitting element as claimed in claim 2, wherein
the first conductivity type rod-shaped semiconductors have a length ten times larger than a thickness thereof.

4. The light-emitting element as claimed in claim 1, wherein
the first conductivity type protrusion-shaped semiconductors comprise first conductivity type plate-shaped semiconductors.

5. The light-emitting element as claimed in claim 1, wherein
a transparent electrode layer is formed on the second conductivity type semiconductor layer in such a manner that the second conductivity type semiconductor layer is substantially entirely covered with the transparent electrode.

6. The light-emitting element as claimed in claim 5, wherein
a facing gap between first conductivity type protrusion-shaped semiconductors, across which parts of the transparent electrode layer face each other, is filled with a transparent member made from a material higher in transparency than the transparent electrode layer.

7. A diode comprising:
a core part extending in an axial direction;
a first conductivity type semiconductor layer formed so as to cover the core part, the first conductivity type semiconductor layer having at least a section extending along the axial direction around the core part; and
a second conductivity type semiconductor layer that covers at least a portion of the section extending along the axial direction of the first conductivity type semiconductor layer, wherein
material of the core part and material of the first conductivity type semiconductor layer are different from each other,
a part of the section extending along the axial direction of the first conductivity type semiconductor layer is exposed, and
the core part is larger in refractive index than the first conductivity type semiconductor layer and the diode is a light-emitting diode.

8. The diode as claimed in claim 7, wherein
the core part is larger in thermal conductivity than the first conductivity type semiconductor layer and the diode is a light-emitting diode.

9. The diode as claimed in claim 7, wherein
the core part is larger in electrical conductivity than the first conductivity type semiconductor layer and the diode is a light-emitting diode.

10. An illumination device which includes the light-emitting diode as claimed in claim 7.

11. A backlight which includes the light-emitting diode as claimed in claim 7.

12. A display device which includes the light-emitting diode as claimed in claim 7.

13. The diode as claimed in claim 7, wherein the core part is formed of $SiO_2$.

14. A light-emitting element comprising:
a first conductivity type semiconductor base;
a plurality of first conductivity type protrusion-shaped semiconductors formed on the first conductivity type semiconductor base, each protrusion-shaped semiconductor having a length and a thickness; and a second conductivity type semiconductor layer that covers the protrusion-shaped semiconductors, each first conductivity type protrusion-shaped semiconductor having a side wall perpendicular to the semiconductor base, the length of the first conductivity type protrusion-shaped semiconductors being larger than the thickness thereof, a transparent electrode layer being formed on the second conductivity type semiconductor layer in such a manner that the second conductivity type semiconductor layer is substantially entirely covered with the transparent electrode, and a facing gap between first conductivity type protrusion-shaped semiconductors, across which parts of the transparent electrode layer face each other, being filled with a transparent member made from a material higher in transparency than the transparent electrode layer.

* * * * *